US012062735B2

United States Patent
Ng et al.

(10) Patent No.: US 12,062,735 B2
(45) Date of Patent: Aug. 13, 2024

(54) SYSTEM CONFIGURATIONS FOR FABRICATION OF MICRO-LED DISPLAYS

(71) Applicant: Applied Materials, Inc., Santa Clara, CA (US)

(72) Inventors: Hou T. Ng, Campbell, CA (US); Daihua Zhang, Los Altos, CA (US); Nag B. Patibandla, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 244 days.

(21) Appl. No.: 17/691,091

(22) Filed: Mar. 9, 2022

(65) Prior Publication Data

US 2022/0293816 A1 Sep. 15, 2022

Related U.S. Application Data

(60) Provisional application No. 63/159,690, filed on Mar. 11, 2021.

(51) Int. Cl.
*H01L 33/00* (2010.01)
*B08B 3/08* (2006.01)
(Continued)

(52) U.S. Cl.
CPC ............ *H01L 33/0095* (2013.01); *B08B 3/08* (2013.01); *B41M 3/003* (2013.01); *B41M 3/006* (2013.01); *B41M 5/0047* (2013.01); *B41M 7/00* (2013.01); *H01L 21/67034* (2013.01); *H01L 21/67051* (2013.01); *H01L 21/6715* (2013.01);
(Continued)

(58) Field of Classification Search
CPC ..................................................... H01L 33/095
See application file for complete search history.

(56) References Cited

U.S. PATENT DOCUMENTS

2004/0216324 A1 11/2004 Nakamura et al.
2005/0257738 A1 11/2005 Tateishi et al.
(Continued)

FOREIGN PATENT DOCUMENTS

JP 3687666 8/2005
JP 2011-142255 7/2011
(Continued)

OTHER PUBLICATIONS

International Search Report and Written Opinion in International Appln No. PCT/US2022/019637, dated Jun. 28, 2022, 9 pages.
Office Action in Taiwanese Appln. No. 112117512, dated Apr. 16, 2024, 11 pages (with English summary and search report).

*Primary Examiner* — Jason Y Ko
(74) *Attorney, Agent, or Firm* — Fish & Richardson P.C.

(57) ABSTRACT

An LED display fabrication tool includes a plurality of process chambers and a plurality of transfer chambers. The plurality of process chambers include first and second dispensing chambers to deliver first and second color conversion precursors onto a workpiece for fabrication of a light emitting diode (LED) displays, and first and second washing/drying chambers to remove uncured portions of the first and second color conversion precursors from the workpiece and then dries the workpiece. The plurality of transfer chambers are coupled to two process chambers by two respective sealable ports. First and second curing stations cure the precursors to form the first and second color conversion layers over a first set of LEDs on the workpiece.

19 Claims, 20 Drawing Sheets

(51) Int. Cl.
  *B41M 3/00*     (2006.01)
  *B41M 5/00*     (2006.01)
  *B41M 7/00*     (2006.01)
  *H01L 21/66*    (2006.01)
  *H01L 21/67*    (2006.01)
  *H01L 21/677*   (2006.01)
  *H01L 25/075*   (2006.01)
  *H01L 25/16*    (2023.01)

(52) U.S. Cl.
  CPC .. *H01L 21/67236* (2013.01); *H01L 21/67288* (2013.01); *H01L 21/67715* (2013.01); *H01L 22/20* (2013.01); *H01L 25/0753* (2013.01); *H01L 21/67167* (2013.01); *H01L 21/67173* (2013.01); *H01L 25/167* (2013.01); *H01L 2933/0041* (2013.01)

(56) References Cited

U.S. PATENT DOCUMENTS

| | | |
|---|---|---|
| 2007/0238054 A1 | 10/2007 | Kok et al. |
| 2010/0087945 A1 | 4/2010 | Nakajima et al. |
| 2010/0261340 A1 | 10/2010 | Nijhawan et al. |
| 2011/0232569 A1 | 9/2011 | Olgado |
| 2014/0271083 A1 | 9/2014 | Caveney |
| 2015/0255505 A1 | 9/2015 | Jeoung et al. |
| 2020/0365774 A1 | 11/2020 | Zhang et al. |
| 2022/0293435 A1 | 9/2022 | Ng et al. |
| 2022/0293441 A1 | 9/2022 | Ng et al. |

FOREIGN PATENT DOCUMENTS

| | | |
|---|---|---|
| KR | 10-2019-0014430 | 2/2019 |
| TW | 202014047 | 4/2020 |
| WO | WO 2015/112454 | 7/2015 |

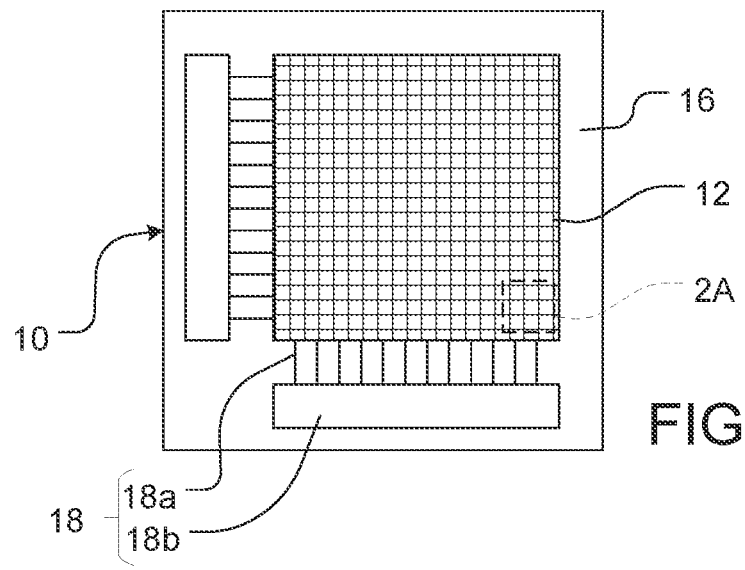
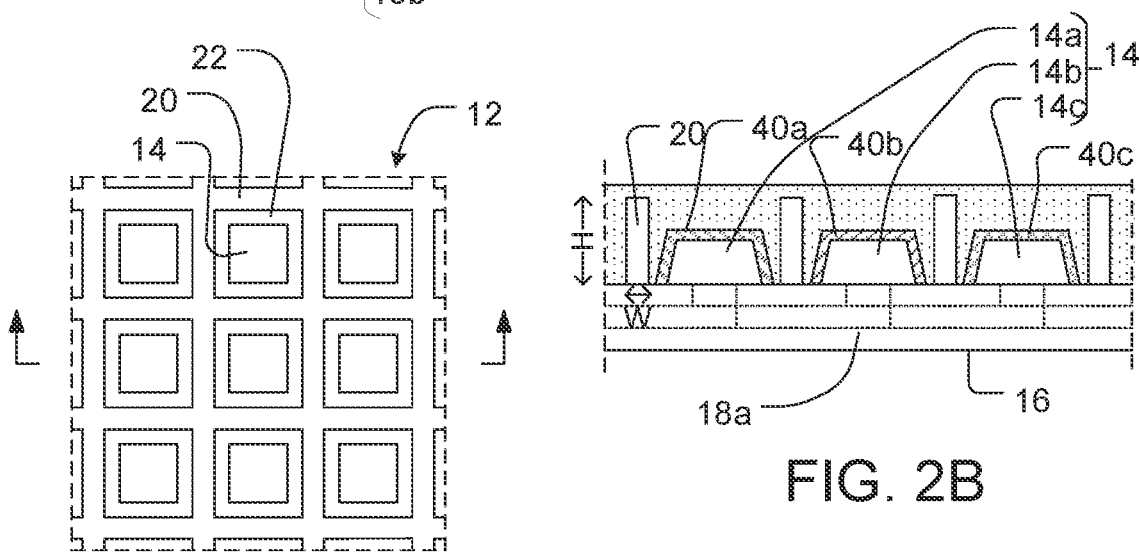
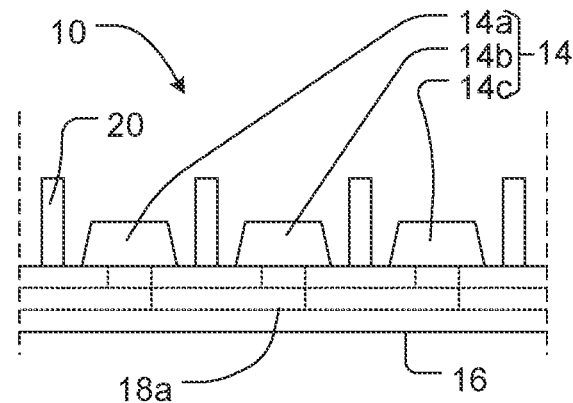
FIG. 1
FIG. 2A
FIG. 2B
FIG. 2C

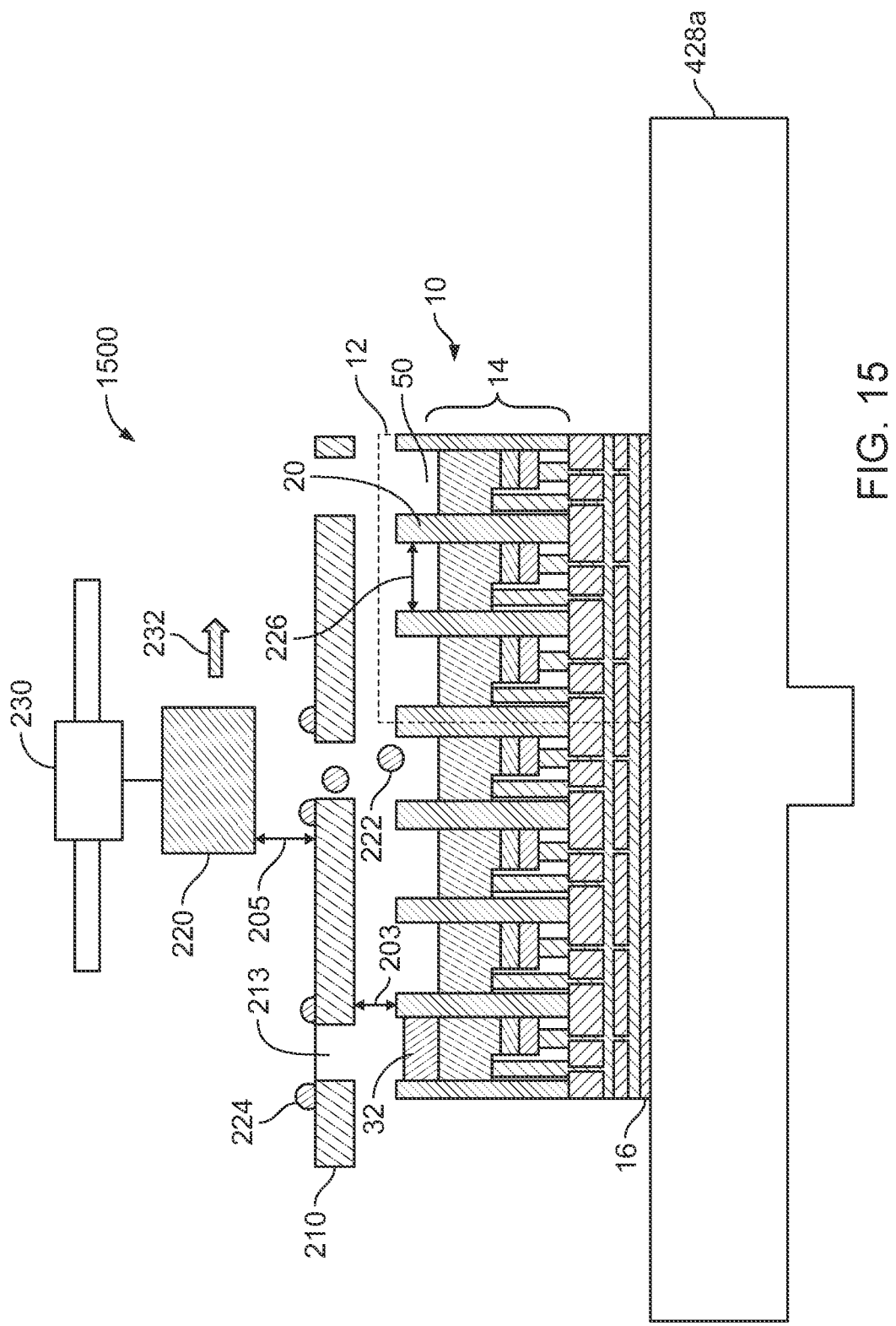

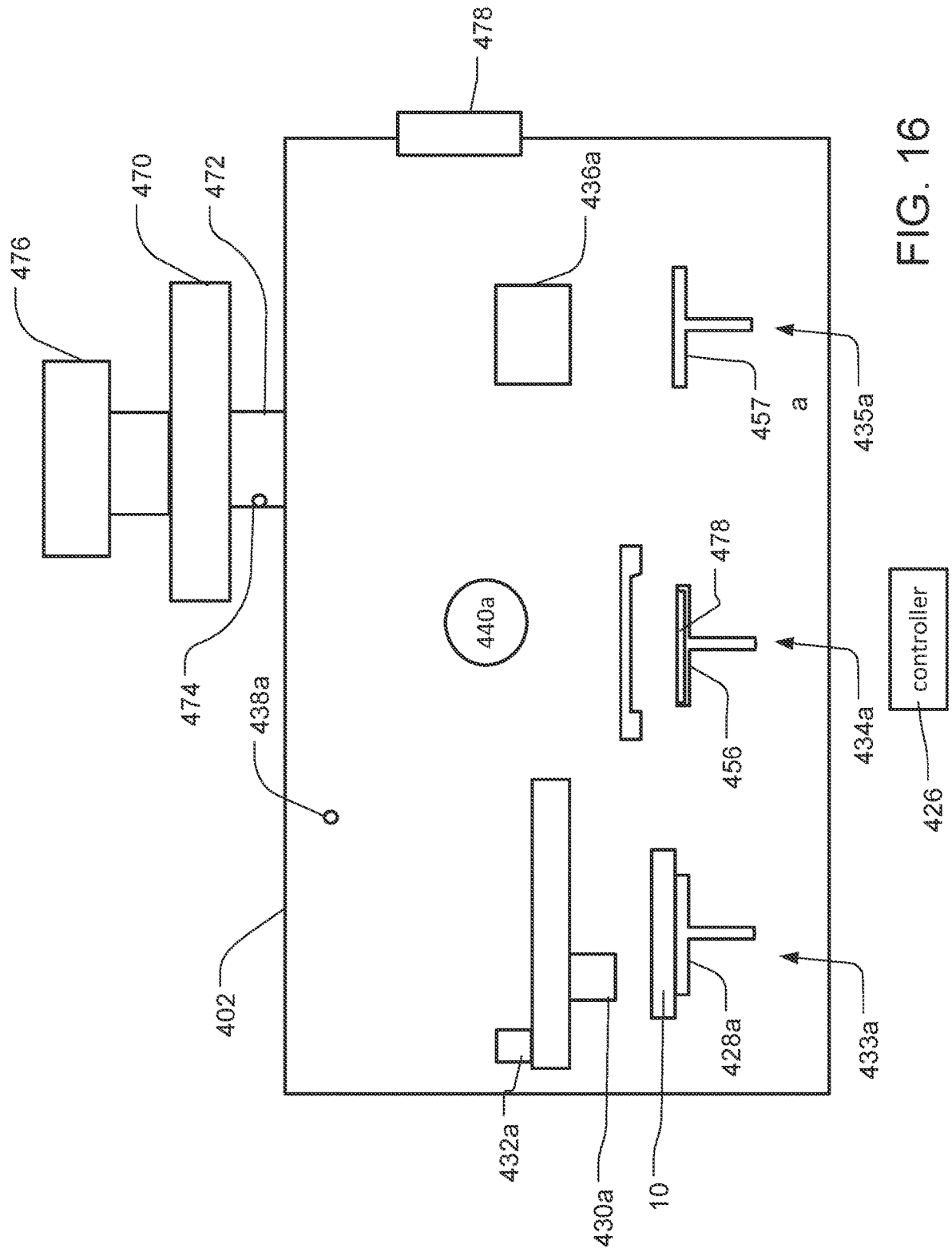

SYSTEM CONFIGURATIONS FOR FABRICATION OF MICRO-LED DISPLAYS

CROSS-REFERENCE TO RELATED APPLICATIONS

This application claims the benefit of priority to U.S. Application No. 63/159,690, filed on Mar. 11, 2021, the contents of which are hereby incorporated by reference.

TECHNICAL FIELD

This disclosure generally relates to fabrication of micro-LED displays.

BACKGROUND

A light emitting diode (LED) panel uses an array of LEDs, with individual LEDs providing the individually controllable pixel elements. Such an LED panel can be used for a computer, touch panel device, personal digital assistant (PDA), cell phone, television monitor, and the like.

An LED panel that uses micron-scale LEDs based on III-V semiconductor technology (also called micro-LEDs) would have a variety of advantages as compared to OLEDs, e.g., higher energy efficiency, brightness, and lifetime, as well as fewer material layers in the display stack, which can simplify manufacturing. However, there are challenges to fabrication of micro-LED panels. Micro-LEDs having different color emission (e.g., red, green and blue pixels) need to be fabricated on different substrates through separate processes. Integration of the multiple colors of micro-LED devices onto a single panel requires a pick-and-place step to transfer the micro-LED devices from their original donor substrates to a destination substrate. This often involves modification of the LED structure or fabrication process, such as introducing sacrificial layers to ease die release. In addition, stringent requirements on placement accuracy (e.g., less than 1 um) limit either the throughput, the final yield, or both.

An alternative approach to bypass the pick-and-place step is to selectively deposit color conversion agents (e.g., quantum dots, nanostructures, florescent materials, or organic substances) at specific pixel locations on a substrate fabricated with monochrome LEDs. The monochrome LEDs can generate relatively short wavelength light, e.g., purple or blue light, and the color conversion agents can convert this short wavelength light into longer wavelength light, e.g., red or green light for red or green pixels. The selective deposition of the color conversion agents can be performed using high-resolution shadow masks or controllable inkjet or aerosol jet printing.

SUMMARY

In one aspect, a LED display fabrication tool includes a first dispensing chamber, a first curing station, a first washing/drying chamber, a second dispensing chamber, a second curing station, a second washing/drying chamber, a workpiece transport system, and a controller. Each of the first dispensing chamber, first washing/drying chamber, second dispensing chamber and second washing/drying chamber is independently sealable. The first dispensing chamber includes a first dispensing support to hold a workpiece and a first inkjet printer to deliver a first color conversion precursor onto the workpiece. The first curing station cures the color conversion precursor materials on the workpiece to form a first color conversion layer over a first set of LEDs on the workpiece. The first washing/drying chamber includes a first washing support to hold the workpiece and a first washing assembly to remove uncured portions of the first color conversion precursor from the workpiece.

The second dispensing chamber includes a second dispensing support to hold the workpiece and a second inkjet printer to deliver a second color conversion precursor different from the first color conversion precursor onto the workpiece. The second curing station cures the second color conversion precursor to form a second color conversion layer over a second set of LEDs on the workpiece. The second washing/drying chamber includes a second washing support to hold the workpiece and a second washing assembly to remove uncured portions of the second color conversion layer from the workpiece.

The controller causes the workpiece transport system to move the workpiece sequentially through the first dispensing chamber, first washing/drying chamber, second dispensing chamber and second washing/drying chamber.

In another aspect, an LED display fabrication tool of includes a plurality of process chambers and one or more transfers chamber. The plurality of process chambers includes a first dispensing chamber, a second dispensing chamber, one or more washing/drying chambers, and a common curing station to cure the first color conversion precursor to form the first color conversion layer and to cure the second color conversion precursor to form the second color conversion layer.

In another aspect, an LED display fabrication tool of includes a plurality of process chambers and one or more transfers chamber. The plurality of process chambers includes a common dispensing chamber, one or more washing/drying chambers, a first curing station to cure the first color conversion precursor to form the first color conversion layer, and a second curing station to cure the second color conversion precursor to form the second color conversion layer.

In another aspect, a LED display fabrication method is described. The method includes loading a workpiece in a first dispensing chamber, dispensing a first color conversion layer onto the workpiece, moving the workpiece to a first washing/drying chamber, washing the workpiece with the first color conversion layer to remove an uncured portion of the first color conversion layer, moving the workpiece to a second dispensing chamber, dispensing a second color conversion layer onto the workpiece, moving the workpiece to a second washing/drying chamber, washing the workpiece with the second color conversion layer to remove an uncured portion of the second color conversion layer, moving the workpiece to a third dispensing chamber, dispensing a third color conversion layer onto the workpiece, moving the workpiece to a third washing/drying chamber, and washing the workpiece with the third color conversion layer to remove an uncured portion of the third color conversion layer.

Implementations may include one or more of the following features.

The third inkjet printer may have a third fiducial mark to align the workpiece to the third inkjet printer. The first dispensing chamber and the second dispensing chamber may be configured to reduce a contamination concentration within the first dispensing chamber and the second dispensing chamber. Each of the first and second dispensing chambers may include a sensor, e.g., an optical imager or a luminescent imager, configured to sense a first workpiece condition. Each of the first and second dispensing chambers may include an environmental sensor to sense a first dispensing chamber condition, e.g., temperature, relative humidity, or gas composition.

The rework dispensing chamber may be used to rework the third color conversion layer. Filtering air entering the first dispensing chamber, the second dispensing chamber, and the third dispensing chamber with a high efficiency particulate air filter to reduce a contamination concentration of an atmosphere. The atmosphere in the first dispensing chamber may be exhausted with a first exhaust duct, the atmosphere in the second dispensing chamber may be exhausted with a second exhaust duct, and the atmosphere in the third dispensing chamber may be exhausted with a third exhaust duct. A first contamination concentration of the atmosphere in first dispensing chamber may be measured with a first chamber sensor, a second contamination concentration of the atmosphere in the second dispensing chamber may be measured with a second chamber sensor, and a third contamination concentration of the atmosphere in the third dispensing chamber may be measured with a third chamber sensor. Signals representing the first, second and third contamination concentrations may be transmitted to a controller. In response to receiving the signals, an air flow into and out of the first dispensing chamber, the second dispensing chamber, and the third dispensing chamber may be adjusted.

Implementations can optionally provide (and are not limited to) one or more of the following advantages.

A seamless work flow addressing all critical steps of micro-LED display manufacturing processes can be achieved. In this context, "seamless" indicates that multiple color conversion layers corresponding to multiple colors for the display can be fabricated on a display workpiece using multiple processing steps, e.g., coating, in-situ curing, and rinsing, all without removing the workpiece from the controlled environment, e.g., vacuum, of the tool.

The processing steps (coating, in-situ curing, and rinsing) can be aligned in throughput to reduce work flow inefficiencies. Effective scheduling of processing jobs based on readiness of each processing stage can be accomplished.

The platform can be configurable and re-configurable, which can permit adaptation to different panel fabrications processes.

Manufacturing output can be increased by a seamless work flow to support large format and high-throughput operation. Thus, color conversion agents can be selectively formed over an array of micro-LEDs with higher yield and throughput. This may permit multi-color micro-LED displays to be fabricated in a commercially viable manner. The integrated manufacturing line and/or cluster manufacturing platform can increase effectiveness for scheduling of processing jobs based on readiness of each processing stage and increase targeted throughput of manufacturing work product.

Work product quality can be increased. For example, in-situ curing can automatically ensure alignment accuracy. The placement accuracy and repeatability of a range of light emitting, light conversion, and functional materials can be improved.

Work product defect detection can be improved. For example, in-situ measurement of micro-LED substrate and process environment can improve process controls to manufacture a higher quality substrate. Additionally, defects can be detected earlier in the manufacturing process.

Other aspects, features, and advantages will be apparent from the description and drawings, and from the claims.

A variety of implementations are described below. It is contemplated that elements and features of one implementation may be beneficially incorporated in other implementations without further recitation.

BRIEF DESCRIPTION OF THE DRAWINGS

FIG. 1 is a schematic top view of a micro-LED array that has already been integrated with a backplane.

FIG. 2A is a schematic top view of a portion of a micro-LED array.

FIG. 2B is a schematic cross-sectional view of the portion of the micro-LED array from FIG. 2A.

FIG. 2C is a schematic cross-sectional view of a portion of the micro-LED display of FIG. 2A prior to depositing of the color conversion agent layers.

FIG. 15 is a schematic cross-sectional side view of inkjet printing station in a LED display fabrication tool.

FIG. 16 is a schematic cross-sectional side view of a dispensing chamber of a LED display fabrication tool.

Like reference symbols in the various drawings indicate like elements.

DETAILED DESCRIPTION

Figure 3A:
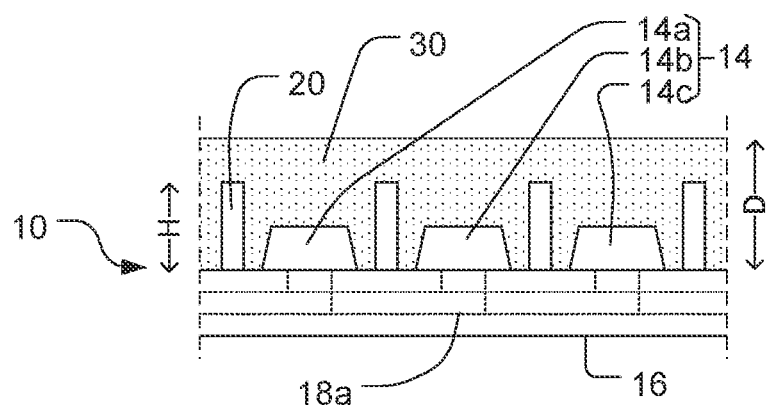
FIGS. 3A-3H illustrate a method of selectively forming color conversion agent (CCA) layers over a micro-LED array.

As noted above, selective deposition of color conversion agents can be performed using high-resolution shadow masks, controllable inkjet or aerosol jet printing. Such color conversion agents may need to be cured, and uncured material may need to be washed away. At present, such steps are performed in discrete stand-alone tools, and no seamless workflow for manufacturing micro-LED displays exists. As such, there can be unbalanced throughput at various tools, as well as the danger of contamination each time a panel is removed from a tool. Overall, there is a need for new techniques to precisely and cost-effectively coordinate manufacturing processes during manufacture of micro-LEDs.

A technique that can address these problems is provide a tool in which multiple chambers are connected to perform various processes for seamless manufacturing of micro-LED displays. The micro-LED display fabrication tool can have multiple independently sealable chambers, e.g., dispensing chambers, washing/drying chambers, and curing chambers, arranged in a cluster or line, and a micro-LED display transport system to move the micro-LED displays sequentially through the chambers. This technique can overcome the challenges in manufacturing throughput and manufacturing scalability.

Micro-Led Array

FIG. 1 illustrates a micro-LED display 10 that includes an array 12 of individual micro-LEDs 14 (see FIGS. 2A and 2B) disposed on a backplane 16. The micro-LEDs 14 are already integrated with backplane circuitry 18 so that each micro-LED 14 can be individually addressed. For example, the backplane circuitry 18 can include a thin-film transistor (TFT) active matrix array with a thin-film transistor and a storage capacitor (not illustrated) for each micro-LED, column address and row address lines 18a, column and row drivers 18b, etc., to drive the micro-LEDs 14. Use of a TFT active matrix array can avoid electrically stressing the TFT circuitry since a higher current/voltage (UV dosage) might be needed to cure the color conversion layer materials. Alternatively, the micro-LEDs 14 can be driven by a passive matrix in the backplane circuitry 18. The backplane 16 can be fabricated using conventional complementary metal oxide semiconductor manufacturing processes.

FIGS. 2A and 2B illustrate a portion of the micro-LED array 12 with the individual micro-LEDs 14. All of the micro-LEDs 14 are fabricated with the same structure so as to generate the same wavelength range (this can be termed "monochrome" micro-LEDs). For example, the micro-LEDs 14 can generate light in the ultraviolet (UV), e.g., the near ultraviolet, range. For example, the micro-LEDs 14 can generate light in a range of 365 to 405 nm. As another example, the micro-LEDs 14 can generate light in the violet or blue range. The micro-LEDs can generate light having a spectral bandwidth of 20 to 60 nm.

FIG. 2B illustrates a portion of the micro-LED array that can provide a single pixel. Assuming the micro-LED display is a three-color display, each pixel includes three sub-pixels, one for each color, e.g., one each for the blue, green and red color channels. As such, the pixel can include three micro-LEDs 14a, 14b, and 14c. For example, the first micro-LED 14a can correspond to a blue subpixel, the second micro-LED 14b can correspond to a green subpixel, and the third micro-LED 14c can correspond to a red subpixel. However, the techniques discussed below are applicable to micro-LED displays that use a larger number of colors, e.g., four or more colors. In this case, each pixel can include four or more micro-LEDs, with each micro-LED corresponding to a respective color. In addition, the techniques discussed below are applicable to micro-LED displays that use a single color or two or three colors.

In general, the monochrome micro-LEDs 14 can generate light in a wavelength range having a peak with a wavelength no greater than the wavelength of the highest-frequency color intended for the display, e.g., purple or blue light. The color conversion layers 40a, 40b, 40c can convert this short wavelength light into longer wavelength light, e.g., red or green light for red or green subpixels. If the micro-LEDs generate UV light, then color conversion agents can be used to convert the UV light into blue light for the blue subpixels. If the micro-LEDs generate blue light, then no color conversion agent is needed over the micro-LED for the blue pixel.

Vertical isolation walls 20 are formed between neighboring micro-LEDs. The isolation walls provide for optical isolation to help localize polymerization and reduce optical crosstalk during the in-situ polymerization discussed below. In addition, it can help prevent color bleeding or contamination during the lit-up operation. The isolation walls 20 can be a photoresist or metal, and can be deposited by conventional lithography processes. As shown in FIG. 2A, the walls 20 can form a rectangular array, with each micro-LED 14 in an individual recess 22 defined by the walls 20. Other array geometries, e.g., hexagonal or offset rectangular arrays, are also possible. Possible processes for back-plane integration and isolation wall formation are discussed in more detail below. The height H of the wall is sufficient to block light from one micro-LED from reaching an adjacent micro-LED.

Fabrication Process

FIGS. 3A-3H illustrate a method of selectively forming color conversion agent (CCA) layers over a micro-LED array of a display 10 in the fabrication process. Initially, as shown in FIG. 3A, a first photo-curable fluid 30 is deposited over the array of micro-LEDs 14 that are already integrated with the backplane circuitry (see FIG. 2C). The first photo-curable fluid 30 can have a depth D greater than a height H of the isolation walls 20. Alternatively, the first photo-curable fluid 30 can have a depth D equal to or less than a height H of the isolation walls. A depth D less than the height H of the isolation walls can be advantageous because certain polymer matrixes can induce a waveguide effect which can decrease the effectiveness of selective curing the array of micro-LEDs 14.

Returning to FIG. 3A, the first photo-curable fluid 30 can be deposited on the display over the micro-LED array by a spin-on, dipping, spray-on, inkjet, or screen printing process. An inkjet process can be more efficient in consumption of the first photo-curable fluid 30. Although illustrated as covering the entire pixel, the first photo-curable fluid 30 can be placed only or primarily in the sub-pixel corresponding to the first color.

Figure 3B:
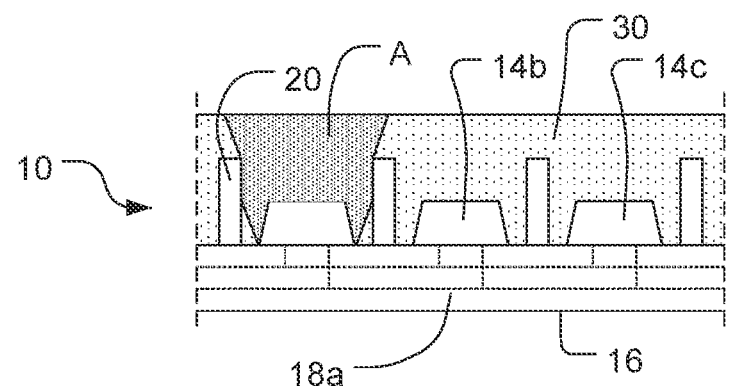

Next, as shown in FIG. 3B, the circuitry of the backplane 16 is used to selectively activate a first set of micro-LEDs 14a. This first set of micro-LEDs 14a corresponds to the sub-pixels of a first color. In particular, the first set of micro-LEDs 14a corresponds to the sub-pixels for the color of light to be generated by the color conversion components in the first photo-curable fluid 30. For example, assuming the color conversion component in the first photo-curable fluid 30 will convert light from the micro-LED 14 into blue light, then only those micro-LEDs 14a that correspond to blue sub-pixels are turned on. Because the micro-LED array is already integrated with the backplane circuitry 18, power can be supplied to the micro-LED display 10 and control signals can be applied by a microprocessor to selectively turn on the micro-LEDs 14a. This situation describes a selective light-up of micro-LEDs 14a via the TFT circuitry previously discussed. Alternatively, selective lite-up of micro-LEDs 14a can be conducted by a separate circuit which can include shorting bars. This can enable a higher current/voltage (UV dosage) to be applied to cure the color conversion materials, while avoiding electrically stressing the TFT circuitry.

Figure 3C:
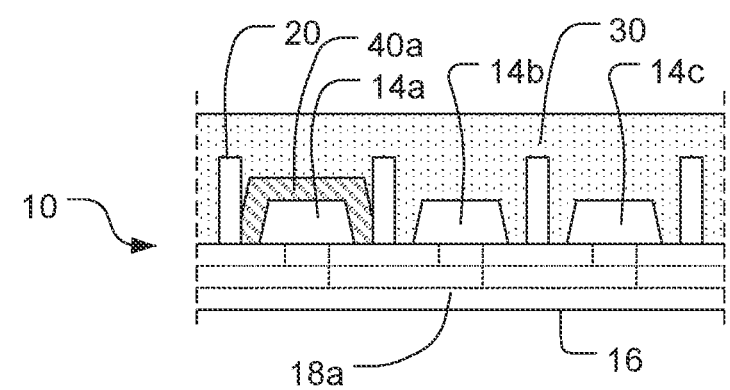

Referring to FIGS. 3B and 3C, activation of the first set of micro-LEDs 14a generates illumination A (see FIG. 3B) which causes in-situ curing of the first photo-curable fluid 30 to form a first solidified color conversion layer 40a (see FIG. 3C) over each activated micro-LED 14a. In short, the first photo-curable fluid 30 is cured to form color conversion layers 40a, but only on the selected micro-LEDs 14a.

FIG. 3C illustrates curing a portion of the first photo-curable fluid 30 that does not extend through the entire thickness of the fluid on the device. This may be possible in instances where curing dosages are precisely controlled or where curing reduces transmission of the ultraviolet light which results in a self-limiting process. However, in some implementations, the entire thickness of the first photo-curable fluid 30 above the micro-LED 14a can be cured.

In some cases, the first photo-curable fluid 30 can have a depth D greater than a height H of the isolation walls 20. Alternatively, the first photo-curable fluid 30 can have a depth D equal to or less than a height H of the isolation walls which can result in fully curing of the entire color conversion layer materials above micro-LED 14a. For example, a color conversion layer 40a for converting to blue light can be formed on each micro-LED 14a.

In some implementations, the curing is a self-limiting process. For example, illumination, e.g., UV illumination, from the micro-LEDs 14a can have a limited penetration depth into the photo-curable fluid 30. As such, although FIG. 3B illustrates the illumination A reaching the surface of the first photo-curable fluid 30, this is not necessary. In some implementations, the illumination from the selected micro-LEDs 14a does not reach the other micro-LEDs 14b and 14c. In this circumstance, the isolation walls 20 may not be necessary.

However, if the spacing between the micro-LEDs 14 is sufficiently small, isolation walls 20 can affirmatively block illumination A from the selected micro-LED 14a from reaching the area over the other micro-LEDs that would be within the penetration depth of the illumination from those other micro-LEDs. Isolation walls 20 can also be included, e.g., simply as insurance against illumination reaching the area over the other micro-LEDs.

The driving current and drive time for the first set of micro-LEDs 14a can be selected for appropriate photon dosage for the first photo-curable fluid 30. The power per subpixel for curing the first photo-curable fluid 30 is not necessarily the same as the power per subpixel in a display mode of the micro-LED display 10. For example, the power per subpixel for the curing mode can be higher than the power per subpixel for the display mode.

Figure 3D:
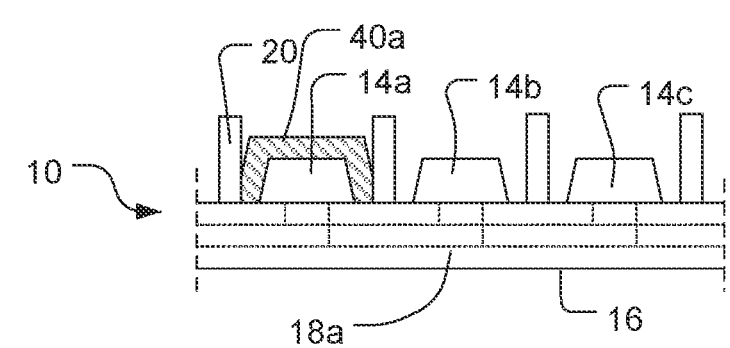

Referring to FIG. 3D, when curing is complete and the first solidified color conversion layer 40a is formed, the residual uncured first photo-curable fluid 30 is removed from the display 10. This leaves the other micro-LEDs 14b and 14c exposed for the next deposition steps. In some implementations, the uncured first photo-curable fluid 30 is simply rinsed from the display with a solvent, e.g., water, ethanol, toluene, methylethylketone, isopropanol, or a combination thereof. If the first photo-curable fluid 30 includes a negative photoresist, then the rinsing fluid can include a photoresist developer for the photoresist.

Figure 3E:
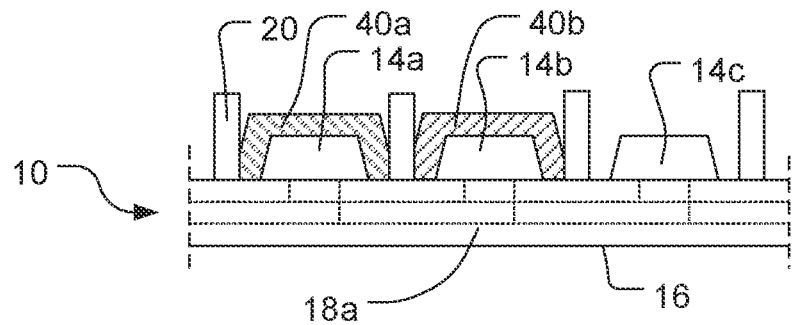

Referring to FIG. 3E, the treatment described above with respect to FIGS. 3A-3D is repeated, but with a second photo-curable fluid, not shown, similar to the first photo-curable fluid previously described and activation of a second set of micro-LEDs 14b. After rinsing, a second color conversion layer 40b is formed over each of the second set of micro-LEDs 14b.

The second photo-curable fluid is similar to the first photo-curable fluid 30, but includes color conversion agents to convert the shorter wavelength light from the micro-LEDs 14 into longer wavelength light of a different second color. The second color can be, for example, green.

The second set of micro-LEDs 14b corresponds to the sub-pixels of a second color. In particular, the second set of micro-LEDs 14b corresponds to the sub-pixels for the color of light to be generated by the color conversion components in the second photo-curable fluid. For example, assuming the color conversion component in the first photo-curable fluid 30 will convert light from the micro-LED 14 into green light, then only those micro-LEDs 14b that correspond to green sub-pixels are turned on.

Figure 3F:
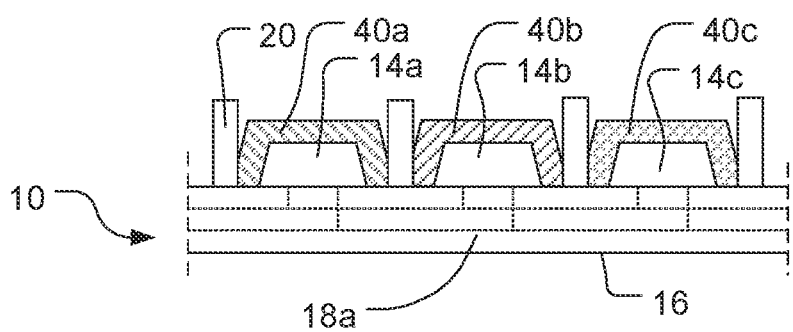

Referring to FIG. 3F, optionally, the treatment described above with respect to FIGS. 3A-3D is repeated yet again, but with a third photo-curable fluid, not shown, similar to the first photo-curable fluid and the second photo-curable fluid and activation of a third set of micro-LEDs 14c. After rinsing, a third color conversion layer 40c is formed over each of the third set of micro-LEDs 14c.

The third photo-curable fluid is similar to the first photo-curable fluid 30, but includes color conversion agents to convert the shorter wavelength light from the micro-LEDs 14 into longer wavelength light of a different third color. The third color can be, for example, red.

The third set of micro-LEDs 14b correspond to the sub-pixels of a third color. In particular, the third set of micro-LEDs 14b corresponds to the sub-pixels for the color of light to be generated by the color conversion components in the third photo-curable fluid. For example, assuming the color conversion component in the third photo-curable fluid will convert light from the micro-LED 14 into red light, then only those micro-LEDs 14b that correspond to red sub-pixels are turned on.

In this specific example illustrated in FIGS. 3A-3F, color conversion layers 40a, 40b, 40c are deposited for each color sub-pixel. This is needed, e.g., when the micro-LEDs generate ultraviolet light.

However, the micro-LEDs 14 could generate blue light instead of UV light. In this case, the coating of the display 10 by a photo-curable fluid containing blue color conversion agents can be skipped, and the process can be performed using the photo-curable fluids for the green and red subpixels. One set of micro-LEDs is left without a color conversion layer, e.g., as shown in FIG. 3E. The process shown by FIG. 3F is not performed. For example, the first photo-curable fluid 30 could include green CCAs and the first set 14a of micro-LEDs could correspond to the green subpixels, and the second photo-curable fluid could include red CCAs and the second set 14b of micro-LEDs could correspond to the red subpixels. In some implementations, micro-LED14a and micro-LED 14b are ultra-violet micro-LEDs, and micro-LED 14c is a blue micro-LED.

In yet another implementation, even if the third set 14c of micro-LEDs do not use color conversion, e.g., the micro-LED 14c is a blue micro-LED, a structure can be formed over the micro-LEDs 14c that is similar to the structures over the first set 14a and second set 14a of micro-LEDs. In particular, a third photo-curable fluid can be dispensed, and only those micro-LEDs 14b that correspond to the third color, e.g., red sub-pixels, are turned on to cure the third photo-curable fluid. However, the third photo-curable fluid does not include color conversion agents, so that the resulting layer acts as a "dummy" layer rather than a color conversion layer.

Figure 3G:
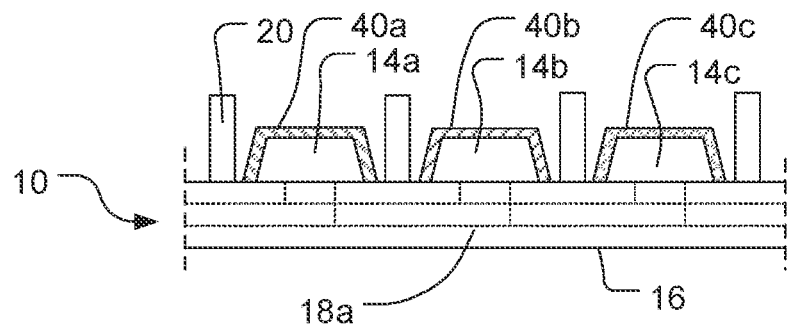

Assuming that the photo-curable fluids 30, e.g., the first photo-curable fluid, the second photo-curable fluid, and the third photo-curable, include a solvent, some solvent may be trapped in the color conversion layers 40a, 40b, 40c. Referring to FIG. 3G, this solvent can be evaporated, e.g., by exposing the micro-LED array to heat, such as by IR lamps.

Evaporation of the solvent from the color conversion layers 40*a*, 40*b*, and 40*c* can result in shrinking of the layers so that the final layers are thinner.

Removal of the solvent and shrinking of the color conversion layers 40*a*, 40*b*, and 40*c* can decrease the spacing between the quantum dots, so that the resulting color conversion layers 40*a* can behave differently in terms of absorptivity and reflectivity. On the other hand, including a solvent permits more flexibility in the chemical formulation of the other components of the photo-curable fluids, e.g., in the color conversion agents or cross-linkable components. In addition, including a solvent can provide a technique to repeat the deposition process such that multiple layers can be formed on micro-LEDs 14*a*, micro-LEDs 14*b*, and micro-LEDs 14*c* while increasing the overall quantum dot loading. As a result, absorptivity can increase, and optical density and photoluminescence can increase.

Figure 3H:
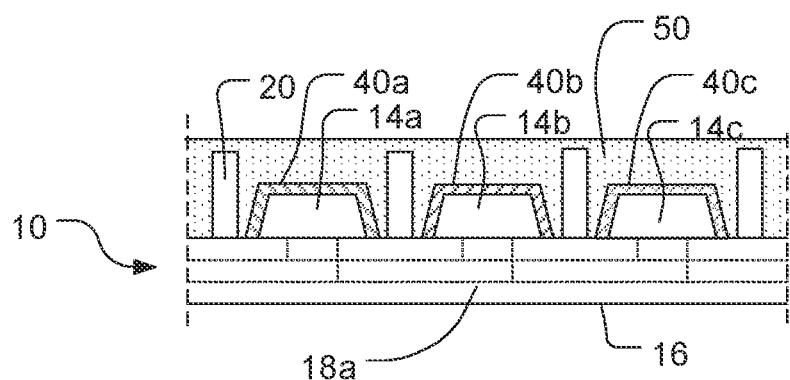

Optionally, as shown in FIG. 3H, a UV blocking layer 50 can be deposited on top of all of the micro-LEDs 14. The UV blocking layer 50 can block UV light that is not absorbed by the color conversion layers 40*a*, 40*b*, and 40*c*. The UV blocking layer 50 can be a Bragg reflector, or can simply be a material that is selectively absorptive to UV light. A Bragg reflector can reflect UV light back toward the micro-LEDs 14, thus increasing energy efficiency but allowing visible wavelengths to pass through.

Fabrication Tools

The methods described earlier and shown in FIGS. 3A-3H to manufacture micro-LED displays can be performed sequentially in a seamless workflow manufacturing process. The manufacturing processes are performed sequentially and seamlessly in a tool, various arrangements of which are shown in FIGS. 4-13.

Figure 4:
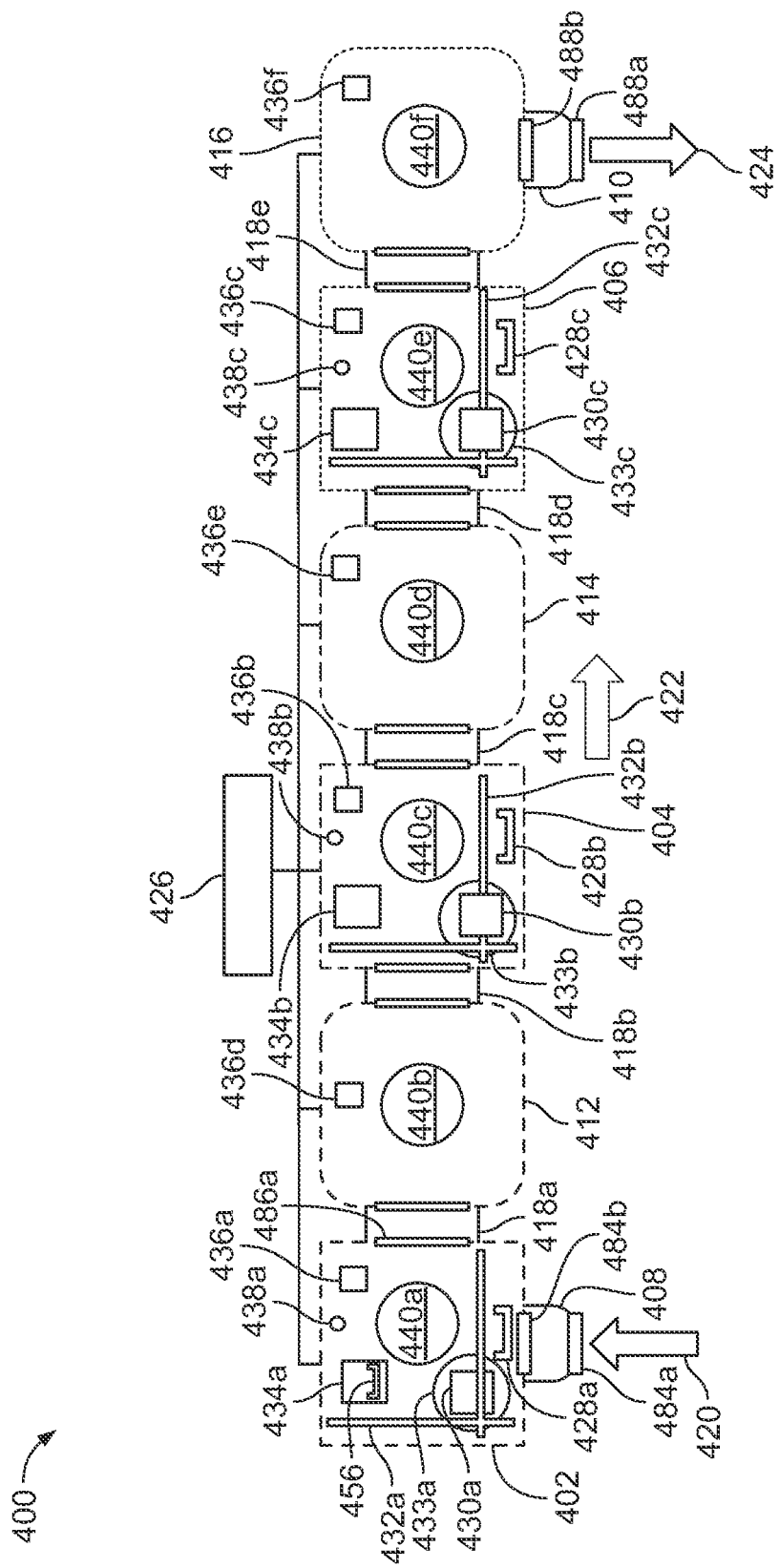
FIG. 4 is a schematic top view of a LED display fabrication tool.

Referring to FIG. 4, the LED display fabrication tool 400 sequentially processes micro-LED displays 10 to deposit the color conversion layers. The LED display fabrication tool 400 passes the micro-LED displays 10 through process chambers sequentially in a serial manner. The LED display fabrication tool 400 can include a controller 426 to control operation of the various components, and/or modules, e.g., processing chambers and workpiece transport system.

The LED display fabrication tool 400 includes a first dispensing chamber 402. For example, as shown in FIGS. 2C, the workpiece can be the partially fabricated display 10 with the backplane 16 on which the micro-LEDs 14 and isolation walls 20 are disposed. The first dispensing chamber 402 is independently sealable from the other chambers described later.

Figure 17A:
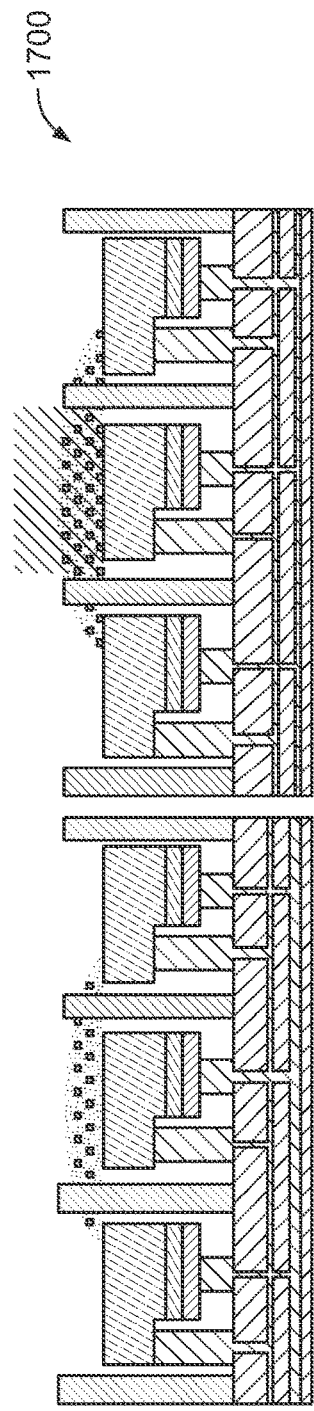
FIGS. 17A-F is a schematic view of fabricating a micro-LED array in a fabrication tool of FIG. 4.

Referring to FIGS. 4 and 15, the first dispensing chamber 402 includes a first dispensing station 433*a* to dispense the first photo-curable fluid 30 on the display 10. The first dispensing station 433*a* can include a first dispenser 430*a* to deliver a first color conversion precursor, which is the first photo-curable fluid 30 with the color conversion components described earlier, especially as shown in FIG. 3A, onto the display 10. The first dispensing station 433*a* also includes a first dispensing support 428*a* to hold the display 10 during delivery of the first color conversion precursor. FIG. 17A visually depicts the processes shown in FIGS. 3A-3C occurring in the first dispensing chamber 402 to deliver and cure the first color conversion precursor on the display 10.

In some implementations, the first dispenser 430*a* is a first inkjet printer that will eject droplets 222 of the photo-curable fluid. Alternatively, the first dispenser 430*a* can be a screen printer, a spin-on coater, or a die-slot coater. The first dispenser 430*a* can be coupled to a gantry 432*a* to control the position of the first inkjet printer as the printer moves within the first dispensing chamber 402. Alternatively, the dispenser can be stationary and the display 10 can be mounted on a movable support while the photo-curable fluid is dispensed.

The first inkjet printer can have a first printhead array, a first service station, and a first ink reservoir (not shown). The first printhead array includes one or more printheads, each printhead having one or more rows of nozzles to direct the first photo-curable fluid 30 on to the display 10. The first service station allows preventive or corrective maintenance actions to be performed on the first inkjet printer. The first ink reservoir is coupled to the printhead array to provide ink to the printhead array. Power, control signals and ink can be provided to the printhead array through hoses and cables that are movable as the printhead array moves along the first gantry 432*a* within the first dispensing chamber.

The first dispensing support 428*a* can be, for example, a pedestal, edge support, or lift pins from a plate. In some implementations, the first dispensing support 428*a* is provided by the robot that is part of the workpiece transport system.

The first dispensing support 428*a* can be a movable stage. The display 10 can be aligned with nozzles (not shown) of the printhead array via fiducial marks on the first inkjet printer (not shown) to allow high precision printing (inkjetting) of color conversion agents. In addition, a post-printing quality control inspection such as inspections conducted by a high resolution imaging system can detect printing defects so that rework can occur in the first dispensing chamber 402 before moving on to other modules for further processing.

In some implementations, the LED display fabrication tool 400 includes an inkjet repair module (not shown). The inkjet repair module can include a red-green-blue printhead, an ultraviolet curing module, and a wash/dry module. The inkjet repair module can be coupled to the third dispensing chamber 416 (i.e., at the termination of manufacturing process) to allow the display 10 to be repaired when there are spare micro-LED subpixels (not shown) on the display 10.

FIG. 15 shows a detailed schematic cross-section of an example inkjet printer 1500 system contained within first dispensing chamber 402 of the LED display fabrication tool 400. The system 1500 can include a mask 210 and a print head 220 or print head array attached to an actuator 230 such that the print head 220 can move along an axis in the direction 232. In some implementations, the first dispensing support 428*a* (with the display 10) can move while print head 220 remains stationary dispensing the droplets 222. The mask 210 is supported above the micro-LED display 10 and be vertically separated from walls 20 on the display 10 at a distance 203 of 0.1-2 mm. Alternatively, the mask 210 can be moved into contact with the micro-LED display. The mask 210 can have apertures 213 of the same size, and optionally of the same shape, as the subpixel wells 50 that are to be filled with color conversion material. For example, the apertures 213 can be 8-10 microns across. In some implementations, the size of apertures 213 (i.e. feature holes) in the mask 210 can be much larger than a size of recess 226 (a width) of each subpixel well 50, i.e., the size of feature holes can be 10-200 microns. The size of the apertures is less than the pitch between the subpixels.

The print head 220 is located above the mask 210, e.g., at a distance 205 of 0.25-2 mm. The print head 220 is controlled to selectively deposit droplets 222 of formulation into corresponding subpixel wells 50. In some implementations, the droplets 222 are ejected and shear momentum from the ejection force propels the droplets 222 toward the display 10. The droplets can be propelled at a jetting speed of between five meters per second to fifteen meters per second.

As the device resolution increases, the size of the subpixel wells 50 shrinks, and the drop volume or weight needs is also reduced to avoid overflow of the well 50 and/or to simply fit within the well 50. As a result, the droplets 222 become more affected by air resistance or air currents. Ideally, droplets 222 dispensing from the print head 220 are delivered into a corresponding subpixel well 50. However, droplets 224 that deviate from a desired path and that would impinge wells corresponding to other colors can be blocked by the mask 210. Ideally, the droplets will not spill over the corresponding subpixel wells 50, as shown in FIG. 2A.

Figure 17B:
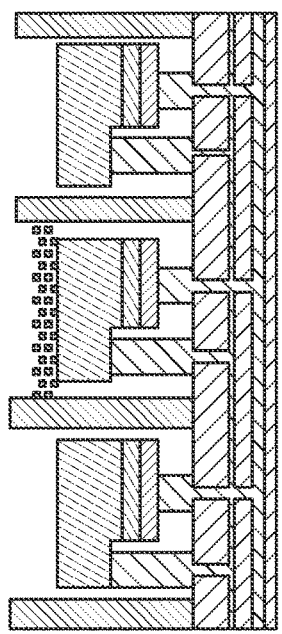
Figure 17C:
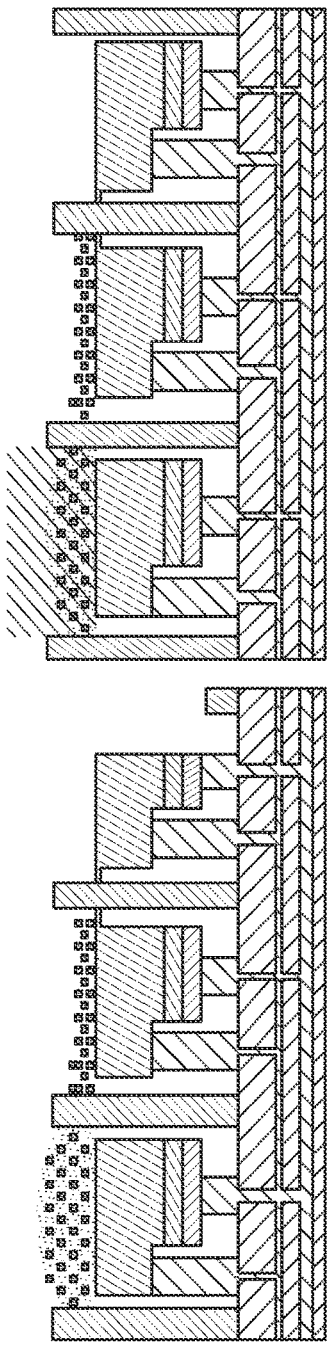

The LED display fabrication tool 400 has a second dispensing chamber 404 substantially similar to the first dispensing chamber 402. The second dispensing chamber 404 includes a second dispensing station with a second support 428b to hold the display 10 and a second dispenser 430b to deliver a second color conversion precursor (the second photo-curable fluid) that is different from the first color conversion precursor (the first photo-curable fluid 30) onto the display 10. A second dispenser 430b can be coupled to a second gantry 432b to control the position of the second dispenser 430b (a second inkjet printer) as the second dispenser 430b moves within the second dispensing chamber 404. FIG. 17C visually depicts the processes shown in FIG. 3E occurring in the second dispensing chamber 404 to deliver and cure the second color conversion precursor on the display 10.

Figure 17D:
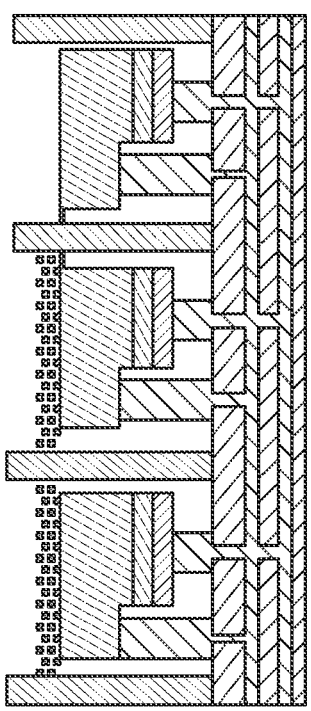
Figure 17E:
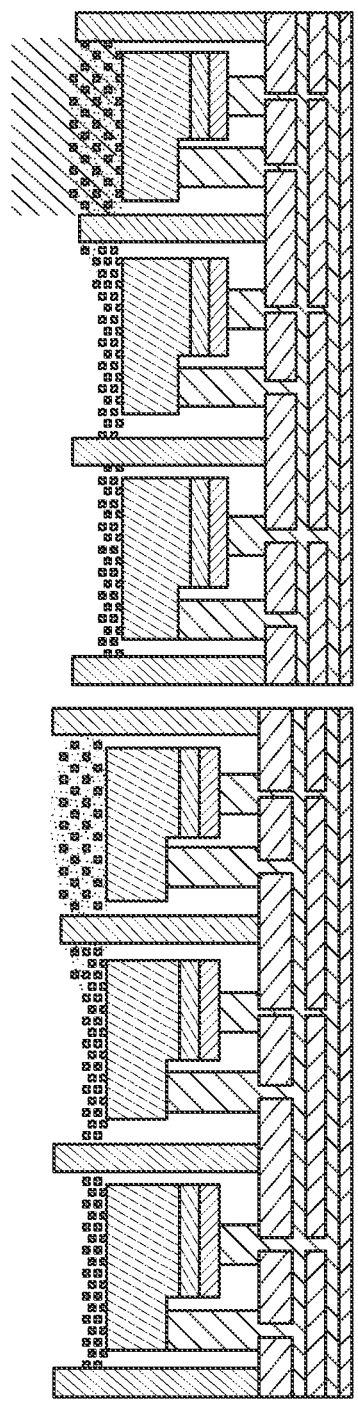
Figure 17F:
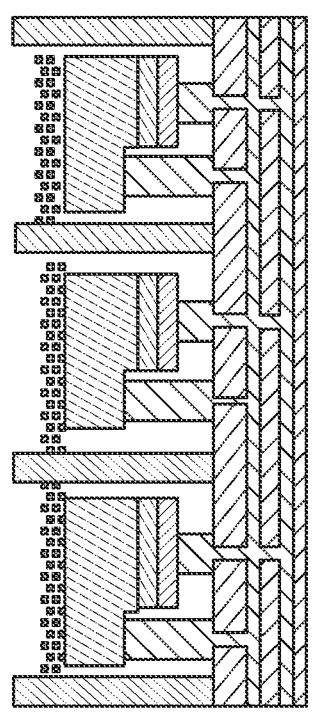

The LED display fabrication tool 400 can have a third dispensing chamber 406 substantially similar to the first dispensing chamber 402 and the second dispensing chamber 404. The third dispensing chamber 406 includes a third dispensing station with a third dispensing support 428c to hold the display 10 and a third dispenser 430b to deliver a third color conversion precursor (the third photo-curable fluid) different from the first color conversion precursor (the first photo-curable fluid 30) and the second color conversion precursor (the second photo-curable fluid) onto the display 10. The third dispenser 430c can be coupled to a third gantry 432c to control the position of the third dispenser 430c (a third inkjet printer) as the third dispenser 430c moves within the third dispensing chamber 406. FIG. 17E visually depicts the processes shown in FIG. 3F occurring in the third dispensing chamber 406 to deliver and cure the third color conversion precursor on the display 10.

The first dispensing chamber 402 also includes a first curing station 434a to cure the first photo-curable fluid 30 on the display 10 to form a first color conversion layer over a first set of LEDs on the display 10 as described earlier and shown in FIGS. 3B-C.

The first curing station 434a can include a first curing support 456 positioned in the first dispensing chamber 402 which is separate from the first dispensing support 428a. The first curing support 456 holds the display 10 during the curing process.

The first curing station 434a can include circuitry 478 (shown in FIG. 16) operatively coupled to the controller 426. The first curing station circuitry 478 can activate the first set of LEDs to emit light to cure the first photo-curable fluid 30. Although illustrated as part of the support 456, the circuitry 478 could be on a separate body that is lowered from the top surface to contact edges of the display 10.

Alternatively or in addition, the first curing station can supply an inert gas during the curing process to shield the display 10. For example, the inert gas can be a nitrogen ($N_2$) gas curtain. Nitrogen gas can provide an inert environment to allow a more complete or complete ultra-violet curing of the first photo-curable fluid 30. In some cases, where a self-limiting curing is used and the cured layer height is less than D, a nitrogen gas curtain may not be required.

The LED display fabrication tool 400 has a second curing station 434b in the second dispensing chamber 404 to cure the second color conversion precursor to form a second color conversion layer over a second set of LEDs on the display 10 substantially similar to the first curing station. Likewise, the third dispensing chamber 406 has a third curing station 434c to cure the third color conversion precursor to form a third color conversion layer over a third set of LEDs on the display 10 substantially similar to the first curing station 434a and the second curing station 434b.

The first dispensing chamber 402 can include a first inspection sensor 438a to monitor one or more conditions of the workpiece. Referring to FIG. 16, in some implementations, the first inspection sensor 438a is at a separate monitoring station 435a with a separate support 457a to hold the workpiece while the inspection sensor 438a scans the workpiece. In some implementations, the first inspection sensor 438a is integrated with one or more of the other monitoring stations.

The first inspection sensor 438a transmits a signal representing the condition of the first workpiece to the controller 426. The first inspection sensor 438a can include multiple sensors. For example, the first inspection sensor 438a can include a high speed high resolution optical imager (for substrate alignment, materials deposition defect detection and correction) or a luminescent imager (for control UV curing, materials processing, defect detection, device performance mapping, or look up table mapping). Likewise, the second dispensing chamber 404 can include a second inspection sensor 438b and the third dispensing chamber 406 can include a third inspection sensor 438c substantially similar to the first inspection sensor 438a previously described.

The first dispensing chamber 402 can include a first environmental sensor 436a to monitor one or more environmental conditions inside the first dispensing chamber 402. The first environmental sensor 436a transmits a signal representing the first dispensing chamber 402 condition to the controller 426. For example, one or more environmental sensors can monitor temperature, relative humidity, gas composition, etc., and provide this data to a control algorithm that can control the components in the process chamber. This can provide improved process stability control.

Likewise, the second dispensing chamber 404 can include a second environmental sensor 436b and the third dispensing chamber 406 can include a third environmental sensor 436c substantially similar to the first environmental sensor 436a previously described.

The LED display fabrication tool 400 can include a first load lock chamber 408 externally coupled to the first dispensing chamber 402. The first load lock chamber 408 handles loading of the workpiece into the fabrication tool 400. The first load lock chamber 408 can include a support to hold the workpiece. A valve 484a can separate the first load lock chamber 408 from the outside environment, e.g., the clean room. Another valve 484b, e.g., a slit valve, can separate the first load lock chamber 408 from the first dispensing chamber 402. The user or a robot places the workpiece into the load lock chamber 408, then the outer valve 484a is closed. Then air is evacuated from the first load lock chamber 408 (or replaced by a pure gas, e.g., an inert gas, or clean air). When the inner valve 484b opens, the robot 440a reaches into the first load lock chamber 408 and takes the workpiece.

As shown in FIG. 4, a second load lock chamber 410 is coupled to the third washing/drying chamber 416 to handle unloading of the completed micro-LED display 10 from the fabrication tool 400. A valve 488a can separate the third washing/drying chamber 416 from the outside environment, e.g., the clean room. Another valve 488b, e.g., a slit valve, can separate the first load lock chamber 410 from the third washing/drying chamber 416.

The first dispensing chamber 402 can be configured to monitor and control contamination concentration within the first dispensing chamber 402. Contamination can occur or enter within the first dispensing chamber for multiple reasons. For example, contamination can come from normal air contaminates, foreign objects, or splattering of or vapor from the color conversion precursor.

One means of reducing the contamination concentration in the first dispensing chamber 402 can be a particle contamination control module. The particle contamination control module can include a high efficiency particulate air filter 470 (shown in FIG. 16) and a particulate counter. The high efficiency particulate air filter 470 is fluidically coupled to the first dispensing chamber 402. The high efficiency particulate air filter 470 reduces the contamination concentration from air entering the first dispensing chamber 402 through an air inlet (not shown) with air from the surrounding atmosphere.

The particle contamination control module can be equipped with a particulate counter coupled to the first dispensing chamber to sample the contamination concentration of the air in the first dispensing chamber. The particulate counter monitors the air for contaminants and sends a signal representing the contamination level in the air to the particle contamination control module. The particle contamination module can be operative coupled to the controller 426.

Referring to FIG. 16, the first dispensing chamber 402 can include a first exhaust duct 472 fluidically coupled to the first dispensing chamber 402. The first exhaust duct 472 controls an air flow from the first dispensing chamber 402 to the atmosphere. The first exhaust duct 472 can include a first exhaust flow sensor 474 positioned to monitor a first exhaust flow condition and transmit a signal representing the first exhaust flow condition to a laminar exhaust module. Alternatively or in addition, the first exhaust flow sensor can transmit the signal representing the first exhaust flow to the particle contamination control module or the controller 426. The exhaust duct 472 can have a pump 476 to move the air through the exhaust duct from the first dispensing chamber 402 to atmosphere.

The second dispensing chamber 404 can be equipped with a second particle contamination control module substantially similar to the first particle contamination control module. The third dispensing chamber 406 can be equipped with a third particle contamination control module substantially similar to the first particle contamination control module and the second particle contamination control module.

The laminar exhaust module can receive the signal representing the first exhaust flow condition, receive a signal representing the second exhaust flow condition, and control the air flow from the first dispensing chamber 402 to atmosphere based on the first exhaust flow condition, an air flow from the second dispensing chamber 402 based on a second exhaust flow condition, and an air flow from the third dispensing chamber 406 based on a third exhaust flow condition. The laminar exhaust module can be positioned in the vicinity of the inkjet printhead(s) to allow stable inkjetting flow dynamics.

Referring to FIG. 16, the first dispensing chamber 402 can include a first access port 478 to allow the first dispenser 430a, which can also be the print head 220 described earlier, or the first inspection sensor 438a to pass in to the first dispensing chamber 402. Like the first dispensing chamber 402, the second dispensing chamber 404 can include a second access port substantially similar to the first access port. Also, the third dispensing chamber 406 can include a third access port substantially similar to the first access port and the second access port.

The LED display fabrication tool 400 has a first washing/drying chamber 412 including a first washing support (not shown) to hold the display 10 and a first washing assembly (not shown). The first washing assembly sprays a washing fluid onto the workpiece to remove the uncured portions of the first photo-curable fluid 30 from the display 10 as shown in FIG. 3D and described above. The first washing/drying chamber 412 also dries the workpiece. The first washing/drying chamber 412 is independently sealable from the other chambers described herein. In some cases, the first washing/drying chamber 412 can dry the display 10 after the first color conversion layer is removed from the display 10. Also, the first washing/drying chamber 412 can include a fourth environmental sensor 436d to monitor a first washing/drying chamber 412 condition, substantially similar to the first environmental sensor 436a described earlier. FIG. 17B visually depicts the processes shown in FIG. 3D occurring in the first washing/drying chamber 412 to remove the residual uncured first photo-curable fluid.

The LED display fabrication tool 400 also has a second washing/drying chamber 414 including a second washing support (not shown) to hold the display 10 and a second washing assembly (not shown). The second washing assembly sprays a washing fluid onto the workpiece to remove the uncured portions of the second photo-curable fluid from the display 10 as shown in FIG. 3D and described above. The second washing/drying chamber 414 also dries the workpiece. The second washing/drying chamber 414 is independently sealable from the other chambers described herein. Also, the second washing/drying chamber 414 can include an eighth environmental sensor 436e to monitor a second washing/drying chamber 414 condition, substantially similar to the environmental sensors described earlier. FIG. 17D visually depicts the processes shown in FIG. 3D occurring in the second washing/drying chamber 414 to remove the residual uncured second photo-curable fluid.

A first isolation component 418a links the first dispensing chamber 402 to the first washing/drying chamber 412. The first isolation component 418a separates the various chambers to prevent cross-contamination. The first isolation component 418a can be a port, e.g., a slit valve. Alternatively, the first isolation component 418a can be a holding chamber with a support and a slit valve on either side connecting the holding chamber to the adjacent process chambers. The display 10 moves to the next sequential chamber in the direction of arrow 422. In some implementations, the first isolation component 418a can include sensors to monitor the status of the display 10 and/or the status of the valve (i.e. open or shut).

In some implementations, a discard bin (not shown) to hold rejected displays 10 is included in the LED display fabrication tool 400. The discard bin can be coupled to any of the chambers. For example, the discard bin can be coupled to the first washing/drying chamber by the first isolation component 418a. Alternatively, rejected displays 10 can pass through the various chambers to a discard bin coupled to the second load lock chamber 410.

A second isolation component 418b links the washing/drying chamber 412 to the second dispensing chamber 404. The second robot 440b moves the display 10 from the first washing/drying chamber 412 to the second dispensing chamber 404. The display 10 is moved within the second dispensing chamber 404 by the second robot 440b. The display 10 can be positioned on the second dispensing support 428b by the second robot 440b. The display 10 can then be moved around the second dispensing chamber 404.

A third isolation component 418c links the second dispensing chamber 404 to the second washing/drying chamber 414. The third robot 440c moves the display 10 from the second dispensing chamber 404 to the second washing/drying chamber 414. The display 10 can be positioned in the second dispensing support 428b and moved by the third robot 440c in the second dispensing chamber 404.

A fourth isolation component 418d links the second washing/drying chamber 414 to the third dispensing chamber 406. The fourth robot 440d moves the display 10 from the second washing/drying chamber 414 to the third dispensing chamber 406. The display 10 can be positioned in the third dispensing support 428c and moved by the fifth robot 440e in the third dispensing chamber 406.

A firth isolation component 418e links the third dispensing chamber 406 to the third washing/drying chamber 416. The fifth robot 440e moves the display 10 from the third dispensing chamber 406 to the third washing/drying chamber 416. The sixth robot 440f moves the display 10 in the third washing/drying chamber 416. The sixth robot 440f moves the workpiece to the second load lock chamber 410, out of the second loading bay in the direction of arrow 424.

A controller 426 is operatively coupled to each of the chambers and components previously described to cause the workpiece transport system to move the display 10 sequentially, in series, through the first dispensing chamber 402, the first washing/drying chamber 412, the second dispensing chamber 404, the second washing/drying chamber 414, the third dispensing chamber 406, and the third washing/drying chamber 416.

In some implementations, a support can be movable between different stations within a chamber. In this case, the robot may still be present in each chamber, e.g., to move the workpiece between chambers. However, the robot is not needed to move the workpiece between the supports of the different stations within a particular chamber.

In some implementations, the functions of multiple stations, e.g., dispensing and curing, are integrated into a single station. In this case, the same support can be used for different process steps, and multiple supports for the different steps are not required.

In some implementations, one or more of the supports, e.g., the first dispensing support 428a, can be moveable between the chambers in order to transport the workpiece between the chambers. In this case, the robot may still be present in each chamber, e.g., to move the workpiece between supports of different stations within the chamber.

In some implementations, a support can be movable between different chambers and between different stations within a chamber. In this case, the robot may not be needed. Additional chambers and/or sub-clusters can be included to handle additional materials processing, and repair requirements.

Figure 5:
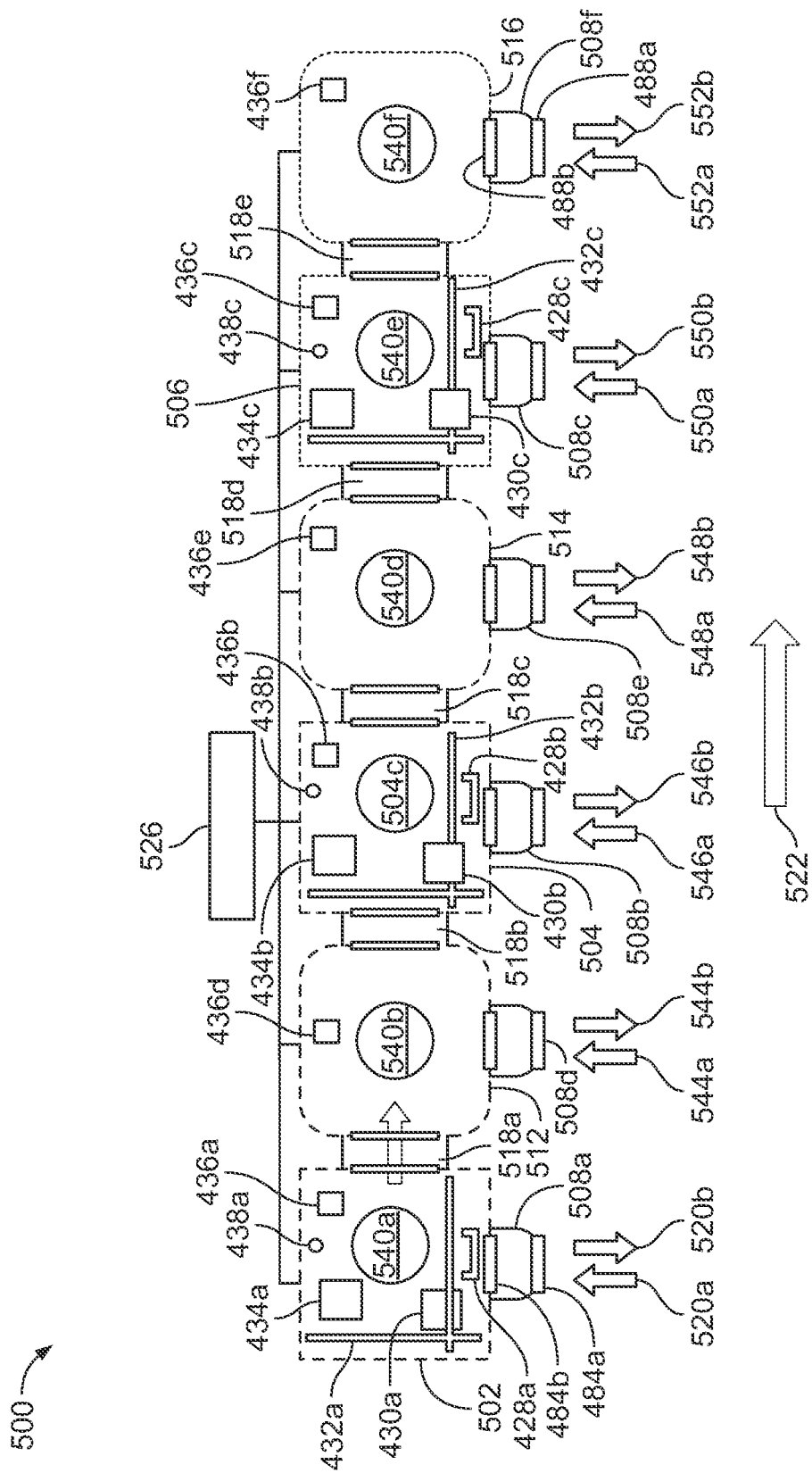
FIG. 5 is a schematic top view of another LED display fabrication tool.

As shown in FIG. 5, the LED display fabrication tool 500 can sequentially process micro-LED displays 10 to deposit the color conversion layers, but is configured to permit loading/unloading of the displays at each dispensing chamber and washing/drying chamber. This type of arrangement can facilitate the removal of a defective display 10. The defective display 10 can be permanently removed from the manufacturing process or can be returned to a prior chamber or station for rework. The LED display fabrication tool 500 passes the micro-LED displays 10 through process chambers sequentially with an option to be returned or removed. The LED display fabrication tool 500 can include a controller 526 to control operation of the various components, e.g., processing chambers and workpiece transport system. The various chambers and stations of the LED display fabrication tool 500 are generally similar to the chambers and stations described earlier. In some implementations, the first isolation component 518a can include sensors to monitor the status of the display 10 and/or the status of the valve (i.e. open or shut).

In some implementations, a discard bin (not shown) to hold rejected displays 10 is included in the LED display fabrication tool 500. The discard bin can be coupled to any of the chambers. For example, the discard bin can be coupled to the first washing/drying chamber 512 by the first isolation component 518a. Alternatively, rejected displays 10 can pass through the various chambers to a discard bin coupled to the second load lock chamber 510.

The LED display fabrication tool 500 includes a first dispensing chamber 502 substantially similar to the first dispensing chamber discussed earlier. The first dispensing chamber 502 is coupled to a first load/unload lock chamber 508a externally coupled to the first dispensing chamber 502. A first robot 540a handles loading and unloading of the display 10 into and out of the first dispensing chamber 502.

The first dispensing chamber 502 also includes a first curing station 434a to cure the first photo-curable fluid 30 on the display 10 to form a first color conversion layer over a first set of LEDs on the display 10 as described earlier and shown in FIGS. 3B-C. The first dispensing chamber 502 can include the first inspection sensor 438a and the first environmental sensor 436a substantially similar to the sensors described earlier.

The LED display fabrication tool 500 has a second dispensing chamber 504 substantially similar to the first dispensing chamber 502. The second dispensing chamber 504 can include the second inspection sensor 438b and the second environmental sensor 436b substantially similar to the sensors described earlier.

The second dispensing chamber 504 is coupled to a second load/unload lock chamber 508b externally coupled to the second dispensing chamber 502. The second load/unload lock chamber 508b permits loading and unloading of the display 10 into and out of the second dispensing chamber 504.

The second curing station 434b is situated in the second dispensing chamber 504 to cure the second color conversion precursor to form a second color conversion layer over a second set of LEDs on the display 10 substantially similar to the first curing station. Likewise, the third dispensing chamber 506 has a third curing station 434c to cure the third color conversion precursor to form a third color conversion layer over a third set of LEDs on the display 10 substantially similar to the first curing station 434a and the second curing station 434b.

The LED display fabrication tool 500 has a third dispensing chamber 506 substantially similar to the first dispensing chamber 502 and the second dispensing chamber 504. The third dispensing chamber 506 can include the third inspection sensor 438c and the third environmental sensor 436c substantially similar to the sensors described earlier. The third dispensing chamber 506 is coupled to a second load/unload lock chamber 508c externally coupled to the third dispensing chamber 506. A fifth robot 540e handles the display 10 into and out of the third dispensing chamber 506.

The LED display fabrication tool 500 has a first washing/drying chamber 512 substantially similar to the washing/drying chamber 412 described earlier. The first washing/drying chamber 512 can include the fourth environmental sensor 436d substantially similar to the sensors described earlier. The first washing/drying chamber 512 is coupled to a fourth load/unload lock chamber 508d externally coupled to the first washing/drying chamber 512. A second robot 540b loads, unloads, and handles the display 10 into and out of the first washing/drying chamber 512 and the fourth load/unload lock chamber 508d.

The LED display fabrication tool 500 also has a second washing/drying chamber 514 substantially similar to the washing/drying chamber 412 described earlier. The second washing/drying chamber 514 can include the fifth environmental sensor 436e substantially similar to the sensors described earlier.

The second washing/drying chamber 514 is coupled to a fifth load/unload lock chamber 508e externally coupled to the second washing/drying chamber 514. A third robot 540c loads, unloads, and handles the display 10 into and out of the second washing/drying chamber 514.

Similarly, the LED display fabrication tool 500 has a third washing/drying chamber 516 substantially similar to the first washing/drying chamber 412 described earlier. The third washing/drying chamber 516 can include the sixth environmental sensor 436f substantially similar to the sensors described earlier.

The third washing/drying chamber 516 is coupled to a sixth load/unload lock chamber 508f externally coupled to the third washing/drying chamber 516. A sixth robot 540f loads, unloads, and handles the display 10 into and out of the third washing/drying chamber 516.

The LED display fabrication tool 500 has a workpiece (display 10) transport system configured to pass the workpiece sequentially through the various chambers. The workpiece transport system can be provided by, for example, a first robot 540a located in the first dispensing chamber 402. A similar robot can be in each chamber. For example, the first washing/drying chamber 412 can have a second robot 540b, the second dispensing chamber 404 can have a third robot 540c, the second washing/drying chamber 514 can have a fourth robot 540d, the third dispensing chamber 506 can have a fifth robot 540e, and the third washing/drying chamber 516 can have a sixth robot 540f.

The display 10 is placed in a first load/unload lock chamber 508a as shown by arrow 520a, e.g., by an operator or the robot 540a. The first load/unload lock chamber 508a can be coupled to the first dispensing chamber 502 by a valve, e.g., a slit valve, through which the workpiece can pass.

The workpiece is moved from the first load/unload lock chamber 508a into the first dispensing chamber 502 by the first robot 540a. For example, the robot 540a can reach through the open slit valve to retrieve the workpiece from the first load/unload lock chamber 508a. The first dispensing chamber performs the work processes contained within on the workpiece. The workpiece is moved from the first dispensing chamber 502 to the first washing/drying chamber 512 through a first isolation component 518a in the direction shown by arrow 522. Alternatively, the workpiece can be unloaded through the first load/unload lock chamber 508a by the first robot 540a as shown by arrow 520b.

The first isolation component 518a links the first dispensing chamber 502 to the first washing/drying chamber 512. The first robot 540a moves the display 10 from the first dispensing chamber 502 to the first washing/drying chamber 512. The first isolation component 518a is substantially similar to the isolation components described earlier. A workpiece that was previously removed from the first dispensing chamber 502 can be placed into the first washing/drying chamber 512 by the second robot 540b. The second robot 540b can pass the workpiece into the first washing/drying chamber 512 as shown by arrow 544a. The workpiece can be unloaded from the first washing/drying chamber 512 through the fourth load/unload lock chamber by the second robot 540b in the direction of arrow 544b.

The second robot 540b moves the workpiece within first washing/drying chamber 512. The first washing/drying chamber 512 rises the workpiece. The fourth robot 540b then moves the workpiece out of the first washing/drying chamber 512 into a second isolation component 518b in the direction of arrow 522.

The second isolation component 518b links the first washing/drying chamber 512 to the second dispensing chamber 504. The display 10 is moved into, as shown by arrow 546a, the second dispensing chamber 504 by the third robot 540c. The second dispensing chamber 504 performs the work process contained within on the display 10. If needed, the workpiece is moved from the second dispensing chamber 504 to the second load/unload lock chamber 508b by the third robot 540c in the direction of arrow 546b. The workpiece can be placed into the second dispensing chamber 504 through the second load/unload lock chamber 508b in the direction of arrow 546a. The third robot 540c moves the workpiece to a third isolation component 518c as shown by 522.

The third isolation component 518c links the second dispensing chamber 504 to the second washing/drying chamber 514. The fourth robot 540d moves the display 10 from the second dispensing chamber 504 into the second washing/drying chamber 514 as shown by arrow 522. The third robot 540c can also move the display 10 from the second dispensing chamber 504 into the second washing/drying chamber 514 as shown by arrow 522. More generally, a robot in a particular chamber can be used to move the display 10 to or from an adjacent chamber. The second washing/drying chamber 514 performs rinsing work processes on the workpiece. If needed, the workpiece is moved from the second washing/drying chamber 514 to the fifth load/unload lock chamber 508e by the fourth robot 540d in the direction of arrow 548b. The workpiece can be placed into the washing/drying chamber 514 through the fifth load/unload lock chamber 508e in the direction of arrow 548a. The fourth robot 540d moves the workpiece out of the second washing/drying chamber 514 into a fourth isolation component 518d in the direction of arrow 522.

The fourth isolation component 518d links the second washing/drying chamber 514 to the third dispensing chamber 506. The display 10 is moved into the third dispensing chamber 506 by the fifth robot 540e. Then the workpiece is moved within the third dispensing chamber 506 by the fifth robot 540e. The third dispensing chamber 506 performs the work process contained within on the display 10. If needed, the workpiece is moved from the third dispensing chamber 506 to the third load/unload lock chamber 508c by the fifth robot 540e in the direction of arrow 550b. The workpiece can be placed into the third dispensing chamber 506 through the third load/unload lock chamber 508c in the direction of arrow 550a. The workpiece is moved from the third dispensing chamber 506 to a fifth isolation component 518e by the fifth robot 540e as shown by arrow 522.

The fifth isolation component 518e links the third dispensing chamber 506 to the third washing/drying chamber 516. The sixth robot 540f moves the display 10 from the third dispensing chamber 506 into the third washing/drying chamber 516. The third washing/drying chamber 516 performs rinsing work processes on the workpiece. The sixth robot moves the workpiece out of the third washing/drying chamber 516 to the sixth load/unload lock chamber 508f with the robot 540f or by an operator in the direction of arrow 552b. If needed, the workpiece can be placed into the washing/drying chamber 516 through the sixth load/unload lock chamber 508f in the direction of arrow 552a.

A controller 526 is operatively coupled to each of the chambers and components previously described to cause the workpiece transport system to move the display 10 sequentially through the first dispensing chamber 502, the first washing/drying chamber 512, the second dispensing chamber 504, the second washing/drying chamber 514, the third dispensing chamber 506, and the third washing/drying chamber 516. Additional chambers and/or sub-clusters can be included to handle additional materials processing, and repair requirements.

Figure 6:
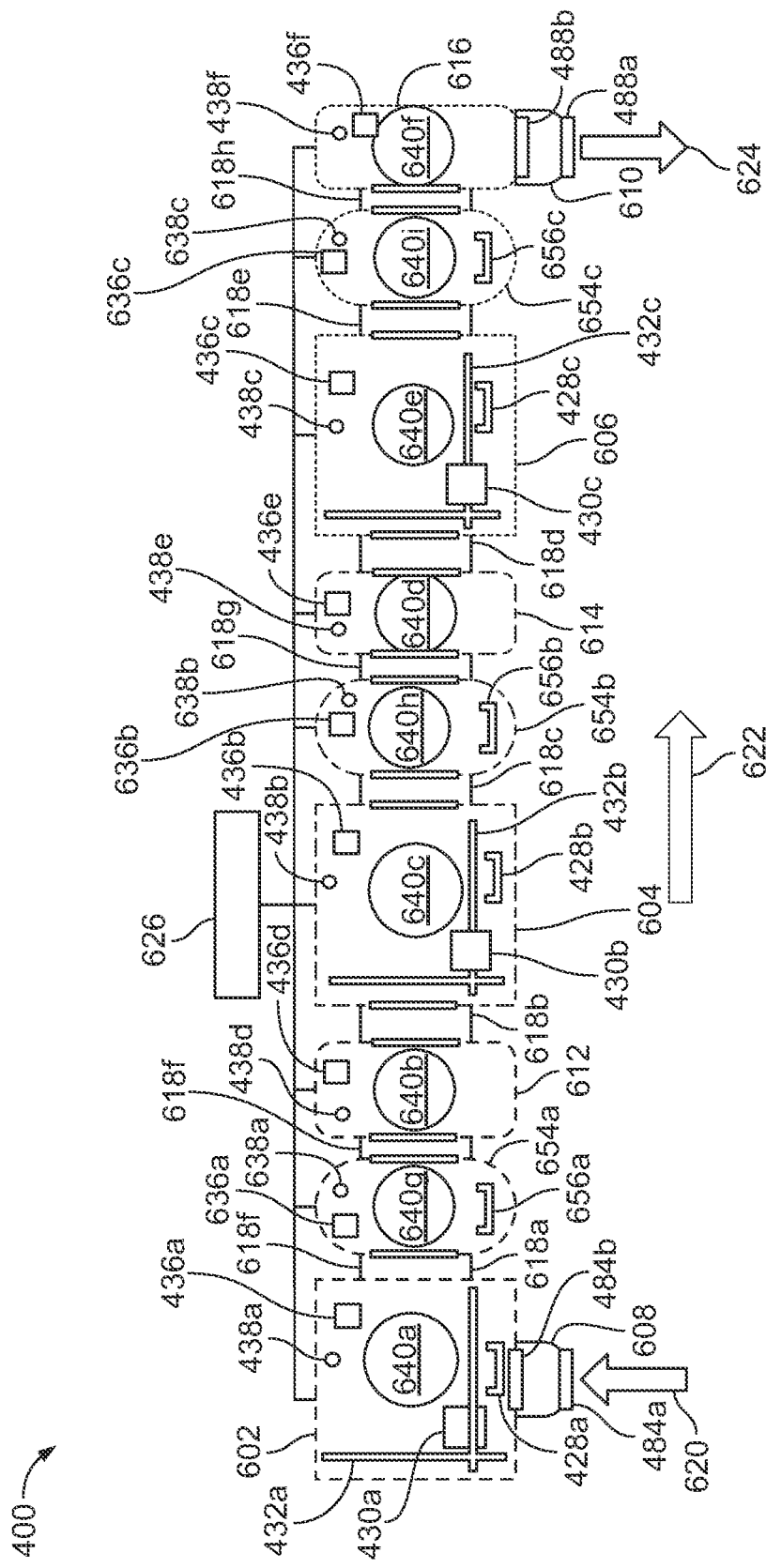
FIG. 6 is a schematic top view of another LED display fabrication tool.

As shown in FIG. 6, the LED display fabrication tool 600 sequentially processes micro-LED displays 10 to deposit the color conversion layers, similar to LED display fabrication tool 400, with a separate, independently sealed curing station positioned between each dispensing chamber/washing/drying chamber pair.

The LED display fabrication tool 600 passes the micro-LED displays 10 through process chambers sequentially in a serial manner. The LED display fabrication tool 600 can include a controller 626 to control operation of the various components, e.g., processing chambers and workpiece transport system. This arrangement can allow for separate control of processing environments for different steps of the process, e.g., inert environment (N2 gas, for example) during curing and clean air environment for printing, washing, and drying.

The LED display fabrication tool 600 includes a first dispensing chamber 602 substantially similar to the first dispensing chamber discussed earlier. However, the first dispensing chamber 602 need not include a curing station.

The LED display fabrication tool 600 has a second dispensing chamber 604 substantially similar to the first dispensing chamber 602. However, the second dispensing chamber 604 need not include a curing station.

The LED display fabrication tool 600 can have a third dispensing chamber 606 substantially similar to the first dispensing chamber 602 and the second dispensing chamber 604. However, the third dispensing chamber 606 need not include a curing station.

The LED display fabrication tool 600 also includes a first curing chamber 654a to cure the first photo-curable fluid 30 on the display 10 to form a first color conversion layer over a first set of LEDs on the display 10 as described earlier and shown in FIGS. 3B-C. The first curing chamber 654a is independently sealable from the other chambers and stations. The first curing chamber 654a can include a first curing support 656a positioned in the first curing chamber 654a similar to the first dispensing support 428a. The first curing support 656a holds the display 10 during the curing process. The first curing chamber 654a has a first environmental sensor 636a substantially similar to the environmental sensor 436a discussed earlier. The first curing chamber 654a also has a first inspection sensor 638a substantially similar to the inspection sensor 438a discussed earlier. The first curing chamber 654a can include a robot 640g substantially similar to the robots discussed earlier. The first curing chamber 654a can include circuitry operatively coupled to the controller 626. The first curing chamber circuitry can activate the first set of LEDs to emit light to cure the first photo-curable fluid 30. Otherwise, the first curing chamber 654a is similar to the first curing stations described earlier.

The LED display fabrication tool 600 also includes a second curing chamber 654b to cure the second photo-curable fluid on the display 10 to form a second color conversion layer over a second set of LEDs on the display 10 as described earlier and shown in FIGS. 3B-C. The second curing chamber 654b is independently sealable from the other chambers and stations. The second curing chamber 654b has a second environmental sensor 636b substantially similar to the environmental sensor 436a discussed earlier. The second curing chamber 654b also has a second inspection sensor 638b substantially similar to the inspection sensors 438a discussed earlier. The second curing chamber 654b can include a second curing support 656b substantially similar to the first curing support described earlier. The second curing chamber 654b has an eleventh sensor 638b substantially similar to the chamber sensors discussed earlier. The second curing chamber 654b can include a robot 640h substantially similar to the robots discussed earlier. Otherwise, the second curing chamber 654b is similar to the first curing stations described earlier.

The LED display fabrication tool 600 also includes a third curing chamber 654c to cure the third photo-curable fluid on the display 10 to form a third color conversion layer over a third set of LEDs on the display 10 as described earlier and shown in FIGS. 3B-C. The third curing chamber 654c is independently sealable from the other chambers and stations. The third curing chamber 654c has a third environmental sensor 636c substantially similar to the environmental sensor 436a discussed earlier. The third curing chamber 654c also has a third inspection sensor 638c substantially similar to the inspection sensors 438a discussed earlier. The third curing chamber 654c can include a third curing support 656c substantially similar to the curing supports described earlier. The third curing chamber 654c has a twelfth sensor 638c substantially similar to the chamber sensors discussed earlier. The third curing chamber 654c can include a robot 640i substantially similar to the robots discussed earlier. Otherwise, the third curing chamber 654c is similar to the first curing stations described earlier.

The first dispensing chamber 602 can include a first load lock chamber 608 externally coupled to the first dispensing chamber 602. The first load lock chamber 608 loads and handles the display 10 into the first dispensing chamber 602. As shown in FIG. 6, a second load lock chamber 610 is externally coupled to the third washing/drying chamber 616 through which the ninth robot 640f unloads and handles the completed micro-LED display 10 from the LED display fabrication tool 600.

The LED display fabrication tool 600 has a first washing/drying chamber 612 including a first washing support (not shown) to hold the display 10 and a first washing assembly (not shown). The first washing/drying chamber 612 can have a second robot 640b that controls the display 10 position and the first washing support. The first washing assembly removes the uncured portions of the first photo-curable fluid 30 from the display 10 as shown in FIG. 3D and described above.

The LED display fabrication tool 600 also has a second washing/drying chamber 614 including a second washing support (not shown) to hold the display 10 and a second washing assembly (not shown). The second washing/drying chamber 614 can have a fourth robot 640*d* that controls the display 10 position and the second washing support. The second washing assembly removes the uncured portions of the second photo-curable fluid from the display 10 as shown in FIG. 3D and described above. The second washing/drying chamber 614 is independently sealable from the other chambers described herein.

Similarly, the LED display fabrication tool 600 has a third washing/drying chamber 616 including a third washing support (not shown) to hold the display 10 and a third washing assembly (not shown). The third washing/drying chamber 616 can have a fourth robot 640*f* that controls the display 10 position and the third washing support. The third washing assembly removes the uncured portions of the third photo-curable fluid from the display 10 as shown in FIG. 3D and described above. The third washing/drying chamber 616 is independently sealable from the other chambers described herein.

The LED display fabrication tool 600 has a workpiece (display 10) transport system configured to pass the workpiece sequentially through the various chambers. The workpiece transport system can be provided by, for example, the first robot 640*a* located in the first dispensing chamber 602. A similar robot can be in each chamber. For example, the first washing/drying chamber 612 can have the second robot 640*b*, the second dispensing chamber 604 can have the third robot 640*c*, the second washing/drying chamber can have the fourth robot 640*d*, the third dispensing chamber 606 can have the fifth robot 640*e*, and the third washing/drying chamber 606 can have the sixth robot 640*f*.

The display 10 is placed in a first load lock chamber 608 as shown by arrow 620, e.g., by an operator or the robot 640*a*. The first load lock chamber 608 can be coupled to the first dispensing chamber 602 by a valve, e.g., a slit valve, through which the workpiece can pass.

The workpiece is moved from the first load lock chamber 608 into the first dispensing chamber 602 by the first robot 640*a*. The first dispensing chamber 602 processes the workpiece. The first robot 640*a* moves the workpiece to a first isolation component 618*a*, substantially similar to the isolation components discussed previously. The first isolation component 618*a* links the first dispensing chamber 602 to the first curing chamber 654*a*. The first robot 640*a* moves the display 10 from the first dispensing chamber 602 to the first curing chamber 654*a* through the first isolation component 618*a*. The display 10 is moved to the next sequential chamber in the direction of arrow 622.

A sixth isolation component 618*f*, substantially similar to the isolation components previously discussed, links the first curing chamber 654*a* to the first washing/drying chamber 612. A seventh robot 640*g* moves the workpiece through the sixth isolation component 618*f* from the first curing chamber 654*a* to the first washing/drying chamber 612.

A second isolation component 618*b* links the first washing/drying chamber 612 to the second dispensing chamber 604. The seventh robot 640*g* or the second robot 640*b* moves the display 10 through the second isolation component 618*b* from the first washing/drying chamber 612 to the second dispensing chamber 604. The work processes are performed on the workpiece in the second dispensing chamber 604.

A third isolation component 618*c* links the second dispensing chamber 604 to the second curing chamber 654*b*. The third robot 640*c* moves the display 10 from the second dispensing chamber 604 through the third isolation component 618*c* to the second curing chamber 654*b*.

A seventh isolation component 618*g* links the second curing chamber 654*b* to the second washing/drying chamber 614. The eighth robot 640*h* or the fourth robot 640*d* moves the display 10 from the second curing chamber 654*a* through the sixth isolation component 618*g* to the second washing/drying chamber 614.

A fourth isolation component 618*d* links the second washing/drying chamber 614 to the third dispensing chamber 606. The fourth robot 640*d* or the fifth robot 640*e* moves the display 10 from the second washing/drying chamber 614 through the fourth isolation component 618*d* to the third dispensing chamber 606. The display 10 can be moved within the third dispensing chamber 606 on the third dispensing support 628*c* by the fifth robot 640*e*.

A fifth isolation component 618*e* links the third dispensing chamber 606 to the third curing chamber 654*c*. The ninth robot 640*i* or the fifth robot 640*e* moves the display 10 from the third dispensing chamber 606 through the fifth isolation component 618*e* to the third curing chamber 654*c*.

A seventh isolation component 618*h* links the third curing chamber 654*b* to the third washing/drying chamber 616. The sixth robot 640*f* or the ninth robot 640*i* moves the display 10 from the third curing chamber 654*c* through the seventh isolation component 618*h* to the third washing/drying chamber 616.

The robot 640*f* moves the display 10 to the second load lock chamber 610. The display 10 moves within the third washing/drying chamber 616 to the second loading bay 610, then out of the second loading bay 610 in the direction of arrow 624.

A controller 626 is operatively coupled to each of the chambers and components previously described to cause the workpiece transport system to move the display 10 sequentially, in series, through the first dispensing chamber 602, the first curing chamber 654*a*, the first washing/drying chamber 612, the second dispensing chamber 604, the second curing chamber 654*b*, the second washing/drying chamber 614, the third dispensing chamber 606, the third curing station 654*c*, and the third washing/drying chamber 616.

Figure 7:
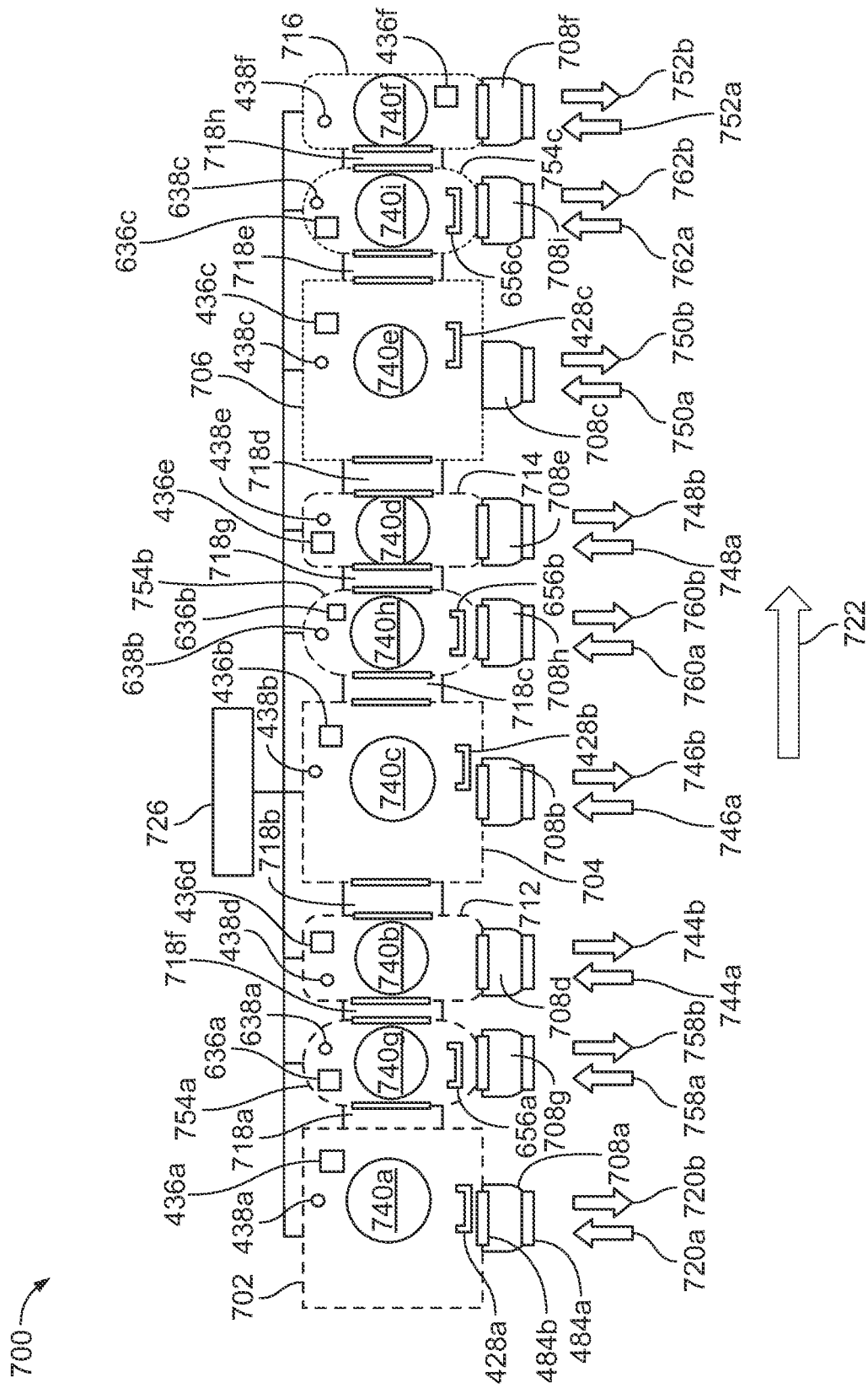
FIG. 7 is a schematic top view of another LED display fabrication tool.

As shown in FIG. 7, the LED display fabrication tool 700 sequentially processes micro-LED displays 10. The display fabrication tool 700 is configured to permit loading/unloading of the display at each dispensing chamber and washing/drying chamber, similar to LED display fabrication tool 500. However, the display fabrication tool 700 has separate, independently sealed dispensing chambers, curing chambers, and washing/drying chambers. Having a curing chamber that is separate and isolated from the dispensing chamber can reduce the risk of defects.

The LED display fabrication tool 700 can include a controller 726 to control operation of the various components, e.g., processing chambers and workpiece transport system. The various chambers and stations of the LED display fabrication tool 700 are substantially similar to the chambers and stations described earlier.

The LED display fabrication tool 700 includes a first dispensing chamber 702 substantially similar to the first dispensing chamber discussed earlier, but with a first robot 740*a* to control the position of the display 10. The first dispensing chamber 702 is coupled to a first load/unload lock chamber 708*a*. The first robot 740*a* loads, unloads, and handles the display 10 into and out of the first dispensing chamber 702.

The LED display fabrication tool 700 has a second dispensing chamber 704 substantially similar to the first dispensing chamber 702 with a third robot 740c to control the position of the display 10. The second dispensing chamber 704 is coupled to a second load/unload lock chamber 708b through which the third robot 740c can insert or remove a workpiece if needed.

The LED display fabrication tool 700 can have a third dispensing chamber 706 substantially similar to the first dispensing chamber 702 and the second dispensing chamber 704 with a fifth robot 740e to control the position of the display 10. The third dispensing chamber 706 is coupled to a third load/unload lock chamber 708c. The fifth robot 740e loads, unloads, and handles the display 10 into and out of the third dispensing chamber 706 through the third load/unload lock chamber 708c.

The LED display fabrication tool 700 also includes a first curing chamber 754a substantially similar to the curing chambers described earlier, but with a seventh robot 740g. The first curing chamber 754a is coupled to a seventh load/unload lock chamber 708g. The seventh robot 740g loads, unloads, and handles the display 10 into and out of the first curing chamber 754a through the seventh load/unload lock chamber 708g.

The LED display fabrication tool 700 also includes a second curing chamber 754b with an eighth robot 740h substantially similar to the robots discussed earlier. Otherwise, the second curing chamber 754b is similar to the first curing stations described earlier. The second curing chamber 754b is coupled to an eighth load/unload lock chamber 708h. The eighth robot 740h loads, unloads, and handles the display 10 into and out of the second curing chamber 754b through the eighth load/unload lock chamber 708h.

The LED display fabrication tool 700 also includes a third curing chamber 754c with a ninth robot 740i substantially similar to the robots discussed earlier. The third curing chamber 754c is coupled to a ninth load/unload lock chamber 708i. The ninth robot 740i loads, unloads, and handles the display 10 into and out of the third curing chamber 754c through the ninth load/unload lock chamber 708i.

The LED display fabrication tool 700 has a first washing/drying chamber 712 substantially similar to the first washing/drying chamber 412 described earlier, but with a second robot 740b. The first washing/drying chamber 712 is coupled to a fourth load/unload lock chamber 708d. The second robot 740b loads, unloads, and handles the display 10 into and out of the first washing/drying chamber 712 through the fourth load/unload lock chamber 708d.

The LED display fabrication tool 700 also has a second washing/drying chamber 714 substantially similar to the first washing/drying chamber 412 described earlier, but with a fourth robot 740d. The second washing/drying chamber 714 is coupled to a fifth load/unload lock chamber 708e. The fourth robot 740d loads, unloads, and handles the display 10 into and out of the second washing/drying chamber 714 through the fifth load/unload lock chamber 708e.

Similarly, the LED display fabrication tool 700 has a third washing/drying chamber 716 substantially similar to the first washing/drying chamber 412 described earlier, but with a sixth robot 740f. The third washing/drying chamber 614 is coupled to a sixth load/unload lock chamber 708f. The sixth robot 740f loads, unloads, and handles the display 10 into and out of the third washing/drying chamber 716 through the sixth load/unload lock chamber 708f.

The first dispensing chamber 702 can include the first inspection sensor 438a to monitor one or more conditions of the workpiece, substantially similar to the first inspection sensor 438a previously discussed. The first inspection sensor 438a transmits a signal representing the condition of the first workpiece to the controller 726. The first inspection sensor 438a can include multiple sensors. For example, the first inspection sensor 438a can include a high speed high resolution optical imager (for substrate alignment, materials deposition defect detection and correction) or a luminescent imager (for control UV curing, materials processing, defect detection, device performance mapping, or look up table mapping). Likewise, the second dispensing chamber 704 can include a second inspection sensor 438b and the third dispensing chamber 706 can include a third inspection sensor 438c substantially similar to the first sensor 438a previously described.

The first dispensing chamber 702 can include the first environmental sensor 438a to monitor one or more environmental conditions inside the first dispensing chamber 702, substantially similar to the first environmental sensors discussed earlier. The first environmental sensor 438a transmits a signal representing the first dispensing chamber 702 condition to the controller 726. For example, one or more sensors can monitor temperature, relative humidity, gas composition, etc., and provide this data to a control algorithm that can control the components in the process chamber. This can provide improved process stability control.

Likewise, the second dispensing chamber 704 can include a second environmental sensor 438b. The third dispensing chamber 706 can include a third environmental sensor 438c substantially similar to the first environmental sensor 438a previously described. Also, the first washing/drying chamber 712 can include a fourth environmental sensor 436d to monitor a first washing/drying chamber 712 condition, substantially similar to the sensors described earlier. Also, the second washing/drying chamber 714 can include a fifth environmental sensor 436e to monitor a second washing/drying chamber 714 condition, substantially similar to the sensors described earlier. The third washing/drying chamber 416 can include a sixth environmental sensor 43f to monitor a third washing/drying chamber 416 condition, substantially similar to the sensors described earlier.

The LED display fabrication tool 700 has a workpiece (display 10) transport system configured to pass the workpiece sequentially through the various chambers. The workpiece transport system can be provided by, for example, the first robot 740a located in the first dispensing chamber 402. A similar robot can be in each chamber. For example, the first washing/drying chamber 412 can have the second robot 740b, the second dispensing chamber 404 can have the third robot 740c, the second washing/drying chamber can have the fourth robot 740d, the third dispensing chamber 406 can have the fifth robot 740e, and the third washing/drying chamber 406 can have the sixth robot 740f.

The display 10 is placed in a first load/unload lock chamber 708a as shown by arrow 720a, e.g., by an operator or the robot 740a. The first load/unload lock chamber 708a is coupled to the first dispensing chamber 702 by a valve previously described.

The workpiece is moved from the first load/unload lock chamber 708a into the first dispensing chamber 702 by the first robot 740a on the first dispensing support 428a in the direction of arrow 720a. For example, the robot 740a can reach through the open slit valve to retrieve the workpiece from the first load/unload lock chamber 708a. The first dispensing chamber performs the work processes contained within on the workpiece. The workpiece is moved from the first dispensing chamber 702 to a first isolation component 718a. If needed, the workpiece is moved from the first dispensing chamber 702 to the first load/unload lock chamber 708a by the first robot 740a in the direction of arrow 720b.

The first isolation component 718a links the first dispensing chamber 702 to the first curing chamber 754a. The first robot 740a or the seventh robot 740g moves the display 10 from the first dispensing chamber 702 through the first isolation component 718a to the first curing chamber 754a. The first isolation component 718a is substantially similar to the isolation components described earlier. The seventh robot 740g moves the workpiece from the first isolation component 718a into the seventh load/unload lock chamber 708g.

The seventh robot 740g moves the workpiece from the seventh load/unload lock chamber 708g into the first curing chamber 754a. The first curing chamber 754a cures the workpiece. If needed, the workpiece is moved from the first curing chamber 754a to the seventh load/unload lock chamber 708g by the seventh robot 740g in the direction of arrow 558b. The workpiece can be placed into the first curing chamber 754a through the seventh load/unload lock chamber 708g in the direction of arrow 758a. The seventh robot 740g moves the workpiece out of the first curing chamber 754a to a sixth isolation component 718f in the direction of arrow 722.

The sixth isolation component 718f links the first curing chamber 754a to the first washing/drying chamber 712. The seventh robot 740g or the second robot 740b moves the display 10 from the first curing chamber 754a through the first isolation component 718f to the first washing/drying chamber 712. The sixth isolation component 718f is substantially similar to the isolation components described earlier. The display 10 is moved to the next sequential chamber in the direction of arrow 722.

The second robot 740b moves the workpiece from the sixth isolation component 718f into the first washing/drying chamber 712. The first washing/drying chamber 712 rinses and dries the workpiece. If needed, the workpiece is moved from the first washing/drying chamber 712 to the fourth load/unload lock chamber 708d by the second robot 740b in the direction of arrow 744b. The workpiece can be placed into the first washing/drying chamber 712 through the fourth load/unload lock chamber 708d in the direction of arrow 744a. The second robot 740b moves the workpiece out of the first washing/drying chamber 712 to a second isolation component 718b.

The second isolation component 718b links the first washing/drying chamber 712 to the second dispensing chamber 704. The display 10 can be moved from the second isolation component 718b by the second robot 740b or the third robot 740c into the second dispensing chamber 704. The display 10 is moved, as shown by arrow 746a, into the second dispensing chamber 704 by the third robot 740c. Then, the workpiece is moved within the second dispensing chamber 704 by the third robot 740c. The second dispensing chamber 704 performs the work process contained within on the display 10. If needed, the workpiece is moved from the second dispensing chamber 704 to the second load/unload lock chamber 708b by the third robot 740c in the direction of arrow 546b. The workpiece can be placed into the second dispensing chamber 704 through the second load/unload lock chamber 708b in the direction of arrow 546a. The workpiece is moved from the second dispensing chamber 704 to a third isolation component 718c third robot 740c. The third robot 740c moves the workpiece through the third isolation component 718c.

The third isolation component 718c links the second dispensing chamber 704 to the second curing chamber 754b. The third robot 740c or the eighth robot 740h moves the display 10 from the second dispensing chamber 704 through the third isolation component 718c to the second curing chamber 754b and into the second curing chamber 754b. The second curing chamber 754b cures the workpiece. If needed, the workpiece is moved from the second curing chamber 754b to the eighth load/unload lock chamber 708h by the eighth robot 740h in the direction of arrow 760b. The workpiece can be placed into the second curing chamber 754b through the eighth load/unload lock chamber 708h in the direction of arrow 760a. The eighth robot 740h moves the workpiece out of the second curing chamber 754b through a seventh isolation component 718g.

The seventh isolation component 718g links the second curing chamber 754h to the second washing/drying chamber 714. The display 10 is moved into the second washing/drying chamber 714 by the fourth robot 740d. The second washing/drying chamber 714 washes the display 10. If needed, the workpiece is moved from the second washing/drying chamber 714 to the fifth load/unload lock chamber 708e by the fourth robot 740d in the direction of arrow 550b. The workpiece can be placed into the second washing/drying chamber 714 through the fifth load/unload lock chamber 708e in the direction of arrow 550a. The workpiece is moved from the second washing/drying chamber 714 to a fourth isolation component 718d by the fourth robot 740d.

The fourth isolation component 718d links the second washing/drying chamber 714 to the third dispensing chamber 706. The display 10 can be moved from the fourth isolation component 718d by fourth robot 740d or fifth robot 740e into third dispensing chamber 706. The display 10 is moved, as shown by arrow 750a, into the third dispensing chamber 706 by the fifth robot 740e. Then the workpiece is moved within the third dispensing chamber 706 by fifth robot 740e. The third dispensing chamber 706 performs the work process on the display 10. If needed, the workpiece is moved from the third dispensing chamber 706 to the third load/unload lock chamber 708c by the fifth robot 540e in the direction of arrow 750b. The workpiece can be placed into the third dispensing chamber 706 through the third load/unload lock chamber 708c in the direction of arrow 750a. The workpiece is moved from the third dispensing chamber 706 to a fifth isolation component 718e by the fifth robot 740e.

The fifth isolation component 718e links the third dispensing chamber 706 to the third curing chamber 754c. The ninth robot 740i moves the display 10 from the third dispensing chamber 706 through the fifth isolation component 718e to the third curing chamber 754c and into the third curing chamber 754c. The third curing chamber 754c cures the workpiece. If needed, the workpiece is moved from the third curing chamber 754c to the ninth load/unload lock chamber 708i by the ninth robot 740i in the direction of arrow 762b. The workpiece can be placed into the third curing chamber 754c through the ninth load/unload lock chamber 708i in the direction of arrow 765a. The ninth robot 740i moves the workpiece out of the third curing chamber 754c to an eighth isolation component 718h.

The eighth isolation component 718h links the third curing chamber 754c to the third washing/drying chamber 716. The display 10 is moved into the third washing/drying chamber 716 by the sixth robot 740f. The third washing/drying chamber 716 washes the display 10. If needed, the workpiece can be placed into the third washing/drying chamber 716 through the sixth load/unload lock chamber 708f in the direction of arrow 754a. The workpiece is moved from the third washing/drying chamber 716 to the sixth load/unload lock chamber 708f by the sixth robot 740f. The sixth robot 740f moves the workpiece out of the third washing/drying chamber 716 through the sixth load/unload lock chamber 708f with the robot 740f or by an operator in the direction of arrow 752a.

A controller 726 is operatively coupled to each of the chambers and components previously described to cause the workpiece transport system to move the display 10 sequentially through the first dispensing chamber 702, the first washing/drying chamber 712, the second dispensing chamber 704, the second washing/drying chamber 714, the third dispensing chamber 706, and the third washing/drying chamber 716. Additional chambers and/or sub-clusters can be included to handle additional materials processing, and repair requirements.

Figure 8:
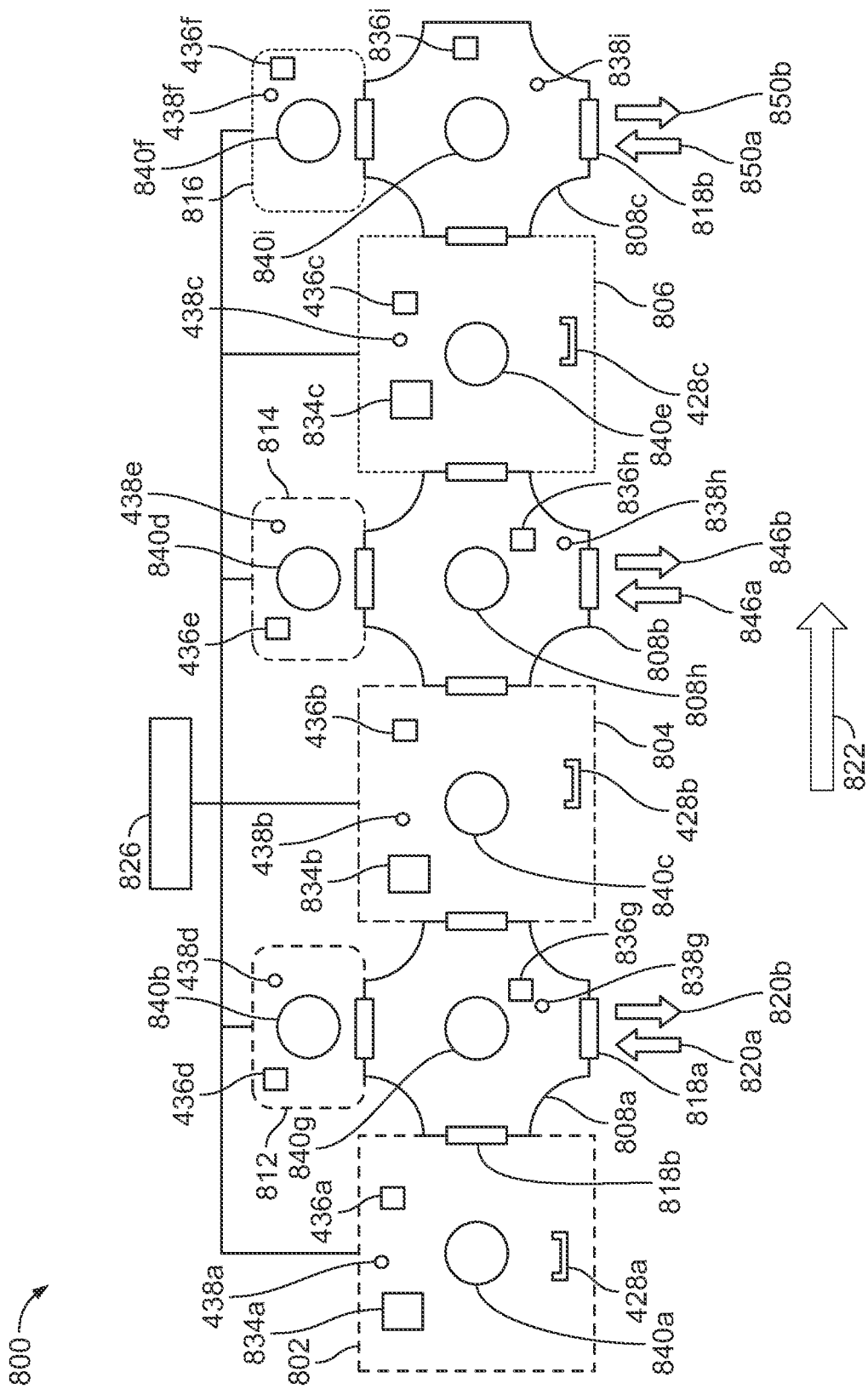
FIG. 8 is a schematic top view of another LED display fabrication tool.

As shown in FIG. 8, the LED display fabrication tool 800 processes micro-LED displays 10 with processing chambers arranged in a sequence of clusters. Each dispensing chamber is clustered with its respective washing/drying chamber and the subsequent dispensing chamber by a loading/unloading chamber. The LED display fabrication tool 800 can include a controller 826 to control operation of the various components, e.g., processing chambers and workpiece transport system.

The LED display fabrication tool 800 includes a first dispensing chamber 802 substantially similar to the dispensing chambers discussed earlier. The first dispensing chamber 402 is independently sealable from the other chambers described later. The first dispensing chamber 802 also includes a first curing station 834a to cure the display 10 to form a first color conversion layer over a first set of LEDs on the display 10 as described earlier and shown in FIGS. 3B-C. The first curing station 834a is substantially similar to the curing stations described earlier. The first dispensing chamber 802 includes a first robot 840a to move the workpiece within the first dispensing chamber 802.

The LED display fabrication tool 800 includes a second dispensing chamber 804 substantially similar to the dispensing chambers discussed earlier. The second dispensing chamber 804 is independently sealable from the other chambers described later. The second dispensing chamber 804 also includes a second curing station 834b to cure the display 10 to form a second color conversion layer over a first set of LEDs on the display 10 as described earlier and shown in FIGS. 3B-C. In some instances, the second dispensing support 828b can enter and exit the second curing station 834b to move the display 10. The second curing station 834b is substantially similar to the curing stations described earlier. The second dispensing chamber 804 includes a second robot 840c to move the workpiece within the second dispensing chamber 804.

The LED display fabrication tool 800 includes a third dispensing chamber 806 substantially similar to the dispensing chambers discussed earlier. The third dispensing chamber 806 is independently sealable from the other chambers described later. The third dispensing chamber 806 also includes a third curing station 834c to cure the display 10 to form a third color conversion layer over a first set of LEDs on the display 10 as described earlier and shown in FIGS. 3B-C. The third curing station 834c is substantially similar to the curing stations described earlier. The third dispensing chamber 806 includes a fifth robot 840e to move the workpiece within the third dispensing chamber 804.

The LED display fabrication tool 800 has a first washing/drying chamber 812. The first washing/drying chamber includes a second robot 840b to move the workpiece into, out of, and within the first washing/drying chamber 812. The first washing/drying chamber is substantially similar to the washing/drying chambers described earlier. The first washing/drying chamber 812 is independently sealable from the other chambers described herein. The LED display fabrication tool 800 also has a second washing/drying chamber 814 including a fourth robot 840d to move the workpiece into, out of, and within the second washing/drying chamber 814. The second washing/drying chamber is substantially similar to the washing/drying chambers described earlier. The second washing/drying chamber 814 is independently sealable from the other chambers described herein.

Similarly, the LED display fabrication tool 800 has a third washing/drying chamber 816 including a sixth robot 840f to move the workpiece into, out of, and within the third washing/drying chamber 816. The third washing/drying chamber is substantially similar to the washing/drying chambers described earlier. The third washing/drying chamber 816 is independently sealable from the other chambers described herein.

The first dispensing chamber 802 can include a first inspection sensor 438a to monitor one or more conditions of the workpiece, substantially similar to the first inspection sensor 438a previously discussed. The first inspection sensor 438a transmits a signal representing the condition of the first workpiece to the controller 826. The first inspection sensor 438a can include multiple sensors. For example, the first inspection sensor 438a can include a high speed high resolution optical imager (for substrate alignment, materials deposition defect detection and correction) or a luminescent imager (for control UV curing, materials processing, defect detection, device performance mapping, or look up table mapping). Likewise, the second dispensing chamber 804 can include a second inspection sensor 438b and the third dispensing chamber 806 can include a third inspection sensor 438c substantially similar to the first sensor 438a previously described.

The first dispensing chamber 802 can include a first environmental sensor 436a to monitor one or more environmental conditions inside the first dispensing chamber 802. The first environmental sensor 436a transmits a signal representing the first dispensing chamber 802 condition to the controller 826. For example, one or more sensors can monitor temperature, relative humidity, gas composition, etc., and provide this data to a control algorithm that can control the components in the process chamber. This can provide improved process stability control.

Likewise, the second dispensing chamber 804 can include a second environmental sensor 436b. The third dispensing chamber 806 can include a third environmental sensor 436c substantially similar to the first environmental sensor 436a previously described. Also, the first washing/drying chamber 812 can include a fourth environmental sensor 436d to monitor a first washing/drying chamber 812 condition, substantially similar to the sensors described earlier. The second washing/drying chamber 814 can include a fifth environmental sensor 436e to monitor a second washing/drying chamber 814 condition, substantially similar to the sensors described earlier. The third washing/drying chamber 816 can include a sixth environmental sensor 436f to monitor a third washing/drying chamber 816 condition, substantially similar to the sensors described earlier.

A first load/unload lock chamber 808a is externally coupled and situated in between the first dispensing chamber 802, the first washing/drying chamber 812, and the second dispensing chamber 804. A seventh robot 840g loads and handles the display 10 into the first load lock chamber 808a, and then in between the first dispensing chamber 802, the first washing/drying chamber 812, and the second dispensing chamber 804. If needed, the workpiece is moved from the first load/unload lock chamber 808a by the seventh robot 840g in the direction of arrow 820b. The workpiece can be placed into the first load/unload lock chamber 808a in the direction of arrow 820a.

A second load/unload lock chamber 808b is externally coupled and situated in between the second dispensing chamber 804, the second washing/drying chamber 814, and the third dispensing chamber 806. An eighth robot 840h loads and handles the display 10 into the second load lock chamber 808b, and then in between the second dispensing chamber 804, the second washing/drying chamber 814, and the third dispensing chamber 806. If needed, the workpiece is moved from the second load/unload lock chamber 808b by the eighth robot 840h in the direction of arrow 846b. The workpiece can be placed into the second load/unload lock chamber 808b in the direction of arrow 846a.

A third load/unload lock chamber 808c is externally coupled and situated in between the third dispensing chamber 806 and the third washing/drying chamber 816. A ninth robot 840i loads and handles the display 10 into the third load lock chamber 808c and then into third dispensing chamber 806 and the third washing/drying chamber 816. If needed, the workpiece is moved from the third load/unload lock chamber 808c by the ninth robot 840i in the direction of arrow 850b. The workpiece can be placed into the third load/unload lock chamber 808b in the direction of arrow 850a.

The first load/unload lock chamber 808a can include a seventh inspection sensor 838g to monitor one or more conditions of the workpiece, substantially similar to the first inspection sensor 438a previously discussed. The seventh inspection sensor 838g transmits a signal representing the condition of the first workpiece to the controller 826. The seventh inspection sensor 838g can include multiple sensors. For example, the seventh inspection sensor 838g can include a high speed high resolution optical imager (for substrate alignment, materials deposition defect detection and correction) or a luminescent imager (for control UV curing, materials processing, defect detection, device performance mapping, or look up table mapping). Likewise, the second load/unload lock chamber 808b can include an eighth inspection sensor 838h and the third load/unload lock chamber 808c can include a ninth inspection sensor 838i substantially similar to the first inspection sensor 438a previously described.

The first load/unload lock chamber 808a can include a seventh environmental sensor 836g to monitor one or more environmental conditions inside the first load/unload lock chamber 808a. The seventh environmental sensor 838g transmits a signal representing the first load/unload lock chamber 808a condition to the controller 826. For example, one or more sensors can monitor temperature, relative humidity, gas composition, etc., and provide this data to a control algorithm that can control the components in the process chamber. This can provide improved process stability control.

The LED display fabrication tool 800 has a workpiece (display 10) transport system configured to pass the workpiece sequentially through the various chambers. The workpiece transport system can be provided by, for example, the first robot 840a located in the first dispensing chamber 802, and the similar robots in the subsequent chambers. The display 10 is placed in the first load/unload lock chamber 808a as shown by arrow 820a, e.g., by an operator or the robot 840g. The first load/unload lock chamber 808a can be coupled to the first dispensing chamber 802, the first washing/drying chamber 812, and the second dispensing chamber 804 by a valve 818a, e.g., a slit valve, through which the workpiece can pass.

The workpiece is moved from the first load/unload lock chamber 808a into the first dispensing chamber 802 by the first robot 840a or the seventh robot 840g. For example, the first robot 840a can reach through the open slit valve 818b to retrieve the workpiece from the first load/unload lock chamber 808a. Alternatively, the seventh robot 840g can reach through the open slit valve 818b to place the workpiece in the first dispensing chamber 802. The first dispensing chamber performs various work processes on the workpiece. Then, either the first robot 840a or the seventh robot 840g transfers the workpiece back into the first load/unload lock chamber 808a. The seventh robot 840g transfers the workpiece to the first washing/drying chamber 812 which is coupled to the first load/unload lock chamber 808a. The first washing/drying chamber 812 washes and dries the workpiece. At any chamber, the respective robot can position the workpiece within the detection range of respective sensor to sense a condition of the workpiece. The first washing/drying chamber 812 second robot 840b transfers the workpiece back to the first load/unload lock chamber 808a. The seventh robot 840g can then either transfer the workpiece to the second dispensing chamber 804 or out of the first load/unload lock chamber 808a. This operation described can be referred to as a cluster operation. In this case, it is a series of clustered operations in the first dispensing chamber 802, the first washing/drying chamber 812, and the second dispensing chamber 804, all coupled by the first load/unload lock chamber 808a. This can also be referred to as a first cluster.

The seventh robot 840g or the third robot 840c moves the display 10 from the first load/unload lock chamber 808a to the second dispensing chamber 804. The display 10 is moved to the next sequential chamber in the direction of arrow 822. The third robot 840c or the eighth robot 840h moves the workpiece from the second dispensing chamber 804a into the second load/unload lock chamber 808b in the direction of arrow 822.

The workpiece is moved from the second load/unload lock chamber 808b into the second dispensing chamber 804 by the third robot 840c or the eighth robot 840h. For example, the third robot 840c can reach through the open slit valve to retrieve the workpiece from the second load/unload lock chamber 808b. Alternatively, the eighth robot 840h can reach through the open slit valve to place the workpiece in the second dispensing chamber 804. The second dispensing chamber performs various work processes on the workpiece. Then, either the third robot 840c or the eighth robot 840h transfers the workpiece back into the second load/unload lock chamber 808b. The eighth robot 840h transfers the workpiece to the second washing/drying chamber 814 which is coupled to the second load/unload lock chamber 808b. The second washing/drying chamber 814 washes the workpiece. At any chamber, the respective robot can position the workpiece within the detection range of the respective sensor to sense a condition of the workpiece. The second washing/drying chamber 814 fourth robot 840d transfers the workpiece back to the second load/unload lock chamber 808b. The eighth robot 840h can then either transfer the workpiece to the third dispensing chamber 806 or out of the second load/unload lock chamber 808b in the direction of arrow 846b. This operation described can be referred to as a second cluster as previously described. In this case, it is a series of clustered operations in the second dispensing chamber 804, the second washing/drying chamber 814, and the third dispensing chamber 806, all coupled by the second load/unload lock chamber 808*b*.

The third dispensing chamber 806 links to the third load/unload lock chamber 808*c*. The ninth robot 840*i* moves the display 10 from the third dispensing chamber 806 to the third load/unload lock chamber 808*c*. The display 10 is moved into the third load/unload lock chamber 808*c* by the ninth robot 840*i* in the direction arrow 822. The display 10 is moved within the second load/unload lock chamber 808*b* by the ninth robot 840*i*.

The workpiece is moved from the third load/unload lock chamber 808*c* into the third dispensing chamber 806, for example, the fifth robot 840*e* can reach through the open slit valve to retrieve the workpiece from the third load/unload lock chamber 808*c*. Alternatively, the fifth robot 840*i* can reach through the open slit valve to place the workpiece in the third dispensing chamber 806. The third dispensing chamber 806 performs various work processes on the workpiece. Then, either the fifth robot 840*e* or the ninth robot 840*i* transfers the workpiece back into the third load/unload lock chamber 808*c*. The ninth robot 840*i* transfers the workpiece to the third washing/drying chamber 816 which is coupled to the third load/unload lock chamber 808*c*. The third washing/drying chamber 816 washes the workpiece. At any chamber, the respective robot can position the workpiece within the detection range of the respective sensor to sense a condition of the workpiece. The third washing/drying chamber 816 sixth robot 840*f* transfers the workpiece back to the third load/unload lock chamber 808*c*. The ninth robot 840*i* can then transfer the workpiece out of the third load/unload lock chamber 808*c* in the direction of arrow 850*b*. This operation described can be referred to as a third cluster as previously described. In this case, it is a series of clustered operations in the third dispensing chamber 806 and the third washing/drying chamber 816, all coupled by the third load/unload lock chamber 808*c*.

A controller 826 is operatively coupled to each of the chambers and components previously described to cause the workpiece transport system to move the display 10 sequentially, sequentially in a clustered manner, through the first dispensing chamber 802, the first washing/drying chamber 812, the second dispensing chamber 804, the second washing/drying chamber 814, the third dispensing chamber 806, and the third washing/drying chamber 816, passing through a load lock chamber as necessary when in route between two processing chambers.

Figure 9:
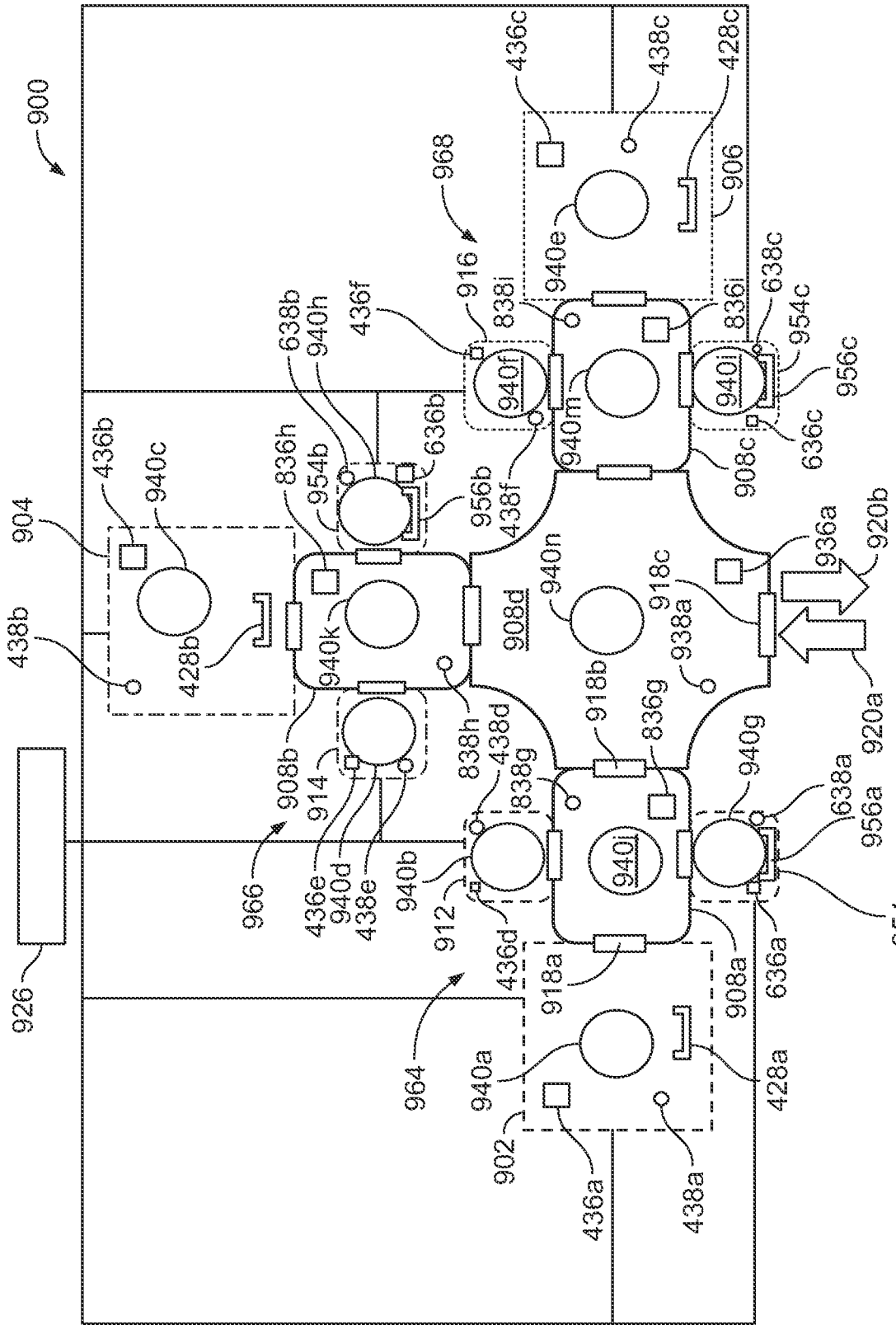
FIG. 9 is a schematic top view of another LED display fabrication tool.

As shown in FIG. 9, the LED display fabrication tool 900 processes micro-LED displays 10 to deposit the color conversion layers sequentially in a clustered manner, similar to LED display fabrication tool 800, but with multiple sub-clusters, where each sub-cluster is configured to load and unload, dispense, cure, and wash/dry a different color micro-LED. Each sub-cluster is then clustered around a single central load/unload lock chamber. For each sub-cluster, each processing chamber, e.g., dispensing chamber, first washing/drying station, and curing chamber is coupled to the load lock chamber of the sub-cluster by an isolation component 918*a*, e.g., a valve such as a slit valve, through which the workpiece can pass. Each load lock chamber of the sub-cluster is coupled to the central load lock chamber 908*d* of the tool by an isolation component 918*b*, e.g., a valve such as a slit valve, through which the workpiece can pass. The workpiece can be loaded into and unloaded from the central load lock chamber 908*d* from or to the outside environment, e.g., the clean room, by an isolation component 918*c*, e.g., a valve such as a slit valve. The LED display fabrication tool 900 can include a controller 926 to control operation of the various components, e.g., processing chambers and workpiece transport system.

A first sub-cluster 964 includes a first dispensing chamber 902, a first washing station 912, a first curing station 954*a*, and a first load/unload lock chamber 908*a*. The first sub-cluster 964 of the LED display fabrication tool 900 includes a first dispensing chamber 904 with a first robot 940*a* that is substantially similar to the first dispensing chambers discussed earlier. The first dispensing chamber 902 is coupled to a first load/unload lock chamber 908*a*. The first load/unload lock chamber 908*a* has a tenth robot 940*j* to load, unload, and handle the display 10 into and out of the first dispensing chamber 902.

The first dispensing chamber 902 can include a first inspection sensor 438*a* to monitor one or more conditions of the workpiece, substantially similar to the first inspection sensor 438*a* previously discussed. The first inspection sensor 438*a* transmits a signal representing the condition of the first workpiece to the controller 926. The first inspection sensor 438*a* can include multiple sensors. For example, the first inspection sensor 438*a* can include a high speed high resolution optical imager (for substrate alignment, materials deposition defect detection and correction) or a luminescent imager (for control UV curing, materials processing, defect detection, device performance mapping, or look up table mapping).

The first dispensing chamber 902 can include a first environmental sensor 436*a* to monitor one or more environmental conditions inside the first dispensing chamber 902. The first environmental sensor 436*a* transmits a signal representing the first dispensing chamber 902 condition to the controller 926. For example, one or more sensors can monitor temperature, relative humidity, gas composition, etc., and provide this data to a control algorithm that can control the components in the process chamber. This can provide improved process stability control.

The first sub-cluster 964 of the LED display fabrication tool 900 also includes a first curing chamber 954*a* and a robot 940*g* substantially similar to the first curing stations described earlier. The first curing chamber 954*a* is coupled to the first load/unload lock chamber 908*a*. The first curing chamber 954*a* has a first environmental sensor 636*a* substantially similar to the environmental sensor 436*a* discussed earlier. The first curing chamber 654*a* also has a first inspection sensor 638*a* substantially similar to the inspection sensor 438*a* discussed earlier.

The first sub-cluster 964 also has a first washing/drying chamber 912 substantially similar to the washing/drying chambers described earlier. The first washing/drying chamber 912 is coupled to first load/unload lock chamber 908*a*. The tenth robot 940*j* loads, unloads, and handles the display 10 into and out of the first washing/drying chamber 912 from the first load/unload lock chamber 908*a*. The tenth robot 940*j* loads, unloads, and handles the display 10 into and out of the first dispensing chamber 902, the first curing chamber 912, and the first washing/drying chamber 912 from the first load/unload lock chamber 908*a*. Also, the first washing/drying chamber 912 can include a fourth environmental sensor 436*d* to monitor a first washing/drying chamber 912 condition, substantially similar to the sensors described earlier. The first washing/drying chamber 912 can include a fourth inspection sensor 438*d* to monitor one or more conditions of the workpiece, substantially similar to the first inspection sensor 436*a* described earlier.

The first load/unload lock chamber 908a can include a seventh inspection sensor 838g to monitor one or more conditions of the workpiece, substantially similar to the first inspection sensor 438a previously discussed. The seventh inspection sensor 838g transmits a signal representing the condition of the first workpiece to the controller 926. The seventh inspection sensor 838g can include multiple sensors. For example, the seventh inspection sensor 838g can include a high speed high resolution optical imager (for substrate alignment, materials deposition defect detection and correction) or a luminescent imager (for control UV curing, materials processing, defect detection, device performance mapping, or look up table mapping).

The first load/unload lock chamber 808a can include a seventh environmental sensor 836g to monitor one or more environmental conditions inside the first load/unload lock chamber 808a. The seventh environmental sensor 838g transmits a signal representing the first load/unload lock chamber 808a condition to the controller 826. For example, one or more sensors can monitor temperature, relative humidity, gas composition, etc., and provide this data to a control algorithm that can control the components in the process chamber. This can provide improved process stability control.

A second sub-cluster 966 includes a second dispensing chamber 904, a second washing station 914, a second curing station 954b, and a second load/unload lock chamber 908b.

The second sub-cluster 966 of the LED display fabrication tool 900 includes a second dispensing chamber 904 with a third robot 940c substantially similar to the dispensing chambers discussed earlier. The second dispensing chamber 902 is coupled to a second load/unload lock chamber 908b. The third robot 940c loads, unloads, and handles the display 10 into and out of the second dispensing chamber 904 from the second load/unload lock chamber 908b.

The second dispensing chamber 904 can include a second inspection sensor 438b substantially similar to the first sensor 438a previously described. Likewise, the second dispensing chamber 904 can include a second environmental sensor 436b substantially similar to the first sensor 436a previously described.

The LED display fabrication tool 900 second sub-cluster 966 also includes a second curing chamber 954b and a robot 940h substantially similar to the curing stations described earlier. The second curing chamber 954b is coupled to the second load/unload lock chamber 908b. The second curing chamber 954b has a second environmental sensor 636b substantially similar to the environmental sensor 436a discussed earlier. The second curing chamber 654b also has a second inspection sensor 638b substantially similar to the inspection sensor 438a discussed earlier.

The LED display fabrication tool 900 second sub-cluster 966 also has a second washing/drying chamber 914 with a fourth robot 940d substantially similar to the washing/drying chambers described earlier. The fourth robot 940d loads, unloads, and handles the display 10 into and out of the second washing/drying chamber 914 from the second load/unload lock chamber 908b. The second washing/drying chamber 914 is coupled to the second load/unload lock chamber 908b. The second washing/drying chamber 914 can include a fifth environmental sensor 436e to monitor a second washing/drying chamber 914 condition, substantially similar to the sensors described earlier. The second washing/drying chamber 914 can include a fifth inspection sensor 438e to monitor one or more conditions of the workpiece, substantially similar to the first inspection sensor 436a described earlier.

An eleventh robot 940k loads, unloads, and handles the display 10 into and out of the second dispensing chamber 904, the second curing chamber 954b, and the second washing/drying chamber 914 from the second load/unload lock chamber 908b. The second load/unload lock chamber 908b can include an eighth inspection sensor 838h substantially similar to the first inspection sensor 438a previously described. The second load/unload lock chamber 908b can include an eighth environmental sensor 436h to monitor a second load/unload lock chamber 908b condition, substantially similar to the environmental sensors described earlier.

A third sub-cluster 968 includes a third dispensing chamber 906, a third washing station 916, a third curing station 954c, and a third load/unload lock chamber 908c. The third dispensing chamber 906 is substantially similar to the dispensing chambers discussed earlier. The third dispensing chamber 906 includes a fifth robot 940e to control the position of the display 10. The third dispensing chamber 906 can include a third inspection sensor 438c substantially similar to the first sensor 438a previously described. The third dispensing chamber 906 can include a third environmental sensor 436c substantially similar to the first environmental sensor 436a previously described. The third dispensing chamber 906 is coupled to a third load/unload lock chamber 908c. The fifth robot 940e loads, unloads, and handles the display 10 into and out of the third dispensing chamber 906 from the third load/unload lock chamber 908c.

The third curing chamber 954c includes a robot 940i substantially similar to the curing stations described earlier. The third curing chamber 954c is coupled to the third load/unload lock chamber 908c. The third curing chamber 954c can also have a third environmental sensor 636c substantially similar to the environmental sensor 436a discussed earlier. The third curing chamber 654c can also have a third inspection sensor 638c substantially similar to the inspection sensor 438a discussed earlier.

The third washing/drying chamber 916 is substantially similar to the washing/drying chambers described earlier. The third washing/drying chamber 916 can include a sixth environmental sensor 436f to monitor a third washing/drying chamber 916 condition, substantially similar to the environmental sensors described earlier. The third washing/drying chamber 916 also has a sixth inspection sensor 638f substantially similar to the inspection sensor 438a discussed earlier.

The third washing/drying chamber 916 is coupled to the third load/unload lock chamber 908c. A sixth robot 940f loads, unloads, and handles the display 10 into and out of the third washing/drying chamber 916 from the third load/unload lock chamber 908c. The robot 940m loads, unloads, and handles the workpiece within the third sub-cluster 968. The third load/unload lock chamber 908c can include a ninth inspection sensor 838i substantially similar to the first inspection sensor 438a previously described. The third load/unload lock chamber 908c can include a ninth environmental sensor 436i to monitor a third load/unload lock chamber 908c condition, substantially similar to the environmental sensors described earlier.

The LED display fabrication tool 900 includes a fourth load/unload lock chamber 908d. The fourth load/unload lock chamber 908d has a fourteenth robot 940n which loads, unloads, and handles the display 10 into and out of the first load/unload lock chamber 908a, second load/unload lock chamber 908b, and the third load/unload lock chamber 908c. The display 10 is placed into the fourth load lock chamber 908d as shown by arrow 920a, e.g., by an operator or the robot 940*n*. The display 10 is removed from the fourth load lock chamber 908*d* as shown by arrow 9420*b*, e.g., by an operator or the robot 940*n*.

The fourth load/unload lock chamber 908*d* can include a first inspection sensor 938*a* substantially similar to the first inspection sensor 438*a* previously described. The fourth load/unload lock chamber 908*d* can include a first environmental sensor 936*a* to monitor a fourth load/unload lock chamber 908*d* condition, substantially similar to the environmental sensors described earlier.

A controller 926 is operatively coupled to each of the chambers and components previously described to cause the workpiece transport system to move the display 10 in sequence through the first dispensing chamber 902, the first washing/drying chamber 912, the second dispensing chamber 904, the second washing/drying chamber 914, the third dispensing chamber 906, and the third washing/drying chamber 916, passing through one or more load lock chambers as necessary.

In some implementations of the cluster configuration, the display 10 can be processed at the different chambers (non-sequential processing) based on process scheduling. For example, display 10 can be processed first in second sub-cluster 966, second in the third sub-cluster 968, and third in first sub-cluster 964. Additional chambers and/or sub-clusters can be included to handle additional materials processing, and repair requirements.

Figure 10:
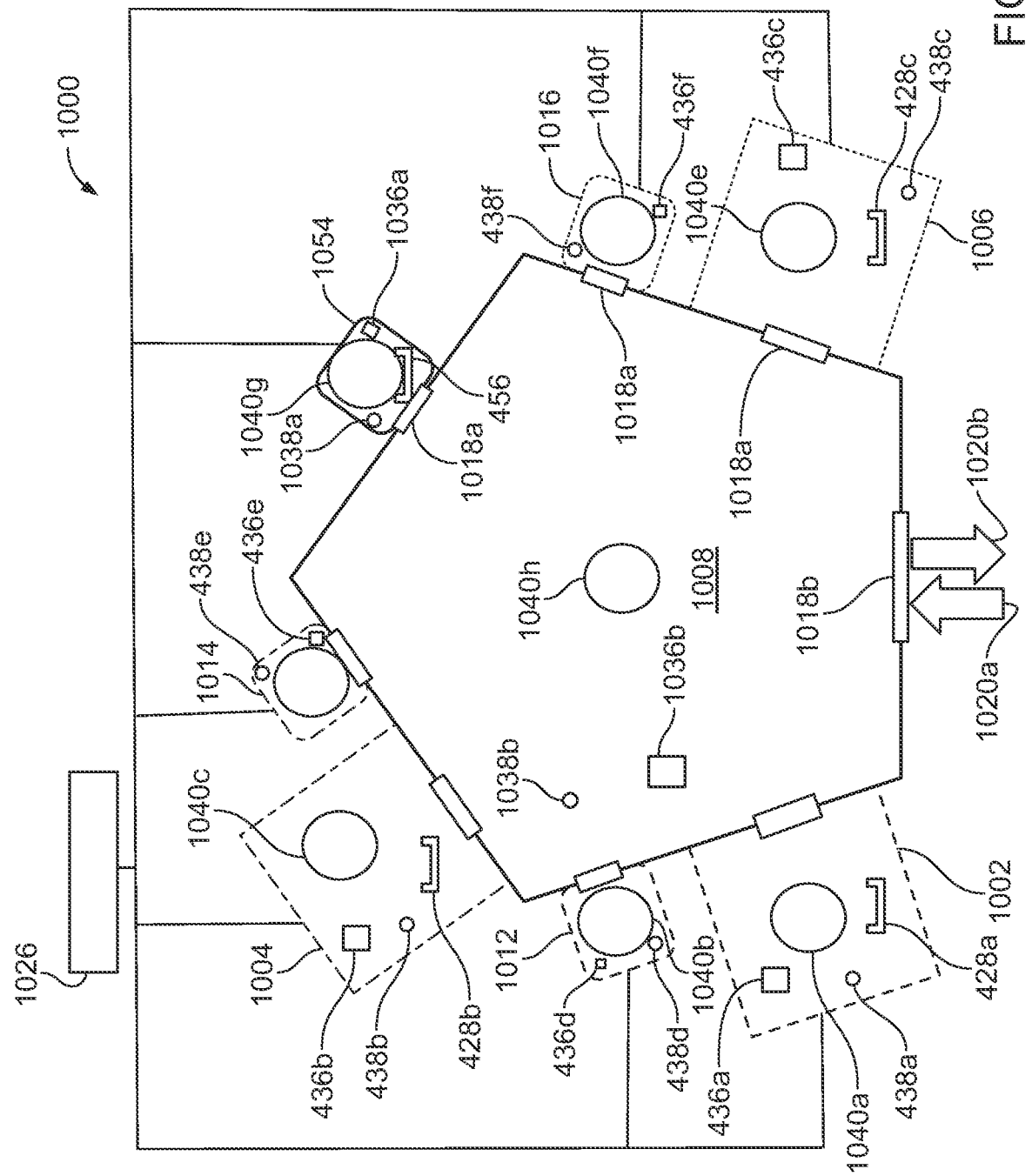
FIG. 10 is a schematic top view of another LED display fabrication tool.

As shown in FIG. 10, the LED display fabrication tool 1000 is arranged with chambers in a cluster configuration, and is configured to process micro-LED displays 10 to deposit the color conversion layers sequentially or non-sequentially. The LED display fabrication tool 1000 is similar to LED display fabrication tool 900, but has a single central load/unload lock chamber 1008 rather than multiple sub-clusters, and has a universal curing station 1054. The universal curing chamber can be used for curing after dispensing regardless of the color conversion material. The universal curing chamber can be used if there is little or no cross-contamination between colors during the curing process, or the universal curing chamber can be used as a buffer if other components are not able to keep up with production rates. An advantage of this configuration is reduced footprint and reduced cost, as compared to having a separate curing chamber for each color.

Each processing chamber, e.g., the three dispensing chambers, three washing/drying chambers, and universal curing chamber, is coupled to the central load lock chamber 1008 by an isolation component 1018*a*, e.g., a valve such as a slit valve, through which the workpiece can pass. An isolation component 1018*b* through which the workpiece can pass, e.g., a valve such as a slit valve, separates the central load lock chamber 1018 from the outside environment, e.g., the clean room. The LED display fabrication tool 1000 can include a controller 1026 to control operation of the various components, e.g., processing chambers and workpiece transport system.

The LED display fabrication tool 1000 includes a first dispensing chamber 1004 with a first robot 1040*a* substantially similar to the first dispensing chambers discussed earlier. The first dispensing chamber 1002 is coupled to a central load/unload lock chamber 1008. The first robot 1040*a* loads, unloads, and handles the display 10 into and out of the first dispensing chamber 1002 universal load/unload lock chamber 1008.

The first dispensing chamber 1002 can include a first inspection sensor 438*a* to monitor one or more conditions of the workpiece, substantially similar to the first inspection sensor 438*a* previously discussed. The first inspection sensor 438*a* transmits a signal representing the condition of the first workpiece to the controller 1026. The first inspection sensor 438*a* can include multiple sensors. For example, the first inspection sensor 438*a* can include a high speed high resolution optical imager (for substrate alignment, materials deposition defect detection and correction) or a luminescent imager (for control UV curing, materials processing, defect detection, device performance mapping, or look up table mapping).

The first dispensing chamber 1002 can include a first environmental sensor 436*a* to monitor one or more environmental conditions inside the first dispensing chamber 1002. The first environmental sensor 436*a* transmits a signal representing the first dispensing chamber 1002 condition to the controller 1026. For example, one or more sensors can monitor temperature, relative humidity, gas composition, etc., and provide this data to a control algorithm that can control the components in the process chamber. This can provide improved process stability control.

The LED display fabrication tool 1000 also has a first washing/drying chamber 1012 substantially similar to the washing/drying chambers described earlier. The first washing/drying chamber 1012 has a second robot 1040*b* to position the workpiece within the first washing/drying chamber 1012. The first washing/drying chamber 1012 is coupled to first load/unload lock chamber 1008. The second robot 1040*b* loads, unloads, and handles the display 10 into and out of the first washing/drying chamber 1012 from the universal load/unload lock chamber 1008. Also, the first washing/drying chamber 1012 can include a fourth environmental sensor 436*d* to monitor a first washing/drying chamber 1012 condition, substantially similar to the sensors described earlier. The first washing/drying chamber 1012 can include a fourth inspection sensor 438*d* to monitor one or more conditions of the workpiece, substantially similar to the first inspection sensor 436*a* described earlier.

The LED display fabrication tool 1000 includes a second dispensing chamber 1004 substantially similar to the dispensing chambers discussed earlier. The second dispensing chamber 1004 includes a robot 1040*c* to control the position of the display 10. The second dispensing chamber 1002 is coupled to the universal load/unload lock chamber 1008. The robot 1040*c* loads, unloads, and handles the display 10 into and out of the second dispensing chamber 1004 from the universal load/unload lock chamber 1008. The second dispensing chamber 1004 can include a second inspection sensor 438*b* substantially similar to the first sensor 438*a* previously described. Likewise, the second dispensing chamber 1004 can include a second environmental sensor 436*b* substantially similar to the first sensor 436*a* previously described.

The LED display fabrication tool 1000 also has a second washing/drying chamber 1014 with a fourth robot 1040*d* and is substantially similar to the washing/drying chambers described earlier. The second washing/drying chamber 1014 is coupled to the load/unload lock chamber 1008. The fourth robot 1040*d* loads, unloads, and handles the display 10 into and out of the second washing/drying chamber 1014 from the universal load/unload lock chamber 1008. The second washing/drying chamber 1014 can include a fifth environmental sensor 436*e* to monitor a second washing/drying chamber 1014 condition, substantially similar to the sensors described earlier. The second washing/drying chamber 1014 can include a fifth inspection sensor 438*e* to monitor one or more conditions of the workpiece, substantially similar to the first inspection sensor 436*a* described earlier.

The LED display fabrication tool 1000 includes a third dispensing chamber 1006 substantially similar to the dispensing chambers discussed earlier. The third dispensing chamber 1006 includes a fifth robot 1040e to control the position of the display 10. The third dispensing chamber 1006 is coupled to the load/unload lock chamber 1008. The fifth robot 1040e loads, unloads, and handles the display 10 into and out of the third dispensing chamber 1006 from the universal load/unload lock chamber 1008. The third dispensing chamber 1006 can include a third inspection sensor 438c substantially similar to the first sensor 438a previously described. The third dispensing chamber 1006 can include a third environmental sensor 436c substantially similar to the first environmental sensor 436a previously described.

The LED display fabrication tool 1000 also has a third washing/drying chamber 1016 with a sixth robot 1040f substantially similar to the washing/drying chambers described earlier. The third washing/drying chamber 1016 is coupled to the load/unload lock chamber 1008. The sixth robot 1040f loads, unloads, and handles the display 10 into and out of the third washing/drying chamber 1016 from the universal load/unload lock chamber 1008. The third washing/drying chamber 1016 can include a sixth environmental sensor 436f to monitor a third washing/drying chamber 1016 condition, substantially similar to the environmental sensors described earlier. The third washing/drying chamber 1016 also has a sixth inspection sensor 638f substantially similar to the inspection sensor 438a discussed earlier.

The LED display fabrication tool 1000 also includes a universal curing chamber 1054 with a seventh robot 1040g substantially similar to the curing stations described earlier. The universal curing chamber 1054 is coupled to the load/unload lock chamber 1008. The universal curing chamber 1054 can include a first environmental sensor 1036a to monitor a universal curing chamber 1054 condition, substantially similar to the environmental sensors described earlier. The universal curing chamber 1054 also has a first inspection sensor 1038a substantially similar to the inspection sensor 438a discussed earlier.

An eighth robot 1040h loads, unloads, and handles the display 10 into and out of the first dispensing chamber 1002, the first washing/drying chamber 1012, the second dispensing chamber 1004, the second washing station 1014, the third dispensing chamber 1006, the third washing/drying chamber 1016, and the universal curing chamber 1054 from the universal load/unload lock chamber 1008. The display 10 is placed into the universal load/unload lock chamber 1008 as shown by arrow 1020a, e.g., by an operator or the eighth robot 1040h. The display 10 is removed from the universal load/unload lock chamber 1008 as shown by arrow 1020b, e.g., by an operator or the robot 1040a. The universal load/unload lock chamber 1008 can include a second environmental sensor 1036b to monitor a universal load/unload lock chamber 1008 condition, substantially similar to the environmental sensors described earlier. The universal load/unload lock chamber 1008 also has a second inspection sensor 1038b substantially similar to the inspection sensor 438a discussed earlier.

A controller 1026 is operatively coupled to each of the chambers and components previously described to cause the workpiece transport system to move the display 10 sequentially or non-sequentially through the first dispensing chamber 1002, the universal curing chamber 1054, the first washing/drying chamber 1012, the second dispensing chamber 1004, the universal curing chamber 1054, the second washing/drying chamber 1014, the third dispensing chamber 1006, the universal curing chamber 1054, and the third washing/drying chamber 1016, passing through the central load lock chamber when in route between two processing chambers. Additional chambers and/or sub-clusters can be included to handle additional materials processing, and repair requirements.

Figure 11:
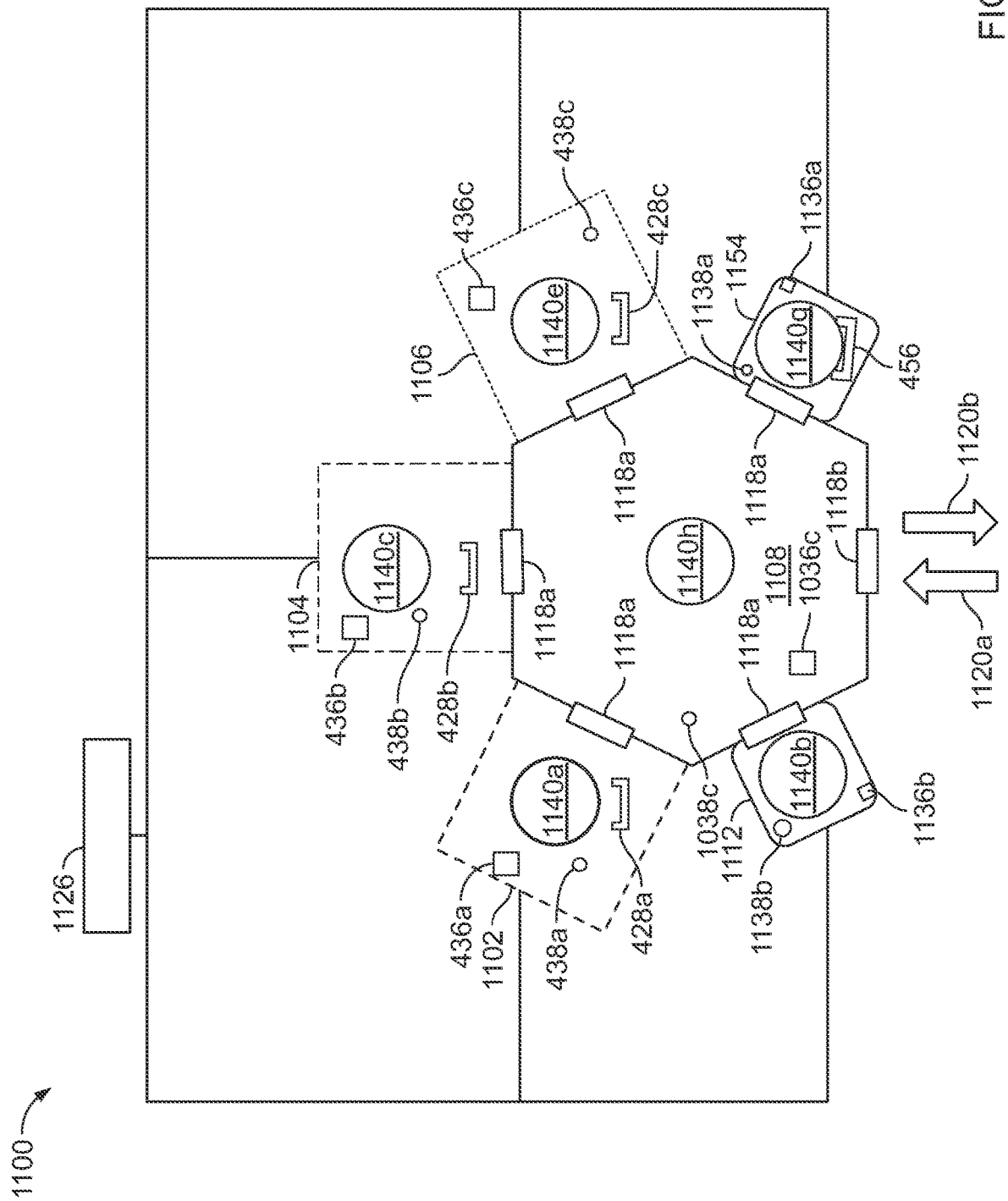
FIG. 11 is a schematic top view of another LED display fabrication tool.

As shown in FIG. 11, the LED display fabrication tool 1100 is arranged with chambers in a cluster configuration, and is configured to process micro-LED displays 10 to deposit the color conversion layers sequentially or non-sequentially, similar to LED display fabrication tool 1000. However, the LED display fabrication tool 1100 has a universal curing chamber and a universal washing/drying chamber. The universal washing/drying chamber can be used for washing and drying after curing regardless of the color conversion material. The universal curing chamber and the universal washing/drying chamber can be used if there is little or no cross-contamination between colors during the curing and washing steps, respectively. Also, the universal curing chamber or washing/drying chamber can be used as a buffer to hold a display if other components are not able to keep up with production rates. An advantage of this configuration is reduced footprint and reduced cost, as compared to having a separate washing/drying chamber for each color.

Each processing chamber, e.g., the three dispensing chambers, universal washing/drying chamber, and universal curing chamber, is coupled to the central load lock chamber 1108 by an isolation component 1118a, e.g., a valve such as a slit valve, through which the workpiece can pass. An isolation component 1118b through which the workpiece can pass, e.g., a valve such as a slit valve, separates the central load lock chamber 1118 from the outside environment, e.g., the clean room. The LED display fabrication tool 1100 can include a controller 1126 to control operation of the various components, e.g., processing chambers and workpiece transport system.

The LED display fabrication tool 1100 includes a first dispensing chamber 1102 with a first robot 1140a to control the position of the display 10 substantially similar to the first dispensing chambers discussed earlier. The first dispensing chamber 1102 is coupled to a universal load/unload lock chamber 1108. The first robot 1140a loads, unloads, and handles the display 10 into and out of the first dispensing chamber 1102.

The first dispensing chamber 1102 can include a first inspection sensor 438a to monitor one or more conditions of the workpiece, substantially similar to the first inspection sensor 438a previously discussed. The first inspection sensor 438a transmits a signal representing the condition of the first workpiece to the controller 1126. The first inspection sensor 438a can include multiple sensors. For example, the first inspection sensor 438a can include a high speed high resolution optical imager (for substrate alignment, materials deposition defect detection and correction) or a luminescent imager (for control UV curing, materials processing, defect detection, device performance mapping, or look up table mapping).

The first dispensing chamber 1102 can include a first environmental sensor 436a to monitor one or more environmental conditions inside the first dispensing chamber 1102. The first environmental sensor 436a transmits a signal representing the first dispensing chamber 1102 condition to the controller 1126. For example, one or more sensors can monitor temperature, relative humidity, gas composition, etc., and provide this data to a control algorithm that can control the components in the process chamber. This can provide improved process stability control.

The LED display fabrication tool 1100 also includes a second dispensing chamber 1104 substantially similar to the dispensing chambers discussed earlier. The second dispensing chamber 1104 includes a robot 1140*c* to control the position of the display 10. The second dispensing chamber 1102 is coupled to the load/unload lock chamber 1108. The third robot 1140*c* loads, unloads, and handles the display 10 into and out of the second dispensing chamber 1104.

The second dispensing chamber 1104 can include a second inspection sensor 438*b* substantially similar to the first sensor 438*a* previously described. Likewise, the second dispensing chamber 1104 can include a second environmental sensor 436*b* substantially similar to the first sensor 436*a* previously described.

The LED display fabrication tool 1100 also includes a third dispensing chamber 1106 substantially similar to the dispensing chambers discussed earlier. The third dispensing chamber 1106 includes a robot 1140*e* to control the position of the display 10. The third dispensing chamber 1106 is coupled to the load/unload lock chamber 1108. The fifth robot 1140*e* loads, unloads, and handles the display 10 into and out of the third dispensing chamber 1106. The third dispensing chamber 1106 can include a third inspection sensor 438*c* substantially similar to the first sensor 438*a* previously described. The third dispensing chamber 1106 can include a third environmental sensor 436*c* substantially similar to the first environmental sensor 436*a* previously described.

The LED display fabrication tool 1100 also includes a universal curing chamber 1154 with a seventh robot 1140*g* substantially similar to the curing stations described earlier. The curing chamber 1154 is coupled to the load/unload lock chamber 1108. The seventh robot 1140*g* loads, unloads, and handles the display 10 into and out of the universal curing chamber 1154. The universal curing chamber 1154 can include a first environmental sensor 1136*a* to monitor a universal curing chamber 1154 condition, substantially similar to the environmental sensors described earlier. The universal curing chamber 1154 also has a first inspection sensor 1138*a* substantially similar to the inspection sensor 438*a* discussed earlier.

The LED display fabrication tool 1100 also has a universal washing/drying chamber 1112 substantially similar to the washing/drying chambers described earlier. The universal washing/drying chamber 1112 is coupled to load/unload lock chamber 1108. The second robot 1140*b* loads, unloads, and handles the display 10 into and out of the universal washing/drying chamber 1112. Also, the universal washing/drying chamber 1112 can include a second environmental sensor 1138*b* to monitor a universal washing/drying chamber 1112 condition, substantially similar to the environmental sensors described earlier. The universal washing/drying chamber 1112 can include a second inspection sensor 1138*b* to monitor one or more conditions of the workpiece, substantially similar to the first inspection sensor 436*a* described earlier.

The display 10 is placed into the universal load/unload lock chamber 1108 as shown by arrow 1120*a*, e.g., by an operator or an eighth robot 1140*h*. The display 10 is removed from the universal load/unload lock chamber 1108 as shown by arrow 1120*b*, e.g., by an operator or the robot 1140*a*. The eighth robot 1140*h* loads, unloads, and handles the display 10 into and out of the universal washing/drying chamber 1112 load/unload lock chamber 1108 into and out of the first dispensing chamber 1102, the second dispensing chamber 1104, the third dispensing chamber 1106, the universal washing/drying chamber 1112, and the universal curing chamber 1154. Also, the universal load/unload lock chamber 1108 can include a third environmental sensor 1138*c* to monitor a universal load/unload lock chamber 1108 condition, substantially similar to the environmental sensors described earlier. The universal load/unload lock chamber 1108 can include a third inspection sensor 1138*c* to monitor one or more conditions of the workpiece, substantially similar to the first inspection sensor 436*a* described earlier.

A controller 1126 is operatively coupled to each of the chambers and components previously described to cause the workpiece transport system to move the display 10 sequentially or non-sequentially through the first dispensing chamber 1102, the universal curing chamber 1154, the universal washing/drying chamber 1112, the second dispensing chamber 1104, the universal curing chamber 1154, the universal washing/drying chamber 1112, the third dispensing chamber 1106, the universal curing chamber 1154 and the universal washing/drying chamber 1112, passing through the central load lock chamber when in route between two processing chambers. Additional chambers and/or sub-clusters can be included to handle additional materials processing, and repair requirements.

Figure 12:
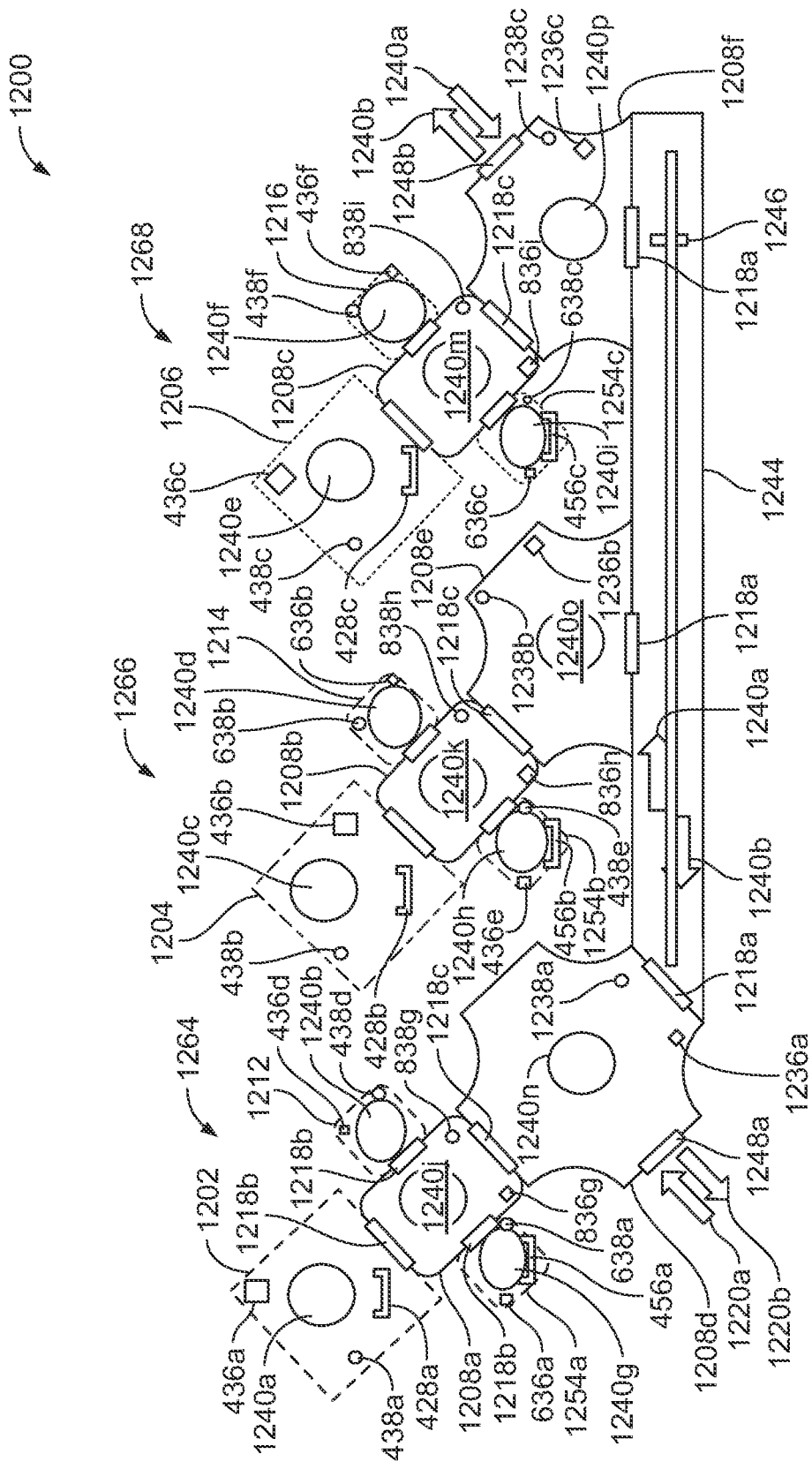
FIG. 12 is a schematic top view of another LED display fabrication tool.

As shown in FIG. 12, the LED display fabrication tool 1200 has chambers arranged in a cluster configuration to process micro-LED displays 10 sequentially or non-sequentially to deposit the color conversion layers. The LED display fabrication tool 1200 is similar to LED display fabrication tool 900, with a central access chamber 1244 coupled to a load/unload lock chamber of each sub-cluster. However, each sub-cluster includes an inner load/unload lock chamber, e.g., chambers 1208*a*, 1208*b*, 1208*c*, and an outer load/unload lock chamber, e.g. chambers 1208*d*, 1208*e*, 1208*f*. In addition, two of the load/unload lock chambers, e.g., load/unload lock chambers 1208*d* and 1208*f*, are configured for loading and unloading of the substrate through a first isolation component 1248*a* and a second isolation component 1248*b*, respectively. In addition, the central access chamber 1244 can include a linear transport 1246 to move the displays between the different load/unload lock chambers of the different clusters.

Each sub-cluster is clustered around a different load/unload lock chamber. Each outer load/unload lock chamber 1208*d*, 1208*e*, 1208*f* is connected by a respective isolation component 1218 to the central access chamber 1244. For each sub-cluster, each inner load/unload lock chamber 1208*a*, 1208*b*, 1208*c* is connected by a respective isolation component 1218*c* to the outer load/unload lock chamber 1208*d*, 1208*e*, 1208*f* of the sub-cluster. Each processing chamber, e.g., each dispensing chamber, curing chamber and washing/drying chamber, is connected by a respective isolation component 1218*a* to inner the load lock chamber of the sub-cluster by a respective isolation component 1218*b*. The LED display fabrication tool 1200 can include a controller 1226 to control operation of the various components, e.g., processing chambers and workpiece transport system.

A first sub-cluster 1264 includes a first dispensing chamber 1202, a first washing/drying station 1212, a first curing station 1254*a*, and a first load/unload lock chamber 1208*a*. The LED display fabrication tool 1200 first sub-cluster 1264 includes a first dispensing chamber 1202 with a first robot 1240*a* to control the position of the display 10 and is substantially similar to the first dispensing chambers discussed earlier. The first dispensing chamber 1202 is coupled to a first load/unload lock chamber 1208*a*. The first robot 1240*a* loads, unloads, and handles the display 10 into and out of the first dispensing chamber 1202 from a first load/unload lock chamber 1208*a*.

The first dispensing chamber 1202 can include a first inspection sensor 438*a* to monitor one or more conditions of the workpiece, substantially similar to the first inspection sensor 438*a* previously discussed. The first inspection sensor 438*a* transmits a signal representing the condition of the first workpiece to the controller 1226. The first inspection sensor 438*a* can include multiple sensors. For example, the first inspection sensor 438*a* can include a high speed high resolution optical imager (for substrate alignment, materials deposition defect detection and correction) or a luminescent imager (for control UV curing, materials processing, defect detection, device performance mapping, or look up table mapping).

The first dispensing chamber 1202 can include a first environmental sensor 436*a* to monitor one or more environmental conditions inside the first dispensing chamber 1202. The first environmental sensor 436*a* transmits a signal representing the first dispensing chamber 1202 condition to the controller 1226. For example, one or more sensors can monitor temperature, relative humidity, gas composition, etc., and provide this data to a control algorithm that can control the components in the process chamber. This can provide improved process stability control.

The LED display fabrication tool 1200 first sub-cluster 1264 also includes a first curing chamber 1254*a* with a seventh robot 1240*g* substantially similar to the first curing stations described earlier. The first curing chamber 1254*a* is coupled to the first load/unload lock chamber 1208*a*. The seventh robot 1240*g* loads, unloads, and handles the display 10 into and out of the first curing chamber 1254*a* from the first load/unload lock chamber 1208*a*. The first curing chamber 1254*a* has a first environmental sensor 636*a* substantially similar to the environmental sensor 436*a* discussed earlier. The first curing chamber 1254*a* also has a first inspection sensor 638*a* substantially similar to the inspection sensor 438*a* discussed earlier.

The LED display fabrication tool 1200 first sub-cluster 1264 also has a first washing/drying chamber 1212 with a second robot 1240*b* substantially similar to the washing/drying chambers described earlier. The first washing/drying chamber 1212 is coupled to first load/unload lock chamber 1208*a*. The second robot 1240*b* loads, unloads, and handles the display 10 into and out of the first washing/drying chamber 1212 from the first load/unload lock chamber 1208*a*. Also, the first washing/drying chamber 1212 can include a fourth environmental sensor 436*d* to monitor a first washing/drying chamber 1212 condition, substantially similar to the sensors described earlier. The first washing/drying chamber 1212 can include a fourth inspection sensor 438*d* to monitor one or more conditions of the workpiece, substantially similar to the first inspection sensor 436*a* described earlier.

The first load/unload lock chamber 1208*a* is coupled to the first dispensing chamber 1202, the first curing chamber 1212, and the first washing/drying chamber 1212. The first load/unload lock chamber 1208*a* includes a tenth robot 1240*j* to load, unload, and handle the workpiece within the first sub-cluster 1264.

The first load/unload lock chamber 1208*a* can include a seventh inspection sensor 838*g* to monitor one or more conditions of the workpiece, substantially similar to the first inspection sensor 438*a* previously discussed. The seventh inspection sensor 838*g* transmits a signal representing the condition of the first workpiece to the controller 1226. The seventh inspection sensor 838*g* can include multiple sensors. For example, the seventh inspection sensor 838*g* can include a high speed high resolution optical imager (for substrate alignment, materials deposition defect detection and correction) or a luminescent imager (for control UV curing, materials processing, defect detection, device performance mapping, or look up table mapping).

The first load/unload lock chamber 1208*a* can include a seventh environmental sensor 836*g* to monitor one or more environmental conditions inside the first load/unload lock chamber 1208*a*. The seventh environmental sensor 838*g* transmits a signal representing the first load/unload lock chamber 1208*a* condition to the controller 1226. For example, one or more sensors can monitor temperature, relative humidity, gas composition, etc., and provide this data to a control algorithm that can control the components in the process chamber. This can provide improved process stability control.

A second sub-cluster 1266 includes a second dispensing chamber 1204, a second washing station 1214, a second curing station 1254*b*, and a second load/unload lock chamber 1208*b*.

The LED display fabrication tool 1200 second sub-cluster 1266 includes a second dispensing chamber 1204 with a third robot 1240*c* to control the position of the display 10 substantially similar to the dispensing chambers discussed earlier. The second dispensing chamber 1202 is coupled to a second load/unload lock chamber 1208*b*. The eleventh robot 1240*k* loads, unloads, and handles the display 10 into and out of the second dispensing chamber 1204 from the second load/unload lock chamber 1208*b*. The second dispensing chamber 1204 can include a second inspection sensor 438*b* substantially similar to the first sensor 438*a* previously described. Likewise, the second dispensing chamber 1204 can include a second environmental sensor 436*b* substantially similar to the first sensor 436*a* previously described.

The LED display fabrication tool 1200 second sub-cluster 1266 also includes a second curing chamber 1254*b* with an eighth robot 1240*h* substantially similar to the curing stations described earlier. The second curing chamber 1254*b* is coupled to the second load/unload lock chamber 1208*b*. The eighth robot 1240*h* loads, unloads, and handles the display 10 into and out of the second curing chamber 1254*b* from the second load/unload lock chamber 1208*b*. The second curing chamber 1254*b* has a second environmental sensor 636*b* substantially similar to the environmental sensor 436*a* discussed earlier. The second curing chamber 1254*b* also has a second inspection sensor 638*b* substantially similar to the inspection sensor 438*a* discussed earlier.

The LED display fabrication tool 1200 second sub-cluster 1266 also has a second washing/drying chamber 1214 with fourth robot 1240*d* substantially similar to the washing/drying chambers described earlier. The second washing/drying chamber 1214 is coupled to the second load/unload lock chamber 1208*b*. The fourth robot 1240*d* loads, unloads, and handles the display 10 into and out of the second washing/drying chamber 1214 from the second load/unload lock chamber 1208*b*. The second washing/drying chamber 1214 can include a fifth environmental sensor 436*e* to monitor a second washing/drying chamber 1214 condition, substantially similar to the sensors described earlier. The second washing/drying chamber 1214 can include a fifth inspection sensor 438*e* to monitor one or more conditions of the workpiece, substantially similar to the first inspection sensor 436*a* described earlier.

An eleventh robot 1240*k* is positioned in the second load/unload lock chamber 1208*b*. The eleventh robot 1240*k* loads, unloads, and handles the display 10 into and out of the second dispensing chamber 1204, the second curing chamber 1254*b*, and the second washing/drying chamber 1214 within the second sub-cluster 1266.

The second load/unload lock chamber 1208*b* can include an eighth inspection sensor 838*h* substantially similar to the first inspection sensor 438*a* previously described. The second load/unload lock chamber 1208*b* can include an eighth environmental sensor 436*h* to monitor a second load/unload lock chamber 1208*b* condition, substantially similar to the environmental sensors described earlier.

A third sub-cluster 1268 includes a third dispensing chamber 1206, a third washing station 1216, a third curing station 1254*c*, and a third load/unload lock chamber 1208*c*. The third dispensing chamber 1206 includes a robot 1240*e* to control the position of the display 10. The third dispensing chamber 1206 is coupled to a third load/unload lock chamber 1208*c*. The fifth robot 1240*e* loads, unloads, and handles the display 10 into and out of the third dispensing chamber 1206. The third dispensing chamber 1206 can include a third inspection sensor 438*c* substantially similar to the first sensor 438*a* previously described. The third dispensing chamber 1206 can include a third environmental sensor 436*c* substantially similar to the first environmental sensor 436*a* previously described.

The LED display fabrication tool 1200 third sub-cluster 1268 also includes a third curing chamber 1254*c* with a ninth robot 1240*i* substantially similar to the curing stations described earlier. The third curing chamber 1254*c* is coupled to the third load/unload lock chamber 1208*c*. The ninth robot 1240*i* loads, unloads, and handles the display 10 into and out of the third curing chamber 1254*c*. The third curing chamber 1254*c* can also have a third environmental sensor 636*c* substantially similar to the environmental sensor 436*a* discussed earlier. The third curing chamber 1254*c* can also have a third inspection sensor 638*c* substantially similar to the inspection sensor 438*a* discussed earlier.

The LED display fabrication tool 1200 third sub-cluster 1268 also has a third washing/drying chamber 1216 with a sixth robot 1240*f* substantially similar to the washing/drying chambers described earlier. The third washing/drying chamber 1216 is coupled to the third load/unload lock chamber 1208*c*. The sixth robot 1240*f* loads, unloads, and handles the display 10 into and out of the third washing/drying chamber 1216. The third washing/drying chamber 1216 can include a sixth environmental sensor 436*f* to monitor a third washing/drying chamber 1216 condition, substantially similar to the environmental sensors described earlier. The third washing/drying chamber 1216 also has a sixth inspection sensor 638*f* substantially similar to the inspection sensor 438*a* discussed earlier.

The third load/unload lock chamber 1208*c* contains a thirtieth robot 1240*m* to load, unload, and handle the display 10 into and out of the third dispensing chamber 1206, the third curing chamber 1254*c*, and the third washing/drying chamber 1216. The third load/unload lock chamber 1208*c* can include a ninth inspection sensor 838*i* substantially similar to the first inspection sensor 438*a* previously described. The third load/unload lock chamber 1208*c* can include a ninth environmental sensor 436*i* to monitor a third load/unload lock chamber 1208*c* condition, substantially similar to the environmental sensors described earlier.

The LED display fabrication tool 1200 includes a fourth load/unload lock chamber 1208*d* with a fourteenth robot 1240*n* to load, unload, and handle the workpiece within the fourth load/unload lock chamber 1208*d* and into and out of the first load/unload lock chamber 1208*a* and on to and off of an isolation component 1218. The isolation component 1218 is substantially similar to the isolation components previously discussed. The display 10 is placed into the fourth load lock chamber 1208*d* as shown by arrow 1220*a*, e.g., by an operator or the fourteenth robot 1240*n*. The display 10 is removed from the fourth load lock chamber 1208*d* as shown by arrow 1220*b*, e.g., by an operator or the robot fourteenth 1240*n*. The display 10 moves on the isolation component 1218 as shown by arrow 1220*a* and arrow 1242*b* between the fourth load lock chamber 1208*d* and a fifth load/unload lock chamber 1208*e*.

The fourth load/unload lock chamber 1208*d* can include a first inspection sensor 1238*a* substantially similar to the first inspection sensor 438*a* previously described. The fourth load/unload lock chamber 1208*d* can include a first environmental sensor 1236*a* to monitor a fourth load/unload lock chamber 1208*d* condition, substantially similar to the environmental sensors described earlier.

The fifth load/unload lock chamber 1208*e* includes a robot 1240*o* to load, unload, and handle the workpiece within the fifth load/unload lock chamber 1208*e* and into and out of the second load/unload lock chamber 1208*b* and on to and off of the isolation component 1218. The fifth load/unload lock chamber 1208*e* can include a second inspection sensor 1238*b* substantially similar to the first inspection sensor 438*a* previously described. The fifth load/unload lock chamber 1208*e* can include a second environmental sensor 1236*b* to monitor a fifth load/unload lock chamber 1208*e* condition, substantially similar to the environmental sensors described earlier.

The sixth load/unload lock chamber 1208*e* includes a sixtieth robot 1240*p* to load, unload, and handle the workpiece within the sixth load/unload lock chamber 1208*d* and into and out of the third load/unload lock chamber 1208*c* and on to and off of the isolation component 1218. The sixth load/unload lock chamber 1208*f* can include a third inspection sensor 1238*c* substantially similar to the first inspection sensor 438*a* previously described. The sixth load/unload lock chamber 1208*f* can include a third environmental sensor 1236*c* to monitor a sixth load/unload lock chamber 1208*f* condition, substantially similar to the environmental sensors described earlier.

Additionally, the display 10 can be removed from the sixth load/unload lock chamber 1208*e* as shown by arrow 1240*b*, e.g., by an operator or the sixteenth robot 1240*p*. Likewise, the display 10 can be placed into the sixth load/unload lock chamber 1208*e* as shown by arrow 1240*a*, e.g., by an operator or the sixteenth robot 1240*p*.

A controller (not shown) is operatively coupled to each of the chambers and components previously described to cause the workpiece transport system to move the display 10 sequentially or non-sequentially through the first dispensing chamber 1202, the first curing chamber 1554*a*, the first washing/drying chamber 1212, the second dispensing chamber 1204, the second curing chamber 1254*b*, the second washing/drying chamber 1214, the third dispensing chamber 1206, the third curing chamber 1254*c*, and the third washing/drying chamber 1216, passing through one or more load lock chambers as necessary. The controller is substantially similar to the controllers previously described.

In an alternative implementation, at one or more of the sub-clusters, the inner load/unload lock chamber and outer load lock chamber are replaced by a single chamber. Additional chambers and/or sub-clusters can be included to handle additional materials processing, and repair requirements.

Figure 13:
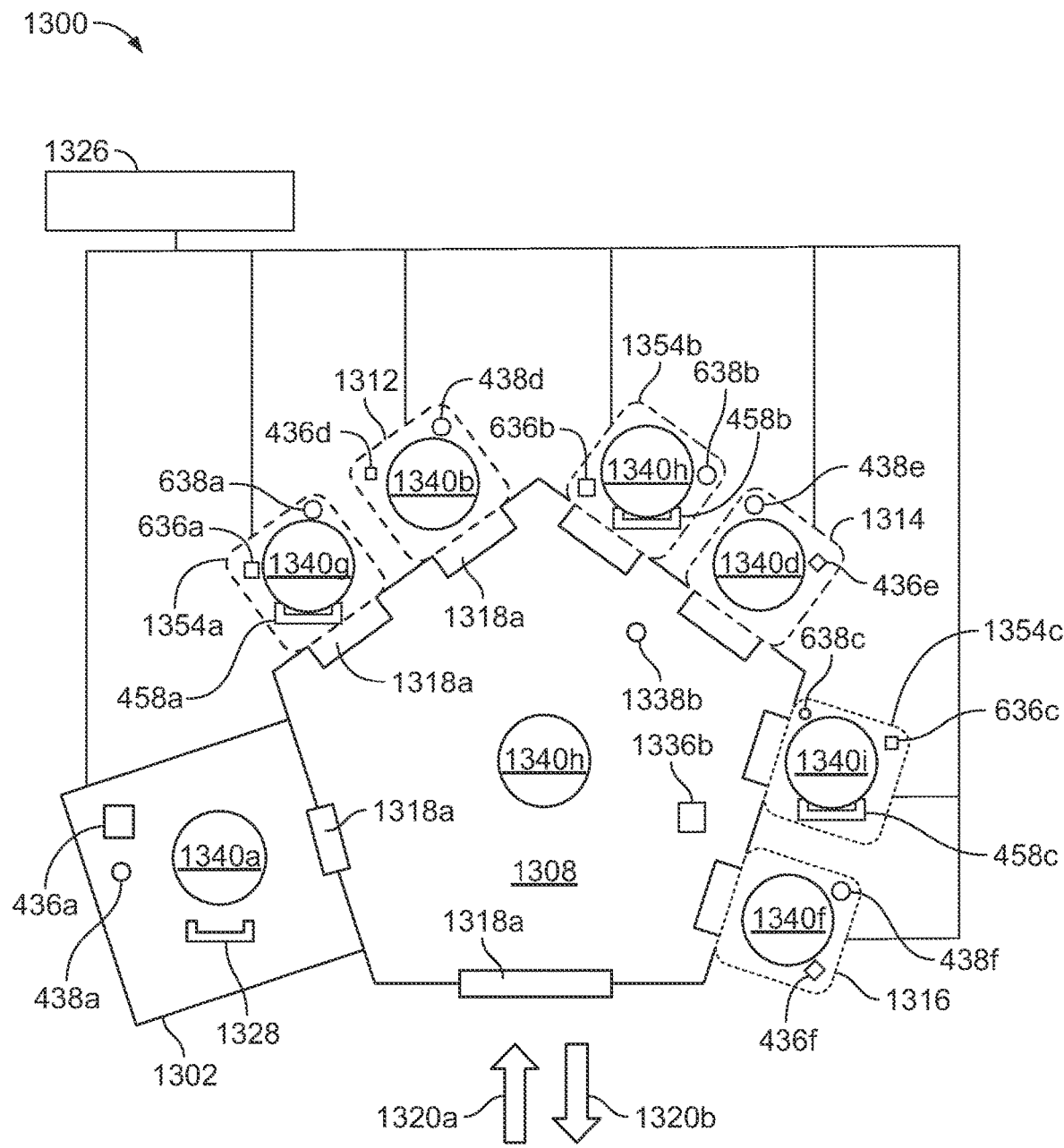
FIG. 13 is a schematic top view of another LED display fabrication tool.

As shown in FIG. 13, the LED display fabrication tool 1300 is arranged with chambers in a cluster configuration, and is configured to process micro-LED displays 10 to deposit the color conversion layers sequentially. The LED display fabrication tool 1300 is similar to LED display fabrication tool 1100, but has a universal dispensing chamber and individual curing chambers and individual washing/drying chambers for each color.

Each processing chamber, e.g., the universal dispensing chamber, the three curing chambers, and the three washing/drying chambers, is coupled to the central load lock chamber 1308 by an isolation component 1318*a*, e.g., a valve such as a slit valve, through which the workpiece can pass. An isolation component 1318*b* through which the workpiece can pass, e.g., a valve such as a slit valve, separates the central load lock chamber 1118 from the outside environment, e.g., the clean room. The LED display fabrication tool 1300 can include a controller 1326 to control operation of the various components, e.g., processing chambers and workpiece transport system.

The LED display fabrication tool 1300 includes a universal dispensing chamber 1302 substantially similar to the first dispensing chambers discussed earlier. The universal dispensing chamber 1302 includes a universal dispensing support 1328 to hold the workpiece and a first robot 1340*a* to control the position of the display 10. The universal dispensing chamber 1302 is coupled to a load/unload lock chamber 1308. The first robot 1340*a* loads, unloads, and handles the display 10 into and out of the universal dispensing chamber 1302 from a universal load/unload lock chamber 1308.

The universal dispensing chamber 1302 includes one or more dispensers to deliver multiple color conversion materials. As one example, the universal dispensing chamber 1302 could include a single dispensing station that is adapted to dispense different color conversion materials onto the display. As another example, the universal dispensing chamber 1302 could include multiple dispensing stations, each adapted to dispense a single color conversion material onto the display.

The universal dispensing chamber 1302 can include a first inspection sensor 438*a* to monitor one or more conditions of the workpiece, substantially similar to the first inspection sensor 438*a* previously discussed. The first inspection sensor 438*a* transmits a signal representing the condition of the first workpiece to the controller 1326. The first inspection sensor 438*a* can include multiple sensors. For example, the first inspection sensor 438*a* can include a high speed high resolution optical imager (for substrate alignment, materials deposition defect detection and correction) or a luminescent imager (for control UV curing, materials processing, defect detection, device performance mapping, or look up table mapping).

The universal dispensing chamber 1302 can include a first environmental sensor 436*a* to monitor one or more environmental conditions inside the universal dispensing chamber 1302. The first environmental sensor 436*a* transmits a signal representing the universal dispensing chamber 1302 condition to the controller 1326. For example, one or more sensors can monitor temperature, relative humidity, gas composition, etc., and provide this data to a control algorithm that can control the components in the process chamber. This can provide improved process stability control.

The LED display fabrication tool 1300 also includes a first curing chamber 1354*a* with a seventh robot 1340*g* substantially similar to the first curing stations described earlier. The first curing chamber 1354*a* is coupled to the load/unload lock chamber 1308. The seventh robot 1340*g* loads, unloads, and handles the display 10 into and out of the first curing chamber 1354*a* from the universal load/unload lock chamber 1308. The first curing chamber 1354*a* has a first environmental sensor 636*a* substantially similar to the environmental sensor 436*a* discussed earlier. The first curing chamber 1354*a* also has a first inspection sensor 638*a* substantially similar to the inspection sensor 438*a* discussed earlier.

The LED display fabrication tool 1300 also has a first washing/drying chamber 1312 with a second robot 1340*b* substantially similar to the washing/drying chambers described earlier. The first washing/drying chamber 1312 is coupled to load/unload lock chamber 1308. The second robot 1340*b* loads, unloads, and handles the display 10 into and out of the first washing/drying chamber 1312 from the universal load/unload lock chamber 1308. Also, the first washing/drying chamber 1312 can include a fourth environmental sensor 436*d* to monitor a first washing/drying chamber 1312 condition, substantially similar to the sensors described earlier. The first washing/drying chamber 1312 can include a fourth inspection sensor 438*d* to monitor one or more conditions of the workpiece, substantially similar to the first inspection sensor 436*a* described earlier.

The LED display fabrication tool 1300 also includes a second curing chamber 1354*b* with an eighth robot 1340*h* substantially similar to the curing stations described earlier. The second curing chamber 1354*b* is coupled to the load/unload lock chamber 1308. The eighth robot 1340*h* loads, unloads, and handles the display 10 into and out of the second curing chamber 1354*b* from the universal load/unload lock chamber 1308. The second curing chamber 1354*b* has a second environmental sensor 636*b* substantially similar to the environmental sensor 436*a* discussed earlier. The second curing chamber 1354*b* also has a second inspection sensor 638*b* substantially similar to the inspection sensor 438*a* discussed earlier.

The LED display fabrication tool 1300 also includes a second curing chamber 1354*b* with an eighth robot 1340*h* substantially similar to the curing stations described earlier. The second curing chamber 1354*b* is coupled to the load/unload lock chamber 1308. The eighth robot 1340*h* moves the workpiece into, out of, and around the second curing chamber 1354*b* from the universal load/unload lock chamber 1308. The second curing chamber 1354*b* has a second environmental sensor 636*b* substantially similar to the environmental sensor 436*a* discussed earlier. The second curing chamber 1354*b* also has a second inspection sensor 638*b* substantially similar to the inspection sensor 438*a* discussed earlier.

The LED display fabrication tool 1300 also has a second washing/drying chamber 1314 with a fourth robot 1340*d* substantially similar to the washing/drying chambers described earlier. The fourth robot 1340*d* moves the workpiece into, out of, and around the second washing/drying chamber 1314 from the universal load/unload lock chamber 1308. The second washing/drying chamber 1314 can include a fifth environmental sensor 436*e* to monitor a second washing/drying chamber 1314 condition, substantially similar to the sensors described earlier. The second washing/drying chamber 1314 can include a fifth inspection sensor 438*e* to monitor one or more conditions of the workpiece, substantially similar to the first inspection sensor 436*a* described earlier.

The LED display fabrication tool 1300 also includes a third curing chamber 1354*c* with a ninth robot 1340*i* substantially similar to the curing stations described earlier. The third curing chamber 1354*c* is coupled to the load/unload lock chamber 1308. The ninth robot 1340*i* moves the workpiece into, out of, and around the third curing chamber 1354*c* from the universal load/unload lock chamber 1308. The third curing chamber 1354*c* can also have a third environmental sensor 636*c* substantially similar to the environmental sensor 436*a* discussed earlier. The third curing chamber 1354*c* can also have a third inspection sensor 638*c* substantially similar to the inspection sensor 438*a* discussed earlier.

The LED display fabrication tool 1300 also has a third washing/drying chamber 1316 with a sixth robot 1340*f* substantially similar to the washing/drying chambers described earlier. The third washing/drying chamber 1316 is coupled to load/unload lock chamber 1308. The sixth robot 1340*f* moves the workpiece into, out of, and around the third washing/drying chamber 1316 from the universal load/unload lock chamber 1308. The third washing/drying chamber 1316 can include a sixth environmental sensor 436*f* to monitor a third washing/drying chamber 1316 condition, substantially similar to the environmental sensors described earlier. The third washing/drying chamber 1316 also has a sixth inspection sensor 638*f* substantially similar to the inspection sensor 438*a* discussed earlier.

The universal load/unload lock chamber 1308 includes a robot 1340*h* to load, unload, and handle the display 10 into and out of the universal dispensing chamber 1302, the first washing/drying chamber 1312, the second washing/drying chamber 1314, the third washing/drying chamber 1316, the first curing chamber 1354*a*, the second curing chamber 1354*b*, and the third curing chamber 1354*c*. The display 10 is placed into the load/unload lock chamber 1308 as shown by arrow 1320*a*, e.g., by an operator or the robot 1340*h*. The display 10 is removed from the load/unload lock chamber 1308 as shown by arrow 1320*b*, e.g., by an operator or the robot 1340*h*.

Also, the universal load/unload lock chamber 1308 can include a second environmental sensor 1338*b* to monitor a universal load/unload lock chamber 1308 condition, substantially similar to the environmental sensors described earlier. The universal load/unload lock chamber 1308 can include a second inspection sensor 1336*b* to monitor one or more conditions of the workpiece, substantially similar to the first inspection sensor 436*a* described earlier.

A controller 1326 is operatively coupled to each of the chambers and components previously described to cause the workpiece transport system to move the display 10 sequentially through the universal dispensing chamber 1302, the first curing chamber 1354*a*, the first washing/drying chamber 1312, the universal dispensing chamber 1302, the first washing/drying chamber 1312, the second curing chamber 1354*b*, the universal dispensing chamber 1302, the second washing/drying chamber 1314, and the third curing chamber 1354*c*, and the third washing/drying chamber 1316, passing through the central load lock chamber 1308 as necessary. Additional chambers and/or sub-clusters can be included to handle additional materials processing, and repair requirements.

Figure 14A:
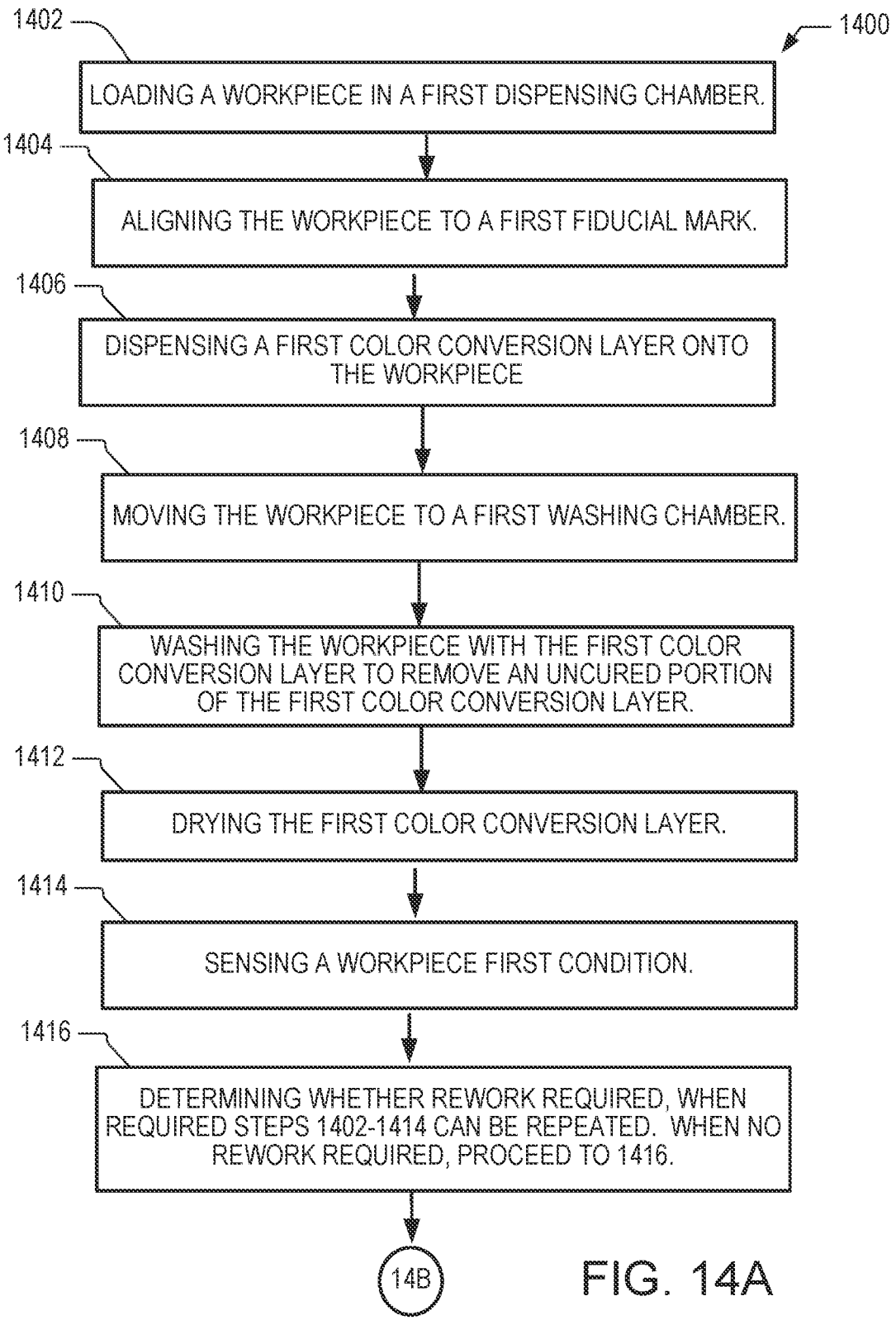
FIGS. 14A-14C show a method of fabricating an LED display with an LED display fabrication tool.
Figure 14B:
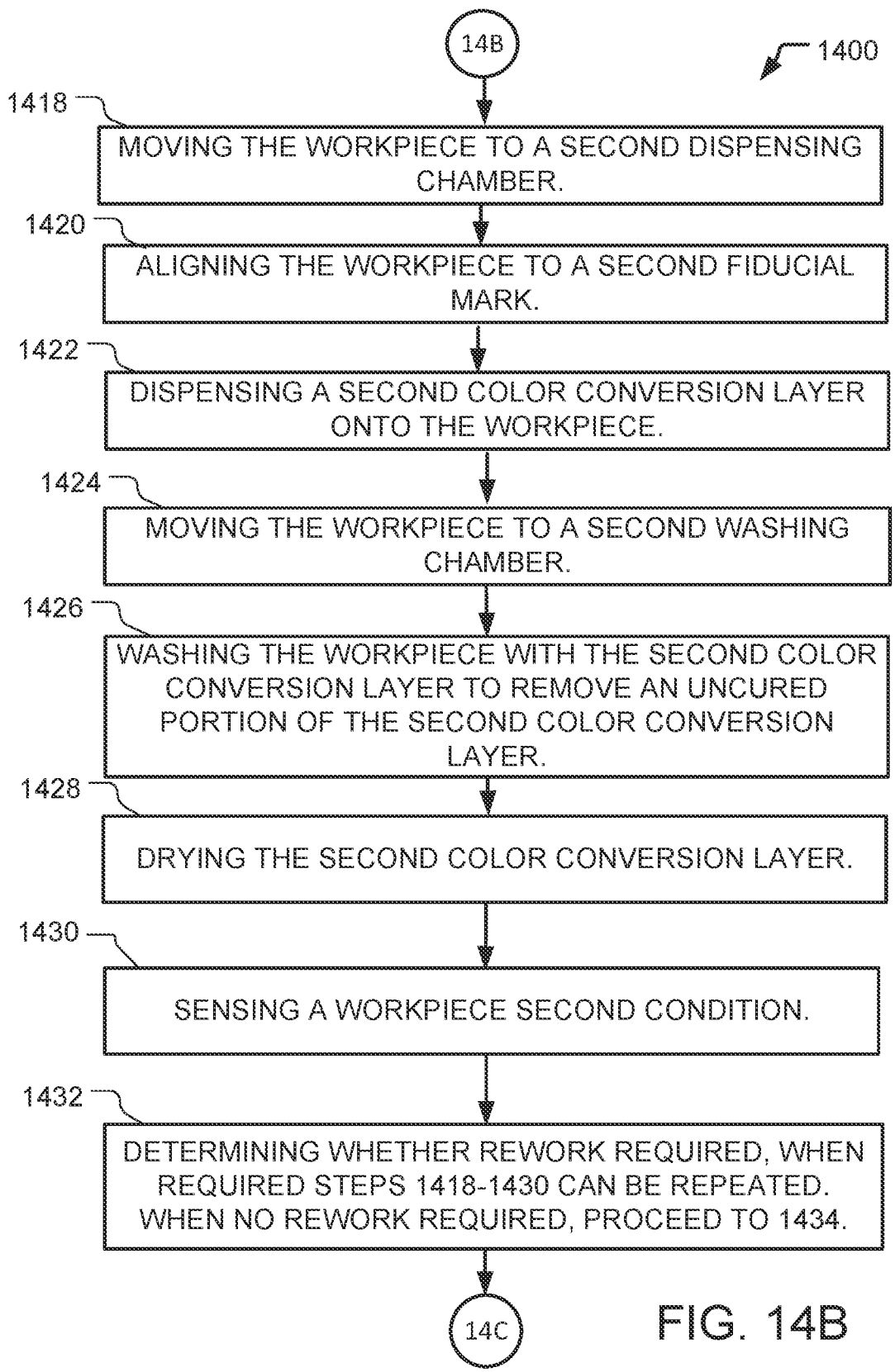
Figure 14C:
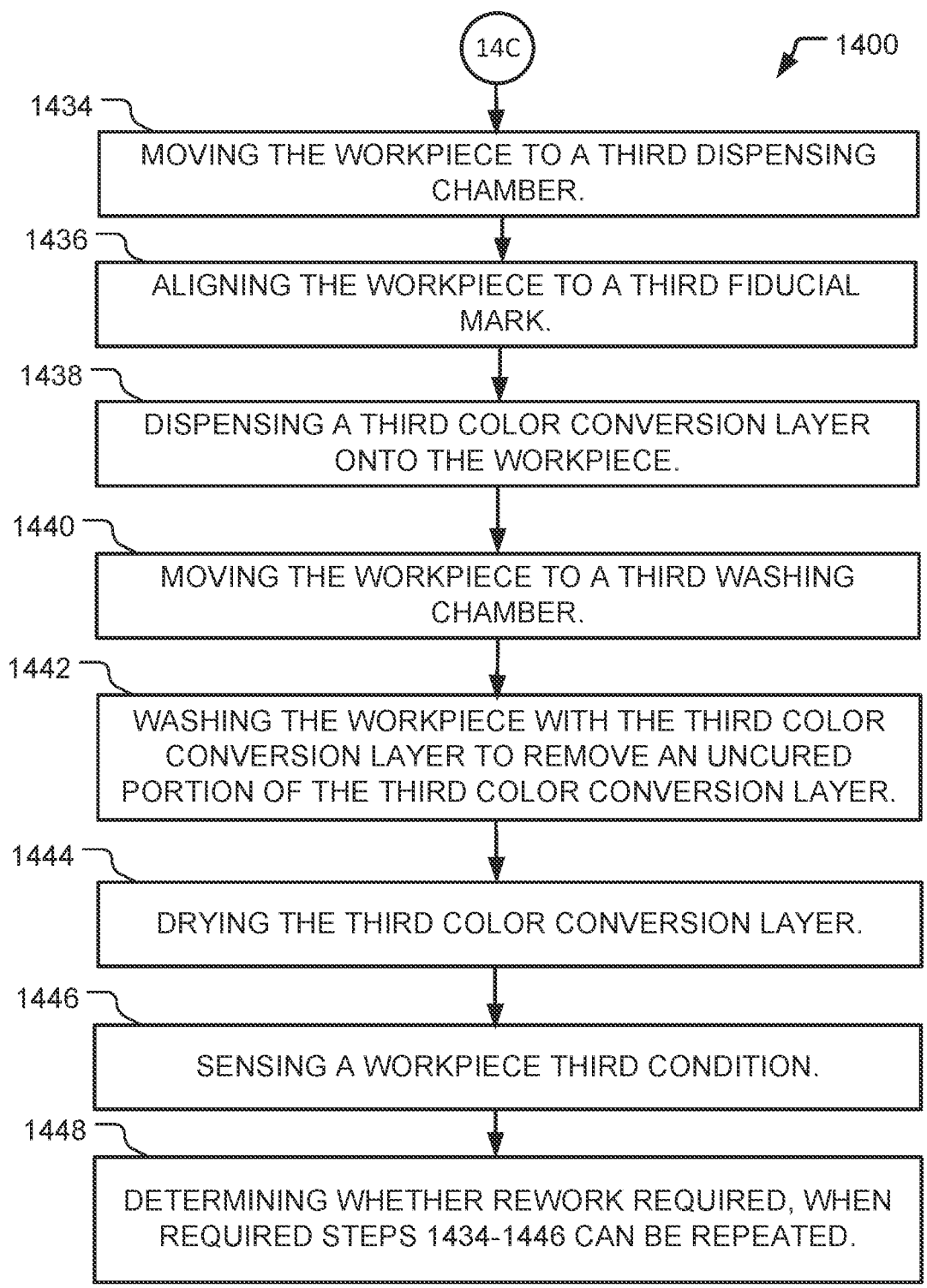

FIGS. 14A-14C illustrate a method 1400 of fabricating an LED display. The method can be performed by one of the display fabrication tools discussed above as operated by a controller. At 1402, a workpiece is loaded in a first dispensing chamber.

At 1404, the workpiece is aligned to a first fiducial mark in the first dispensing chamber.

At 1406, a first color conversion layer is dispensed onto the workpiece with a first dispenser, e.g., in a first dispensing chamber. The first dispenser can be an inkjet printer, and the inkjet printer can be moved by a first gantry to scan over the workpiece. Alternatively, the workpiece can traverse underneath the first dispenser. An inspection step can be performed before the curing step. If defects are detected (missing materials in subpixel wells or partially-filled wells), a repair can be conducted. After a post-dispensed inspection, the first color conversion layer is dispensed onto the workpiece with the first dispenser, the first color conversion layer on the workpiece is cured, e.g., with a first ultra-violet light and a first nitrogen gas curtain. This can occur within the first dispensing chamber, or in a separate curing chamber. In addition, metrology in the form of an inspection of the workpiece can be conducted at the same time or after curing step. For example, photoluminescence intensity and strayed UV light intensity can be mapped to create a lookup table. After washing the workpiece with the first color conversion layer to remove an uncured portion of the first color conversion layer, or after washing and drying steps, a first workpiece condition can be sensed with a first sensor and a signal representing the first workpiece condition can be transmitted to the controller.

Printing the first color conversion layer onto the workpiece in the first dispensing chamber can further include filtering air entering the first dispensing chamber with a high efficiency particulate air filter to reduce a contamination concentration of the air, exhausting the air in the first dispensing chamber with a first exhaust duct, measuring a first contamination concentration of the air in the first dispensing chamber with a first chamber sensor configured to sample air in the first dispensing chamber, and transmitting a signal representing the first contamination concentration to the controller. In response to receiving the signal representing the first contamination concentration and the signal representing the second contamination concentration, the controller can adjust air flow into and out of the first dispensing chamber.

At 1408, the workpiece is moved to a first washing/drying chamber. At 1410, the workpiece with the first color conversion layer is washed to remove an uncured portion of the first color conversion layer. At 1412, the first color conversion layer is dried on the workpiece.

At 1414, a workpiece first condition is sensed. At 1416, based on the sensed first condition, it is determined whether rework is required of the first color conversion layer on the workpiece. When rework of the first color conversion layer is required, steps 1402-1414 can be repeated on the workpiece. When no rework is required, the workpiece can proceed to step 1416.

At 1418, the workpiece is moved to a second dispensing chamber. At 1420, the workpiece is aligned to a second fiducial mark.

At 1422, a second color conversion layer is dispensed onto the workpiece with a second dispenser, e.g., a second inkjet printer, in the second dispensing chamber. The second dispenser can be moved with a second gantry. After printing the second color conversion layer onto the workpiece with the second inkjet printer, a post print inspection and rework can be completed prior to washing and drying the second color conversion layer. The workpiece can be cured, e.g., with a second ultra-violet light and a second nitrogen gas curtain. This can occur within the second dispensing chamber, or in a separate curing chamber.

At 1424, the workpiece is moved to a second washing/drying chamber. At 1426, the workpiece with the second color conversion layer is washed to remove an uncured portion of the second color conversion layer.

At 1428, the second color conversion layer is dried on the workpiece.

At 1430, a workpiece second condition is sensed. At 1432, based on the sensed second condition, it is determined whether rework is required of the second color conversion layer on the workpiece. When rework of the second color conversion layer is required, steps 1418-1430 can be repeated on the workpiece. When no rework is required, the workpiece can proceed to step 1434.

At 1434, the workpiece is moved to a third dispensing chamber. At 1436, the workpiece is aligned to a third fiducial mark.

At 1438, a third color conversion layer is dispensed onto the workpiece with a third dispenser, e.g., a third inkjet printer, in the third dispensing chamber. The third dispenser can be moved with a third gantry. After printing the third color conversion layer onto the workpiece with the third inkjet printer, a post print inspection and rework can be completed prior to washing and drying the third color conversion layer. The workpiece can be cured, e.g., with a third ultra-violet light and a third nitrogen gas curtain. This can occur within the third dispensing chamber, or in a separate curing chamber.

At 1440, the workpiece is moved to a third washing/drying chamber. At 1442, the workpiece with the third color conversion layer is washed to remove an uncured portion of the third color conversion layer. At 1444, the third color conversion layer is dried on the workpiece.

At 1446, a workpiece third condition is sensed. At 1448, based on the third sensed condition, it is determined whether rework is required of the third color conversion layer on the workpiece. When rework of the third color conversion layer is required, steps 1434-1448 can be repeated on the workpiece. When no rework is required, the workpiece is complete.

It will be appreciated to those skilled in the art that the preceding examples are exemplary and not limiting. For example:

Although the above description focuses on micro-LEDs, the techniques can be applied to other displays with other types of light emitting diodes, particularly displays with other micro-scale light emitting diodes, e.g., LEDs less than about 10 microns across.

Although the above description assumes that the order in which the color conversion layers are formed is blue, then green, then red, other orders are possible, e.g., blue, then red, then green. In addition, other colors are possible, e.g., orange and yellow.

Other functional materials can be used such as polymer serving as a spacer, a ultra-violet light blocking layer, or a Bragg reflector layer.

The LED display fabrication tool may include another dispensing chamber dedicated for rework. This chamber can include a dispensing support to hold the workpiece and an inkjet printer to deliver a color conversion precursor fluid onto the workpiece to rework one or more of the first color conversion layer, the second color conversion layer, and the third color conversion layer on the workpiece. The color conversion precursor fluid at the rework chamber can be either the same or a different composition from the first color conversion precursor, the second color conversion precursor, and the third color conversion layer.

The LED display fabrication tool may include another curing station to cure the color conversion precursor fluid from the rework chamber. The LED display fabrication tool may include another washing/drying chamber including a washing support to hold the workpiece and a washing assembly to remove uncured portions of the color conversion layer from the rework. The controller can cause the workpiece transport system to move the workpiece sequentially through the first dispensing chamber, the first washing/drying chamber, the second dispensing chamber, the second washing/drying chamber, the third dispensing chamber, the third washing/drying chamber, the rework dispensing chamber, and the rework washing/drying chamber.

The first inkjet printer, the second inkjet printer, the third inkjet printer, and the fourth inkjet printer may dispense one or more of a ultra-violet locking layer material or a Bragg reflection layer material.

It will be understood that various modifications may be made without departing from the spirit and scope of the present disclosure.

What is claimed is:

1. A LED display fabrication tool, comprising:
a first dispensing chamber including a first dispensing support to hold a workpiece and a first inkjet printer to deliver a first color conversion precursor onto the workpiece;
a first washing/drying chamber including a first washing support to hold the workpiece and a first washing assembly configured to remove uncured portions of the first color conversion precursor from the workpiece;
a second dispensing chamber including a second dispensing support to hold the workpiece and a second inkjet printer to deliver a second color conversion precursor different from the first color conversion precursor onto the workpiece;
a second washing/drying chamber including a second washing support to hold the workpiece and a second washing assembly configured to remove uncured portions of the second color conversion precursor from the workpiece, wherein each of the first dispensing chamber, first washing/drying chamber, second dispensing chamber and second washing/drying chamber are independently sealable;
one or more curing stations to cure the first color conversion precursor on the workpiece to form a first color conversion layer over a first plurality of LEDs on the workpiece and to cure the second color conversion precursor to form a second color conversion layer over a second plurality of LEDs on the workpiece;
a workpiece transport system; and
a controller configured to cause the workpiece transport system to move the workpiece sequentially through the first dispensing chamber, the first washing/drying chamber, the second dispensing chamber, and the second washing/drying chamber,
wherein the LED display fabrication tool includes a plurality of process chambers and a plurality of transfer chambers, wherein the plurality of process chambers includes the first dispensing chamber, the first washing/drying chamber, the second dispensing chamber, and the second washing/drying chamber, wherein the plurality of transfer chambers are coupled to two process chambers by two respective sealable ports.

2. The LED display fabrication tool of claim 1, wherein the plurality of transfer chambers includes a first transfer chamber and a second transfer chamber, and wherein the first dispensing chamber and the first washing/drying chamber are coupled to the first transfer chamber by respective sealable ports and the second dispensing chamber and the second washing/drying chamber are coupled to the second transfer chamber by respective sealable ports.

3. The LED display fabrication tool of claim 2, further comprising a central transfer chamber, wherein the first transfer chamber and the second transfer chamber are coupled to the plurality of transfer chambers by respective sealable ports.

4. The LED display fabrication tool of claim 3, wherein the controller is configured to cause the workpiece transport system to move the workpiece sequentially through the first dispensing chamber, the first transfer chamber, the first washing/drying chamber, the first transfer chamber, the central transfer chamber, the second transfer chamber, the second dispensing chamber, the second transfer chamber, and the second washing/drying chamber.

5. The LED display fabrication tool of claim 3, wherein the tool is configured for insertion and removal of the workpiece only through the plurality of transfer chambers.

6. The LED display fabrication tool of claim 3, wherein the tool is configured for insertion of the workpiece into the tool through the first transfer chamber and removal of the workpiece from the tool through the second transfer chamber.

7. The LED display fabrication tool of claim 3, wherein the tool is configured for insertion of the workpiece into the tool and removal of the workpiece from the tool through each of the plurality of transfer chambers.

8. The LED display fabrication tool of claim 7, wherein the second dispensing chamber is coupled to the second transfer chamber by a sealable port.

9. The LED display fabrication tool of claim 8, wherein the controller is configured to cause the workpiece transport system to move the workpiece sequentially through the first dispensing chamber, the first transfer chamber, the first washing/drying chamber, the first transfer chamber, the second dispensing chamber, the second transfer chamber, and the second washing/drying chamber.

10. The LED display fabrication tool of claim 1, wherein at least one of the process chambers is coupled to multiple transfer chambers.

11. The LED display fabrication tool of claim 1, wherein the plurality of process chambers include a common curing station to cure the first color conversion precursor to form the first color conversion layer and to cure the second color conversion precursor to form the second color conversion layer.

12. The LED display fabrication tool of claim 1, wherein the plurality of process chambers includes a first curing station to cure the first color conversion precursor to form the first color conversion layer and a second curing station to cure the second color conversion precursor to form the second color conversion layer.

13. A LED display fabrication tool, comprising:
a first dispensing chamber including a first dispensing support to hold a workpiece and a first inkjet printer to deliver a first color conversion precursor onto the workpiece;
a first washing/drying chamber including a first washing support to hold the workpiece and a first washing assembly configured to remove uncured portions of the first color conversion precursor from the workpiece;
a second dispensing chamber including a second dispensing support to hold the workpiece and a second inkjet printer to deliver a second color conversion precursor different from the first color conversion precursor onto the workpiece;
a second washing/drying chamber including a second washing support to hold the workpiece and a second washing assembly configured to remove uncured portions of the second color conversion precursor from the workpiece, wherein each of the first dispensing chamber, first washing/drying chamber, second dispensing chamber and second washing/drying chamber are independently sealable;
one or more curing stations to cure the first color conversion precursor on the workpiece to form a first color conversion layer over a first plurality of LEDs on the workpiece and to cure the second color conversion precursor to form a second color conversion layer over a second plurality of LEDs on the workpiece;
a workpiece transport system; and
a controller configured to cause the workpiece transport system to move the workpiece sequentially through the first dispensing chamber, the first washing/drying chamber, the second dispensing chamber, and the second washing/drying chamber,
wherein the LED display fabrication tool includes a plurality of process chambers and a central transfer chamber, wherein the plurality of process chambers includes the first dispensing chamber, first washing/drying chamber, second dispensing chamber, and second washing/drying chamber, wherein each process chamber is coupled to the central transfer chamber by a respective sealable port.

14. The LED display fabrication tool of claim 13, wherein the plurality of process chambers includes a common curing station to cure the first color conversion precursor to form the first color conversion layer and to cure the second color conversion precursor to form the second color conversion layer.

15. The LED display fabrication tool of claim 13, wherein the plurality of process chambers includes a first curing station to cure the first color conversion precursor to form the first color conversion layer and a second curing station to cure the second color conversion precursor to form the second color conversion layer.

16. The LED display fabrication tool of claim 13, wherein the tool is configured for insertion and removal of the workpiece only through the central transfer chamber.

17. A LED display fabrication tool, comprising:
a first dispensing chamber including a first dispensing support to hold a workpiece and a first inkjet printer to deliver a first color conversion precursor onto the workpiece;
a first washing/drying chamber including a first washing support to hold the workpiece and a first washing assembly configured to remove uncured portions of the first color conversion precursor from the workpiece;
a second dispensing chamber including a second dispensing support to hold the workpiece and a second inkjet printer to deliver a second color conversion precursor different from the first color conversion precursor onto the workpiece;
a second washing/drying chamber including a second washing support to hold the workpiece and a second washing assembly configured to remove uncured portions of the second color conversion precursor from the workpiece, wherein each of the first dispensing chamber, first washing/drying chamber, second dispensing chamber and second washing/drying chamber are independently sealable;
one or more curing stations to cure the first color conversion precursor on the workpiece to form a first color conversion layer over a first plurality of LEDs on the workpiece and to cure the second color conversion precursor to form a second color conversion layer over a second plurality of LEDs on the workpiece;
a workpiece transport system; and a controller configured to cause the workpiece transport system to move the workpiece sequentially through the first dispensing chamber, the first washing/drying chamber, the second dispensing chamber, and the second washing/drying chamber, wherein the LED display fabrication tool includes a plurality of process chambers, a central transfer chamber, and a plurality of load lock chambers, wherein the plurality of process chambers includes the first dispensing chamber, first washing/drying chamber, second dispensing chamber, and second washing/drying chamber, wherein each load lock chamber is coupled to the central transfer chamber by a respective sealable port, wherein the first dispensing chamber and first washing/drying chamber are each coupled to a first load lock chamber of the plurality of load lock chambers by a respective sealable port, and wherein the second dispensing chamber and second washing/drying chamber are each coupled to a second first load lock chamber of the plurality of load lock chambers by a respective sealable port.

18. The LED display fabrication tool of claim 17, wherein the tool is configured for insertion and removal of the workpiece only through the central transfer chamber.

19. A LED display fabrication tool, comprising:
a common dispensing chamber including a first dispensing support to hold a workpiece and a first inkjet printer to deliver a first color conversion precursor onto the workpiece and a second inkjet printer to deliver a second color conversion precursor different from the first color conversion precursor onto the workpiece;
a first curing station to cure the first color conversion precursor on the workpiece to form a first color conversion layer over a first plurality of LEDs on the workpiece;
a first washing/drying chamber including a first washing support to hold the workpiece and a first washing assembly configured to remove uncured portions of the first color conversion precursor from the workpiece;
a second curing station to cure the second color conversion precursor to form a second color conversion layer over a second plurality of LEDs on the workpiece;
a second washing/drying chamber including a second washing support to hold the workpiece and a second washing assembly configured to remove uncured portions of the second color conversion layer from the workpiece, wherein each of the first dispensing chamber, first washing/drying chamber, second dispensing chamber, and second washing/drying chamber are independently sealable;
a workpiece transport system; and
a controller configured to cause the workpiece transport system to move the workpiece sequentially through the common dispensing chamber, the first washing/drying chamber, the common dispensing chamber, and the second washing/drying chamber.

* * * * *

UNITED STATES PATENT AND TRADEMARK OFFICE
CERTIFICATE OF CORRECTION

| | | |
|---|---|---|
| PATENT NO. | : 12,062,735 B2 | Page 1 of 1 |
| APPLICATION NO. | : 17/691091 | |
| DATED | : August 13, 2024 | |
| INVENTOR(S) | : Hou T. Ng, Daihua Zhang and Nag B. Patibandla | |

It is certified that error appears in the above-identified patent and that said Letters Patent is hereby corrected as shown below:

In the Claims

In Column 52, Line 2, Claim 13, delete "chamber" and insert -- chamber, --.

In Column 52, Line 59, Claim 17, delete "chamber" and insert -- chamber, --.

Signed and Sealed this
Eighth Day of October, 2024

Katherine Kelly Vidal
Director of the United States Patent and Trademark Office